United States Patent
Ooishi

(10) Patent No.: US 6,795,345 B2
(45) Date of Patent: Sep. 21, 2004

(54) NON-VOLATILE SEMICONDUCTOR MEMORY DEVICE HAVING AN INCREASED ACCESS SPEED WHILE MAINTAINING THE PRODUCTION YIELD

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 10/334,010

(22) Filed: Dec. 31, 2002

(65) Prior Publication Data

US 2004/0037113 A1 Feb. 26, 2004

(30) Foreign Application Priority Data

Aug. 26, 2002 (JP) ........................................ 2002-245272

(51) Int. Cl.$^7$ ................................................ G11C 16/06
(52) U.S. Cl. ............................. 365/185.23; 365/230.04
(58) Field of Search ....................... 365/185.23, 185.29, 365/185.33, 189.01, 189.02, 230.04, 230.05

(56) References Cited

U.S. PATENT DOCUMENTS 5,331,592 A * 7/1994 Yamagata ................. 365/185.3
5,373,471 A * 12/1994 Saeki et al. ................. 365/200
5,544,106 A * 8/1996 Koike ......................... 365/200
6,081,456 A * 6/2000 Dadashev ............... 365/185.23

FOREIGN PATENT DOCUMENTS

| JP | 09-082921 | 3/1997 |
| JP | 11-330429 | 11/1999 |
| JP | 2000-228509 | 8/2000 |

* cited by examiner

*Primary Examiner*—David Nhu
(74) *Attorney, Agent, or Firm*—Burns, Doane, Swecker & Mathis, L.L.P.

(57) ABSTRACT

Bit lines formed from a first metal wiring layer and bit lines formed from a second metal wiring layer are provided as bit lines that intersect with word lines. The bit lines are formed from metal wiring layers and are divided into two layers so that the pitch of the bit lines can be widened. Thereby, a non-volatile semiconductor memory device having an increased access speed while maintaining production yield can be implemented.

7 Claims, 53 Drawing Sheets

NON-VOLATILE SEMICONDUCTOR MEMORY DEVICE HAVING AN INCREASED ACCESS SPEED WHILE MAINTAINING THE PRODUCTION YIELD

BACKGROUND OF THE INVENTION

1. Field of the Invention

The present invention relates to a non-volatile semiconductor memory device, and more particularly to a non-volatile semiconductor memory device having a virtual ground-type memory cell array.

2. Description of the Background Art

In an EEPROM (Electrically Erasable Programmable Read-Only Memory) one side of a memory transistor is, in general, connected to a source line coupled to the ground potential and it is necessary to provide source lines at predetermined intervals between bit lines and, therefore, an increase in integration density is difficult. Therefore, research concerning virtual ground-type memory cell arrays has been carried out in recent years. A virtual ground-type memory cell array (virtual ground array) is disclosed in Japanese Patent Laying-Open No. 9-82921.

In addition, NROM (Nitride Read Only Memory)-type flash EEPROMs (hereinafter referred to as NROM), which are one type of flash EEPROM from among non-volatile semiconductor memory devices, have been obtaining attention. An NROM has an ONO (Oxide Nitride Oxide) film as a gate insulating film so that two bits of information can be stored in one memory cell. Reduction in chip area per bit can be expected in an NROM, in comparison with other non-volatile semiconductor memory devices having floating gates. An NROM is disclosed in U.S. Pat. No. 6,081,456. A virtual ground-type memory cell array is used in the NROM therein.

FIG. 57 is a circuit diagram for describing how a potential is supplied to a bit line in a virtual ground-type memory cell array of a conventional NROM.

With reference to FIG. 57, a memory cell array 502 includes bit lines BL1 to BL5, word lines WL1 to WLn, memory cells 511 to 514, of which the respective gates are connected to word line WL1, and memory cells 521 to 524, of which the respective gates are connected to word line WLn.

In memory cell array 502, memory cells adjacent to each other, from among memory cells aligned in a line sharing one word line, share one bit line. That is to say, memory cell 511 and memory cell 512 are connected to bit line BL2 at a node NB so as to share bit line BL2. Memory cell 512 and memory cell 513 are connected to bit line BL3 at a node NA so as to share bit line BL3. Memory cell array 502 is a so-called virtual ground-type memory cell array wherein the bit line that corresponds to the memory cell to be accessed is connected to the ground potential.

A switching circuit 504 is provided in order to selectively supply a desired potential to a bit line of memory cell array 502. Switching circuit 504 includes switching parts 531 to 535 provided corresponding to bit lines BL1 to BL5, respectively.

Switching part 531 includes an N-channel MOS transistor 542, of which the gate receives a control signal VG1, connected between a reading power supply line 524, to which a reading power supply potential VddR is supplied via a sense amplifier circuit 501, and bit line BL1, and an N-channel MOS transistor 544, of which the gate receives a control signal GG1, connected between a ground power supply line 522, to which power potential GND is supplied, and bit line BL1.

Switching part 532 includes an N-channel MOS transistor 552, of which the gate receives a control signal VG2, connected between reading power supply line 524 and bit line BL2, and an N-channel MOS transistor 554, of which the gate receives a control signal GG2, connected between ground power supply line 522 and bit line BL2.

Switching part 533 includes an N-channel MOS transistor 562, of which the gate receives a control signal VG3, connected between reading power supply line 524 and bit line BL3, and an N-channel MOS transistor 564, of which the gate receives a control signal GG3, connected between ground power supply line 522 and bit line BL3.

Switching part 534 includes an N-channel MOS transistor 572, of which the gate receives a control signal VG4, connected between reading power supply line 524 and bit line BL4, and an N-channel MOS transistor 574, of which the gate receives a control signal GG4, connected between ground power supply line 522 and bit line BL4.

Switching part 535 includes an N-channel MOS transistor 582, of which the gate receives a control signal VG5, connected between reading power supply line 524 and bit line BL5, and an N-channel MOS transistor 584, of which the gate receives a control signal GG5, connected between ground power supply line 522 and bit line BL5.

Reading of data from the memory cell array is carried out by a current detection-type sense amplifier 501.

FIG. 58 is a cross sectional view for describing a cross sectional structure of memory cell 512 in FIG. 57.

With reference to FIG. 58, n-type impurity regions 202 and 204 are formed in a P-type substrate 200. These n-type impurity regions 202 and 204, respectively, correspond to bit lines BL2 and BL3 of FIG. 57. Bit lines BL2 and BL3 are buried-type bit lines and have a high resistance.

Silicon oxide films 206 and 208 for element isolation, respectively, are formed above n-type impurity regions 202 and 204. A silicon oxide film 210 is formed on top of a region between n-type impurity region 202 and n-type impurity region 204, and, in addition, a nitride film 212 for storing a charge is formed on top of silicon oxide film 210 and, furthermore, a silicon oxide film 214 is formed on top of nitride film 212. Such a three-layer gate insulating film is referred to as an ONO (Oxide Nitride Oxide) layered structure.

A conductive layer 216, formed of polycrystalline silicon or the like, is formed over silicon oxide films 206, 214 and 208. Conductive layer 216 corresponds to word line WL1 of FIG. 57.

Here, other memory cells of FIG. 57 have the same structure as memory cell 512 and, therefore, descriptions thereof will not be repeated.

As shown in the cross sectional view of FIG. 58, a memory cell is formed of one field effect transistor. One bit of information can be stored in a region L1 in the left side of nitride film 212 and another one bit can be stored in a region L2 in the right side of nitride film 212.

Next, programming and reading of data to and from a memory cell will be described. In the memory cell array shown in FIG. 57, each of two bit lines between which memory cells are placed is connectable to either ground power supply line 522 or reading power supply line 524. In such a configuration, the direction of voltage applied to the memory cells can freely be changed. Each memory cell has two memory regions so that programming and reading of data can be carried out to and from different memory regions by changing the direction in which current flows. In the following description, memory cell 512 is focused on as a representative memory cell.

FIG. 59 is a diagram for describing the programming operation of data to memory region L1 of memory cell 512.

With reference to FIG. 59, in the case that data written in to memory region L1, the potential of bit line BL2 is set at programming potential VddW and the potential of bit line BL3 is set at power potential GND. When word line WL1 is activated to the H level for the programming condition, a programming current Iw1 flows from bit line BL2 through non-volatile memory cell 512 toward bit line BL3. At this time, data is written in to memory region L1.

FIG. 60 is a diagram for describing the reading operation of data from memory region L1 of memory cell 512.

With reference to FIG. 60, in the case that data is reading from memory region L1, a reading power supply potential VddR is supplied to bit line BL3 via current detection-type sense amplifier circuit 501. In addition, bit line BL2 is coupled to ground potential GND. In the case wherein the potential of the bit line is set in such a manner, the threshold voltage value of the memory cell becomes greater when data is written into memory region L1.

When the setting of the potential of the bit line is completed, word line WL1 is activated to the H level for the reading condition. In the case that the threshold voltage value of the memory cell is no greater than the H level for the reading condition, a reading current Ir1 flows from bit line BL3 toward bit line BL2. The current value at this time is detected by sense amplifier circuit 501, thereby whether or not data has been programmed into memory region L1 can be read out as information.

As shown above, the direction of the current flowing at the time of the programming operation and the direction of the current flowing at the time of the reading operation become opposite to each other with respect to memory region L1.

FIG. 61 is a diagram for describing a programming operation to memory region L2 of memory cell 512.

With reference to FIG. 61, in the case that data is written into memory region L2, a programming potential VddW is supplied to bit line BL3 and bit line BL2 is coupled to the ground potential. When word line WL1 is activated to the H level for the programming condition, a programming current Iw2 flows from bit line BL3 toward bit line BL2. At this time, data is written into memory region L2.

FIG. 62 is a diagram for describing a reading operation from memory region L2 of memory cell 512.

With reference to FIG. 62, in the case that data is read out from memory region L2, reading power supply potential VddR is supplied via sense amplifier circuit 501 to bit line BL2. On the other hand, bit line BL3 is coupled to power potential GND.

In the case that the potential of the bit line is set in such a manner, the threshold voltage value of the memory cell becomes great when data is written into memory region L2. In the case that the threshold voltage value of the memory cell is small when word line WL1 is activated to the H level for the reading condition, a reading current Ir2 flows from bit line BL2 toward bit line BL3. At this time, the current is detected by sense amplifier circuit 501, thereby whether or not data has been written into memory region L2 can be sensed.

As shown above, the direction of current flow at the time of the programming operation and the direction of current flow at the time of the reading operation become opposite to each other with respect to memory region L2.

As shown in FIG. 58, bit lines 2 of the NROM are formed of diffusion layers buried beneath oxide films 206 and 208. Therefore, the bit lines have a high electrical resistance. As a result, there is a possibility wherein the performance of the NROM may be inferior to a conventional flash EEPROM.

The bit lines may be formed of metal in order to reduce the electrical resistance of the bit lines. In this case, however, the pitch of the metal wires becomes of the same pitch as of the transistors formed according to the critical dimension and there is a risk wherein defects are frequently caused by short circuiting of bit lines adjacent to each other. Accordingly, some measures will hereinafter be required to further enhance the degree of integration of non-volatile semiconductor memory devices.

SUMMARY OF THE INVENTION

An object of the present invention is to provide a non-volatile semiconductor memory device having an increased access speed while maintaining the production yield.

In summary, a non-volatile semiconductor memory device according to the present invention includes a memory cell array. The memory cell array includes: a memory cell group wherein each memory cell has first and second connection nodes and the second connection node of a memory cell is connected to the first connection node of an adjacent memory cell, except for the memory cell on each end, so that the memory cells are connected in series; and a first bit line group and second bit line connected to a plurality of first connection nodes of the memory cell group. The second bit line is formed from a wiring layer different from that for the first bit line group. The non-volatile semiconductor memory device further includes a bit line selection circuit for making a selection, as the selected bit lines, from among the first bit line group and the second bit line. The bit line selection circuit supplies a first potential to a first subgroup from among the selected bit lines and supplies a second potential different from the first potential to a second subgroup from among the selected bit lines.

Accordingly, a main advantage of the present invention is as follows: since the bit lines are formed by division into two different wiring layers, the pitch of the bit lines in one wiring layer can be widened so that an increase in integration can be obtained while maintaining the yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
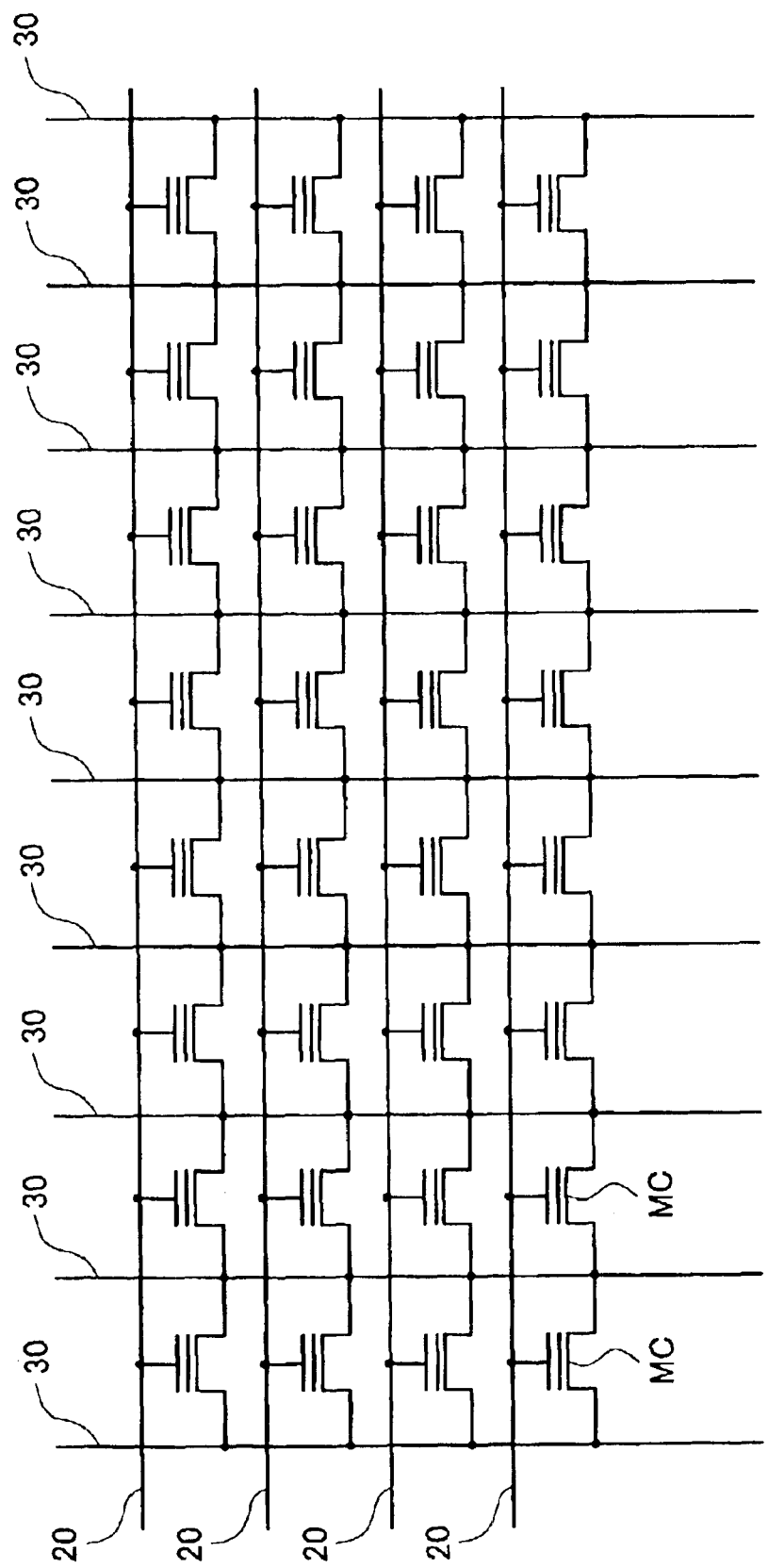
FIG. 1 is a circuit diagram showing, in detail, a configuration of a memory cell array of a virtual ground-type non-volatile semiconductor memory device.

In the following embodiments of the present invention will be described in detail with reference to the drawings. Here, the same symbols in the drawings indicate the same, or the corresponding, components.

FIG. 1 is a circuit diagram showing, in detail, a configuration of a memory cell array of a virtual ground-type non-volatile semiconductor memory device.

With reference to FIG. 1, the memory cell array includes a plurality of non-volatile memory cells MC arranged in a matrix, a plurality of word lines 20 and a plurality of bit lines 30.

The plurality of word lines 20 is arranged in parallel to the rows of the memory cells. The plurality of bit lines 30 is arranged in parallel to the columns of the memory cells.

The plurality of non-volatile memory cells MC positioned in the same row are connected in series and the gates of the respective non-volatile memory cells MC are connected to the same word line 20. Bit lines 30 are arranged in columns of non-volatile memory cells MC so that ends of the non-volatile memory cells MC on one side are connected to each other. As a result, the memory cells in a specific column share one bit line with the memory cells in an adjacent column. In addition, the memory cells in this specific column share another bit line with the memory cells in the other column adjacent on the opposite side.

Figure 58:
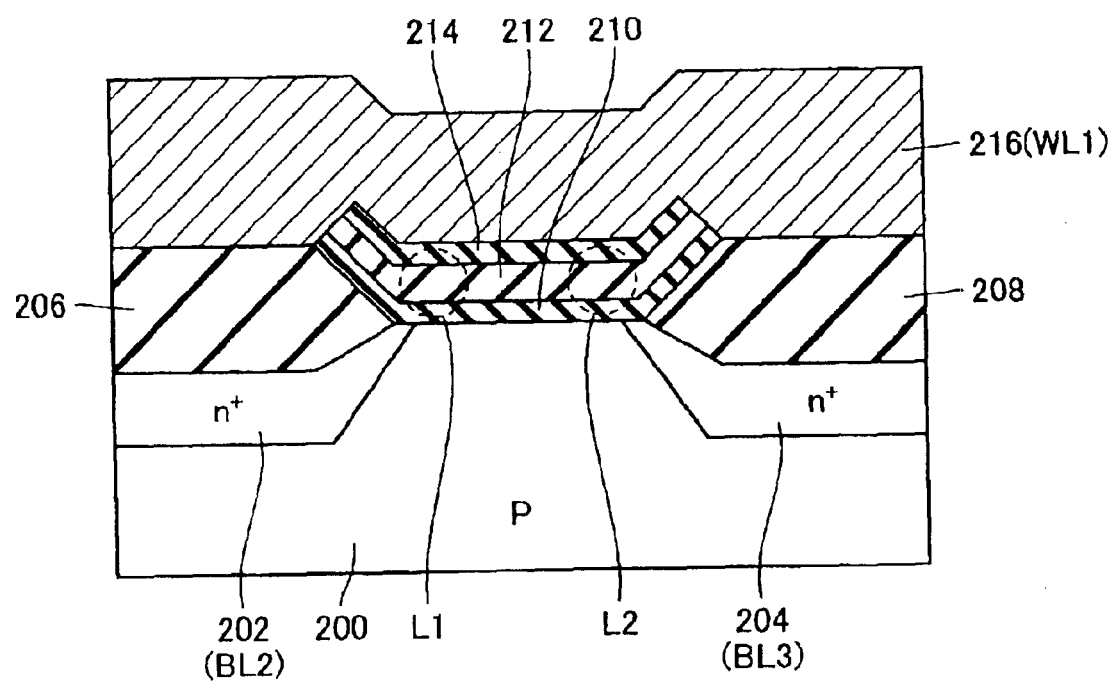
FIG. 58 is a cross sectional view for describing the cross sectional structure of memory cell 512 in FIG. 57.
Figure 59:
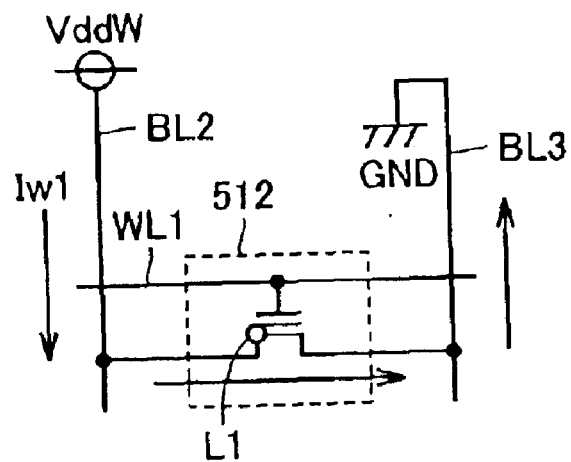
FIG. 59 is a diagram for describing the programming operation to memory region L1 of memory cell 512.
Figure 60:
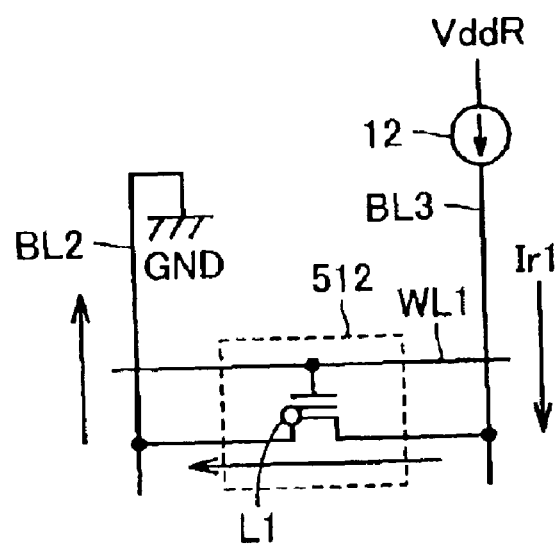
FIG. 60 is a diagram for describing the reading operation from memory region L1 of memory cell 512.
Figure 61:
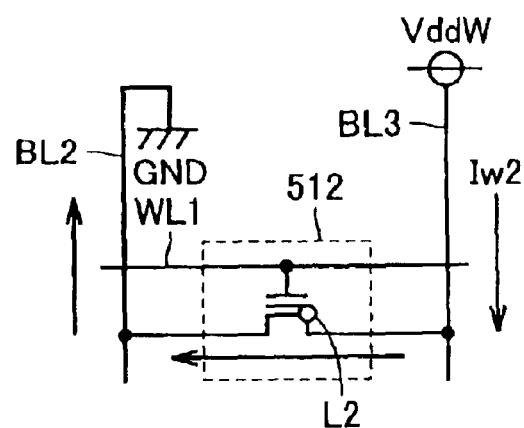
FIG. 61 is a diagram for describing a programming operation to memory region L2 of memory cell 512.
Figure 62:
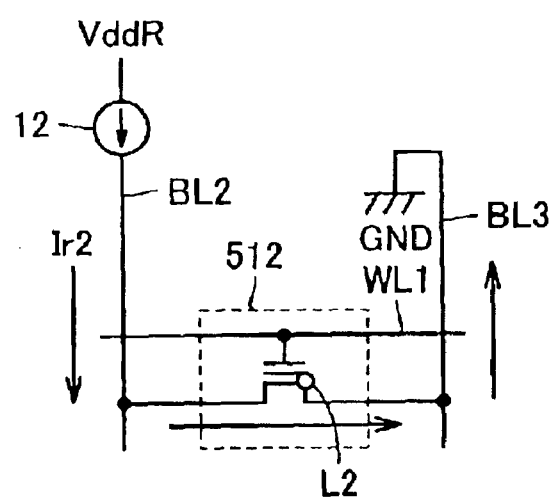
FIG. 62 is a diagram for describing a reading operation from memory region L2 of memory cell 512.

As described in FIG. 58, the bit lines of the conventional NROM are formed of buried diffusion lines and, therefore, a problem arises wherein the resistance increases when a large memory cell array is used, causing a disadvantage in a high speed reading. Accordingly, it is advantageous to form the bit lines of a metal having a low resistance.

Figure 2:
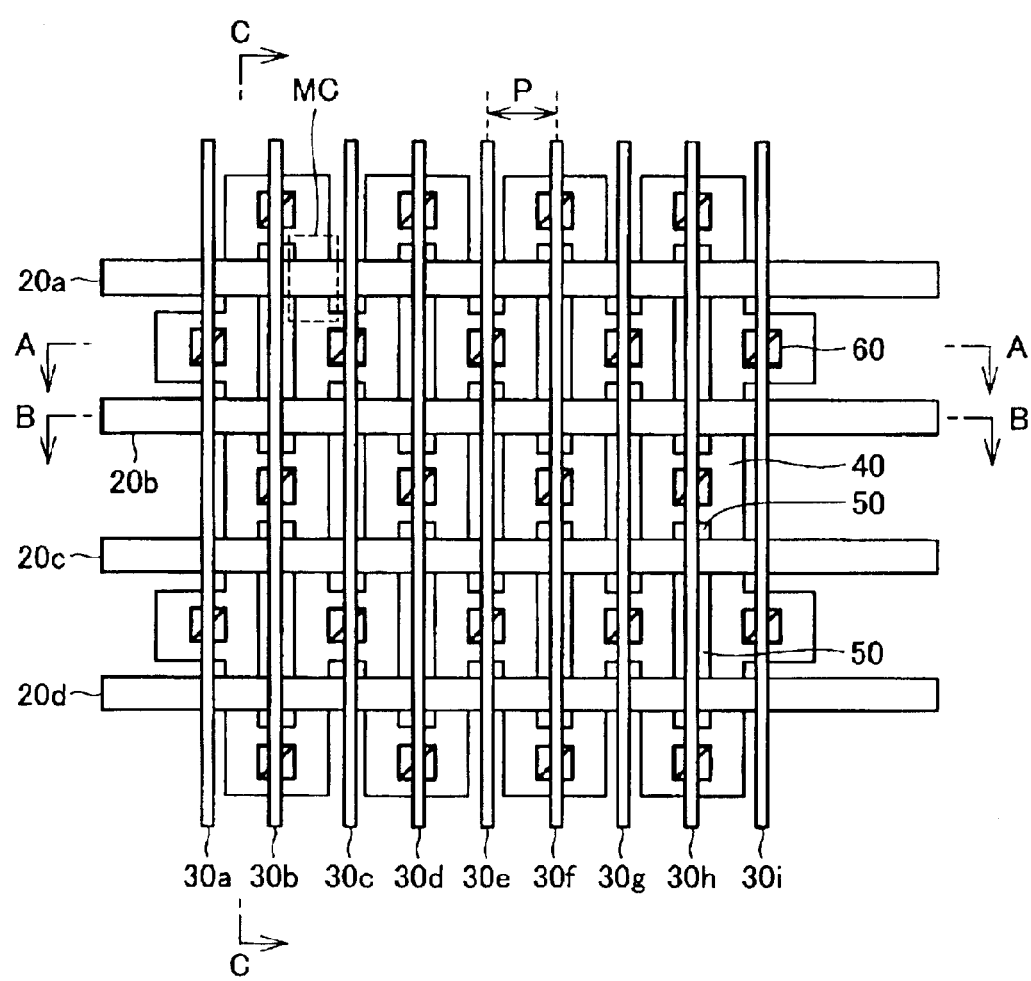
FIG. 2 is a layout view showing a configuration of a memory cell array of an example under research of a non-volatile semiconductor memory device of which the bit lines are formed of metal.

FIG. 2 is a layout view showing the configuration of a memory cell array of an example under research of a non-volatile semiconductor memory device having bit lines formed of metal.

With reference to FIG. 2, a plurality of memory cells MC is arranged in a matrix form. One representative memory cell is surrounded in a frame of broken lines in FIG. 2. A plurality of word lines 20a to 20d is arranged corresponding to the rows of memory cells MC. A plurality of bit lines 30a to 30i are arranged in parallel to the columns of memory cells MC so as to be placed between the columns of the memory cells. N-type impurity regions 40 and element isolation regions 50 are aligned in an alternative manner relative to the columns between adjacent word lines 20a and 20b. Element isolation regions 50 are formed of silicon oxide. In the same manner, n-type impurity regions 40 and element isolation regions 50 are aligned in an alternative manner between other word lines, such as between word lines 20b and 20c and between word lines 20c and 20d.

Bit lines 30a to 30i and n-type impurity regions 40 positioned beneath these bit lines are connected to each other via contact holes 60.

Figure 3:
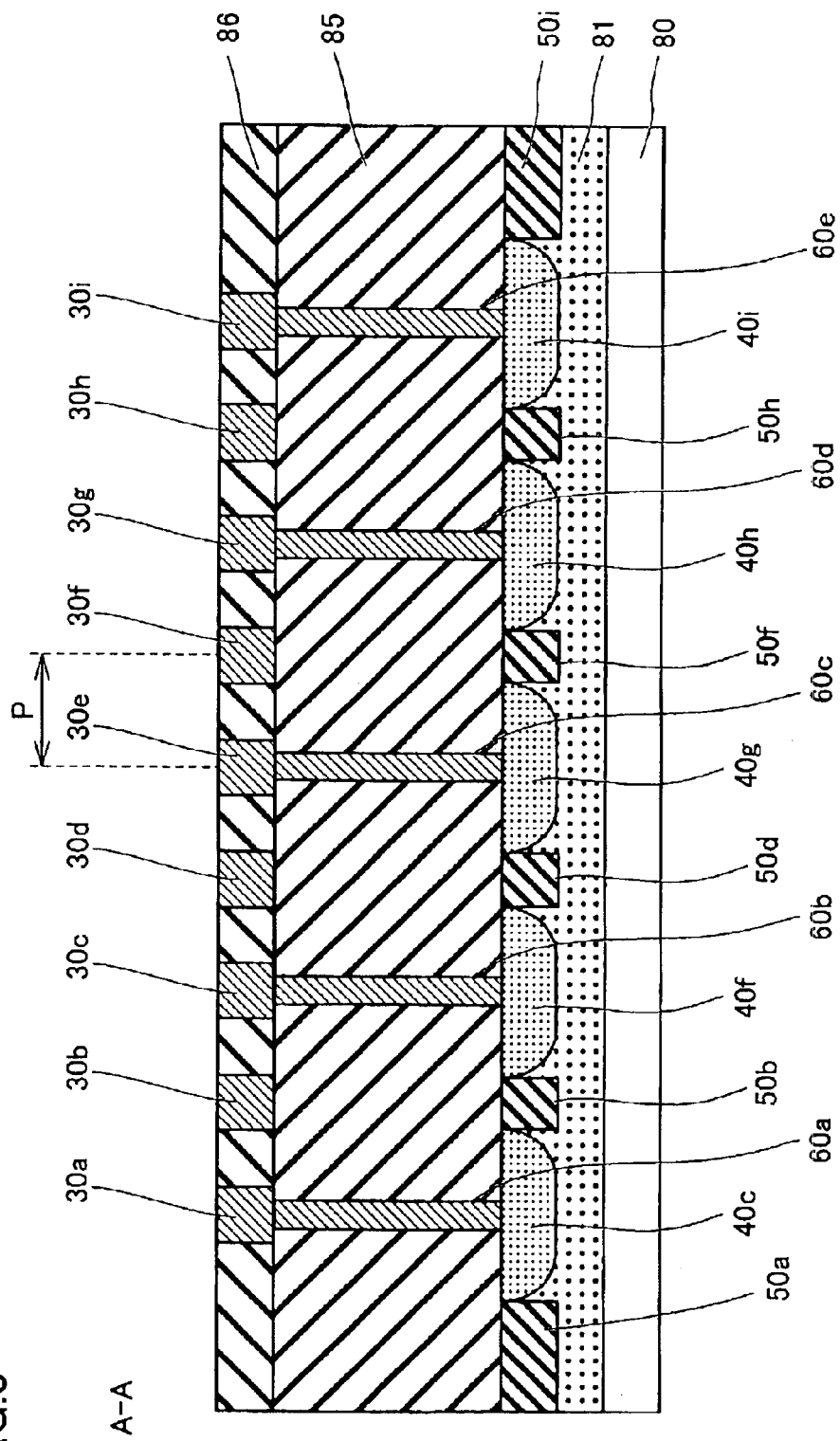
FIG. 3 is a cross sectional view taken along line A—A of FIG. 2.

FIG. 3 is a cross sectional view taken along line A—A of FIG. 2. The cross section taken along line A—A is the cross section between word lines 20a and 20b in the direction along the word lines.

With reference to FIG. 3, a p well 81 is formed in a region that extends down to a predetermined depth from the main surface of a semiconductor substrate 80. In addition, element isolation regions 50a to 50i are formed at predetermined intervals in the main surface of semiconductor substrate 80. Element isolation regions 50a, 50b, 50d, 50f, 50h and 50i are formed at predetermined intervals in the main surface of semiconductor substrate 80. An n-type impurity region 40c is formed between element isolation regions 50a and 50b in the main surface of semiconductor substrate 80.

In the same manner, an n-type impurity region 40f is formed between element isolation regions 50b and 50d. An n-type impurity region 40g is formed between element isolation regions 50d and 50f. An n-type impurity region 40h is formed between element isolation regions 50f and 50h and an n-type impurity region 40i is formed between element isolation regions 50h and 50i.

An interlayer insulating film 85 is formed above the main surface of semiconductor substrate 80. Bit lines 30a to 30i are formed at predetermined intervals on top of interlayer insulating film 85 and interlayer insulating film 86 is formed between the respective bit lines. An aluminum-silicon-copper (Al—Si—Cu) alloy film can be used as the material for bit lines 30a to 30i.

Contact holes 60a to 60e are created by partially removing portions of interlayer insulating film 85 in the regions located above n-type impurity regions 40c and 40f to 40i. At the bottoms of these conductive holes 60a to 60e the surfaces of n-type impurity regions 40c and 40f to 40i are exposed. Bit lines 30a, 30c, 30e, 30g and 30i extend to the bottoms of contact holes 60a to 60e so as to be connected to n-type impurity regions 40c and 40f to 40i, respectively.

Figure 4:
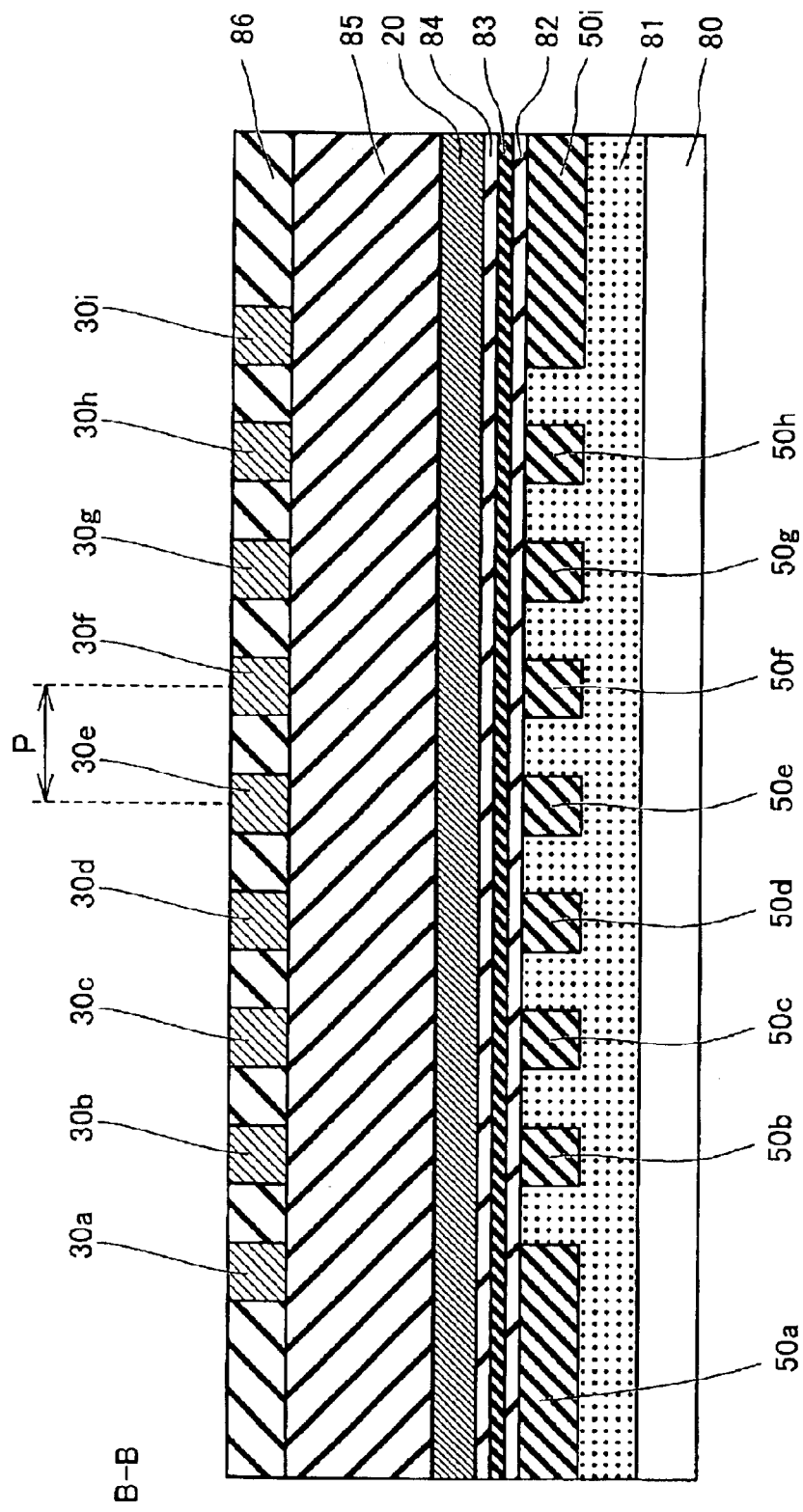
FIG. 4 is a cross sectional view taken along line B—B of FIG. 2.

FIG. 4 is a cross sectional view taken along line B—B of FIG. 2. The cross section taken along line B—B shows the cross section through word line 20b in the direction along the word line.

With reference to FIG. 4, a p well 81 is formed in a region that extends down to a predetermined depth from the main surface of semiconductor substrate 80. In addition, element isolation regions 50a to 50i are formed at predetermined intervals in the main surface of semiconductor substrate 80. Element isolation regions 50a to 50i are formed of a silicon oxide film. A region between element isolation regions 50a and 50b is a channel region of a transistor of a memory cell MC. In the same manner, regions between the respective element isolation regions are channel regions of the transistors of respective memory cells MC.

A silicon oxide film 82 is formed on top of the main surface of semiconductor substrate 80. A nitride film 83 for storing a charge is formed on top of silicon oxide film 82. A silicon oxide film 84 is formed on top of nitride film 83. Word line 20 is formed on top of silicon oxide film 84. An interlayer insulating film 85 is formed on top of word line 20. Bit lines 30a to 30i, respectively, are formed on top of interlayer insulating film 85 in regions positioned above element isolation regions 50a to 50i. Interlayer insulating film 86 is formed between bit lines.

Figure 5:
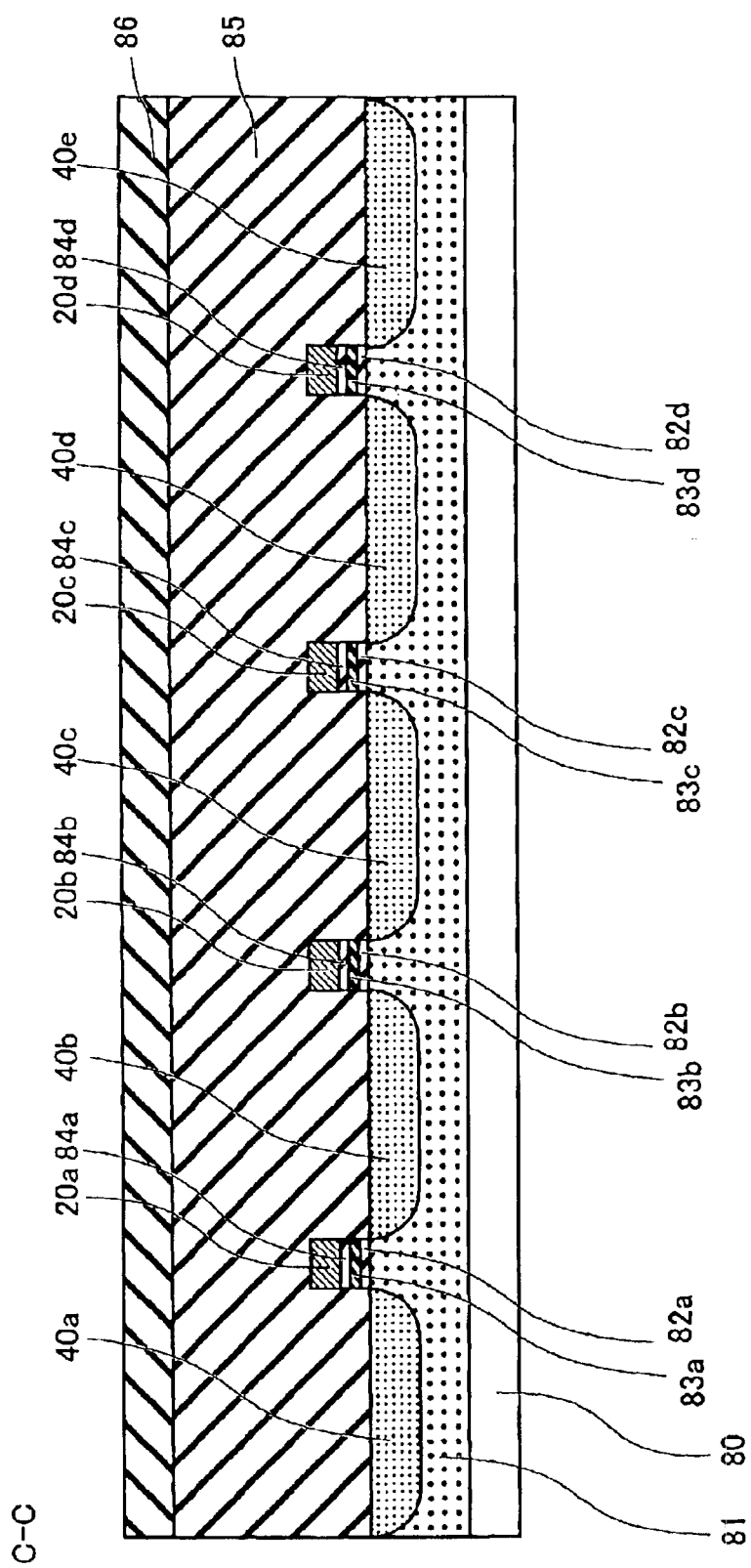
FIG. 5 is a cross sectional view taken along line C—C of FIG. 2.

FIG. 5 is a cross sectional view taken along line C—C of FIG. 2. The cross section taken along line C—C is the cross section between bit lines 30a and 30b in the direction along the bit lines.

With reference to FIG. 5, p well 81 in a region that extends down to a predetermined depth from the main surface of semiconductor substrate 80. N-type impurity regions 40a to 40e are formed at predetermined intervals in the main surface of semiconductor substrate 80.

A silicon oxide film 82a is formed in the main surface of semiconductor substrate 80 between n-type impurity regions 40a and 40b. In the same manner a silicon oxide film 82b is formed in the main surface of semiconductor substrate 80 between n-type impurity regions 40b and 40c. In the same manner a silicon oxide film 82c is formed between n-type impurity regions 40c and 40d as well as a silicon oxide film 82d is formed between n-type impurity regions 40d and 40e.

Nitride films 83a to 83d for storing charges are formed on top of silicon oxide films 82a to 82d, respectively. Nitride film 83a has one storage region on the n-type impurity region 40a side and one storage region on the n-type impurity region 40b side. As a result, one memory cell can store two bits. In the same manner, nitride films 83b to 83d, respectively, have two memory regions.

Silicon oxide films 84a to 84d, respectively, are formed on top of nitride films 83a to 83d. Word lines 20a to 20d, respectively, are formed on top of silicon oxide films 84a to 84d. Word lines 20a to 20d are formed of polysilicon (polycrystalline silicon).

Interlayer insulating film 85 is formed in the main surface of semiconductor substrate 80 over n-type impurity regions 40a to 40e and word lines 20a to 20d. Interlayer insulating film 86 is formed on top of interlayer insulating film 85.

In FIG. 5, n-type impurity region 40a and n-type impurity region 40b work as the source region and the drain region of one non-volatile memory cell. These n-type impurity regions, silicon oxide film 82a, nitride film 83a having two memory regions, silicon oxide film 84a and word line 20a form the first non-volatile memory cell. In addition, n-type impurity region 40b, n-type impurity region 40c, silicon oxide film 82b, nitride film 83b, silicon oxide film 84b and word line 20b form the second non-volatile memory cell. At this time, n-type impurity region 40b works as a common source/drain region of the first and second non-volatile memory cells.

In the same manner, n-type impurity region 40c, n-type impurity region 40d, silicon oxide film 82c, nitride film 83c, silicon oxide film 84c and word line 20c form the third non-volatile memory cell and n-type impurity region 40d, n-type impurity region 40e, silicon oxide film 82d, nitride film 83d, silicon oxide film 84d and word line 20d form the fourth non-volatile memory cell.

In the above described example, which has been researched, bit lines that have conventionally been formed of n-type impurity regions are formed of metal wiring layers, thereby an increase in the operational speed of the non-volatile semiconductor memory device can be achieved. As shown in FIGS. 2 to 4, however, the pitch P of bit lines needs to be the same as the pitch of the memory cells according to the critical dimension. Therefore, thicker bit lines cannot be used and adjacent bit lines must be placed in proximity to each other. Accordingly, there is a risk wherein wire breakage and short circuiting may frequently occur resulting in lowered yield when degree of integration of the non-volatile semiconductor memory device is further increased.

First Embodiment

Figure 6:
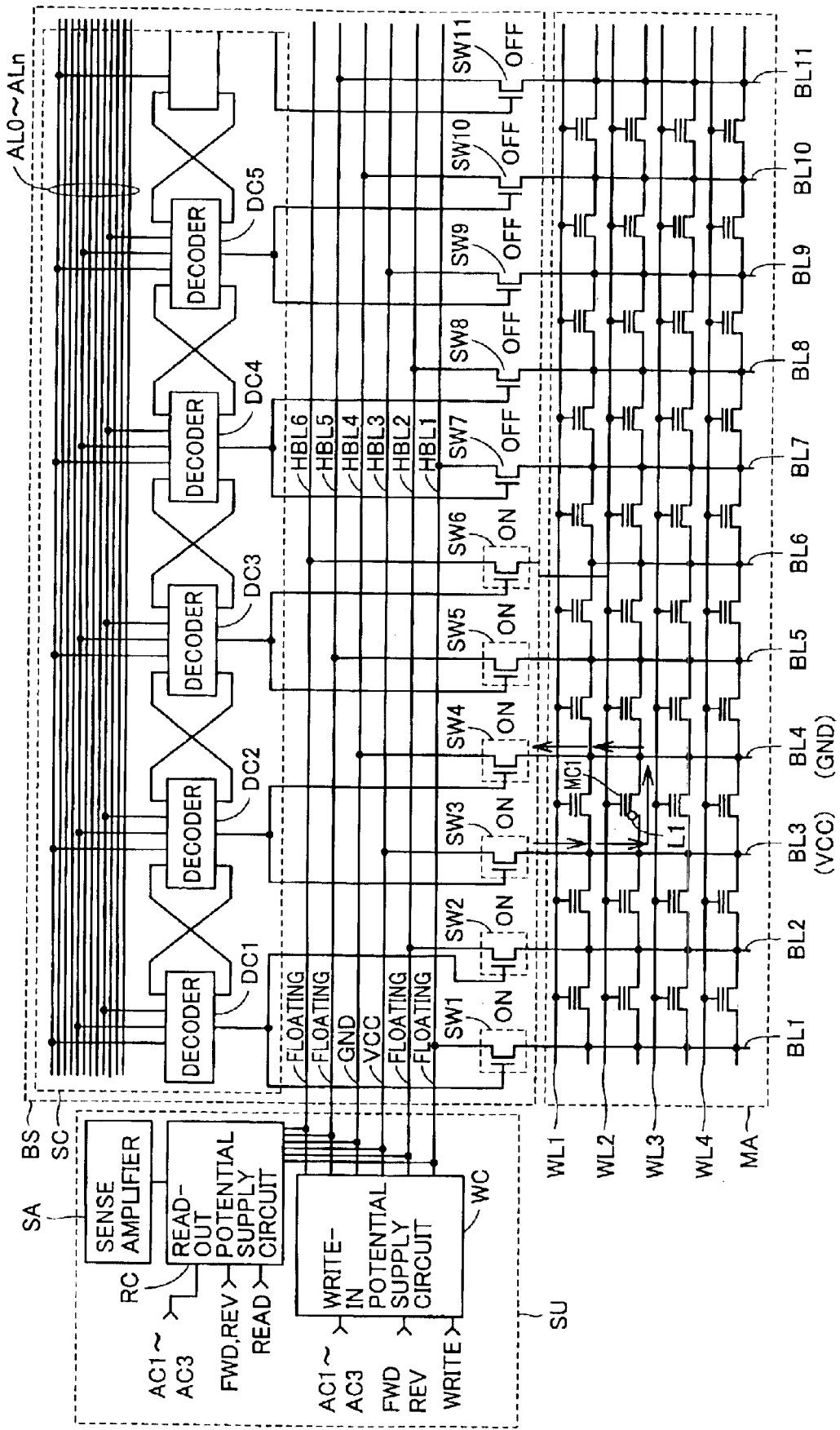
FIG. 6 is a circuit diagram showing a configuration of a non-volatile semiconductor memory device according to a first embodiment of the present invention.

FIG. 6 is a circuit diagram showing the configuration of a non-volatile semiconductor memory device according to a first embodiment of the present invention.

With reference to FIG. 6, memory cell array MA includes a plurality of word lines WL1 to WL4 and a plurality of bit lines BL1 to BL11. Bit lines of BL1 to BL11 are aligned so as to cross, in a perpendicular manner, word lines WL1 to WL4.

Memory cell array MA further includes a plurality of memory cells MC arranged in a matrix form. Here, though in FIG. 4 a representative portion of memory cell array MA having four word lines and 11 bit lines is shown, memory cell array MA further includes word lines and bit lines that are not shown in the figure.

A supply circuit SU is provided for supplying a potential to bit lines of memory cell array MA. Supply circuit SU includes a programming potential supply circuit WC, a reading potential supply circuit RC and a sense amplifier SA. Programming potential supply circuit WC receives address signals AC1 to AC3, a forward signal FWD, a reverse signal REV and a programming signal WRITE and supplies a predetermined potential to potential supply lines HBL1 to HBL6.

Here, address signals AC1 to AC3 are address signals for the lowest three bits. That is to say, address signal AC1 is the lowest address signal. Address signal AC2 is the second lowest address signal. Address signal AC3 is the third lowest address signal.

Forward signal FWD is a control signal outputted from a control circuit (not shown) at the time of forward writing or at the time of forward reading. In addition, reverse signal REV is a signal outputted from the control circuit at the time of reverse writing or reverse reading. Programming signal WRITE is a signal outputted from the control circuit at the time of the programming operation.

Reading potential supply circuit RC supplies a predetermined potential to potential supply lines HBL1 to HBL6 at the time of reading operation. Reading potential supply circuit RC receives address signals AC1 to AC3, forward signal FWD, reverse signal REV and a read control signal READ and supplies a predetermined potential to the respective potential supply lines. Here, read control signal READ is a signal outputted from the control circuit (not shown) at the time of reading operation.

A bit line selection circuit BS includes a switching control circuit SC and switching circuits SW1 to SW11.

Switching control circuit SC includes decoders DC1 to DC5. Decoders DC1 to DC5 are connected to predetermined corresponding address signal lines from among a plurality of address signal lines AL0 to ALn that transmit internal address signals. Decoders DC1 to DC6 output decode signals. The outputted decode signals are inputted to the switching circuits SW1 to SW11 described below.

Switching circuit SW1 is connected between bit line BL1 and potential supply line HBL1 and includes an N-channel MOS transistor of which the gate receives the output of decoder DC1. Switching circuit SW2 is connected between bit line BL2 and potential supply line HBL2 and includes an N-channel MOS transistor of which the gate receives the output of decoder DC1. Switching circuit SW3 is connected between bit line BL3 and potential supply line HBL3 and includes an N-channel MOS transistor of which the gate receives the output of decoder DC2. Switching circuit SW4 is connected between bit line BL4 and potential supply line HBL4 and includes an N-channel MOS transistor of which the gate receives the output of decoder DC2. Switching circuit SW5 is connected between bit line BL5 and potential supply line HBL5 and includes an N-channel MOS transistor of which the gate receives the output of decoder DC3. Switching circuit SW6 is connected between bit line BL6 and potential supply line HBL6 and includes an N-channel MOS transistor of which the gate receives the output of decoder DC3.

Switching circuit SW7 is connected between bit line BL7 and potential supply line HBL1 and includes an N-channel MOS transistor of which the gate receives the output of decoder DC4. Switching circuit SW8 is connected between bit line BL8 and potential supply line HBL2 and includes an N-channel MOS transistor of which the gate receives the output of decoder DC4. Switching circuit SW9 is connected between bit line BL9 and potential supply line HBL3 and includes an N-channel MOS transistor of which the gate receives the output of decoder DC5. Switching circuit SW10 is connected between bit line BL10 and potential supply line HBL4 and includes an N-channel MOS transistor of which the gate receives the output of decoder DC5.

Next, a case wherein data is written into memory region L1 of memory cell MC1 will be described.

The outputs of decoders DC1 to DC3 are activated in accordance with address signals AL0 to ALn and switching circuits SW1 to SW6 become of the conductive condition. The outputs of decoders DC4, DC5 and decoder DC6 (not shown) are inactivated and switching circuits SW7 to SW11 become of the non-conductive condition.

Programming potential supply circuit WC selects potential supply lines HBL3 and HBL4 in accordance with the lowest three bits AC1 to AC3 of the address signal and sets the other potential supply lines to be in the floating condition. Then, a power supply potential VCC is supplied to potential supply line HBL3 and power potential GND is supplied to potential supply line HBL4 in accordance with flag signal WRITE indicating programming and signal FWD or REV indicating the direction of current.

As a result, power supply potential VCC is supplied to bit line BL3 and power potential GND is supplied to bit line BL4. When word line WL2 is selected and activated in accordance with the address signal in the above condition, memory cell MC1 is selected from among the memory cells connected between bit lines BL3 and BL4 so that current flows from bit line BL3 through memory cell MC1 to bit line BL4. At this time, a charge is trapped in memory region L1 so that programming is carried out.

Figure 7:
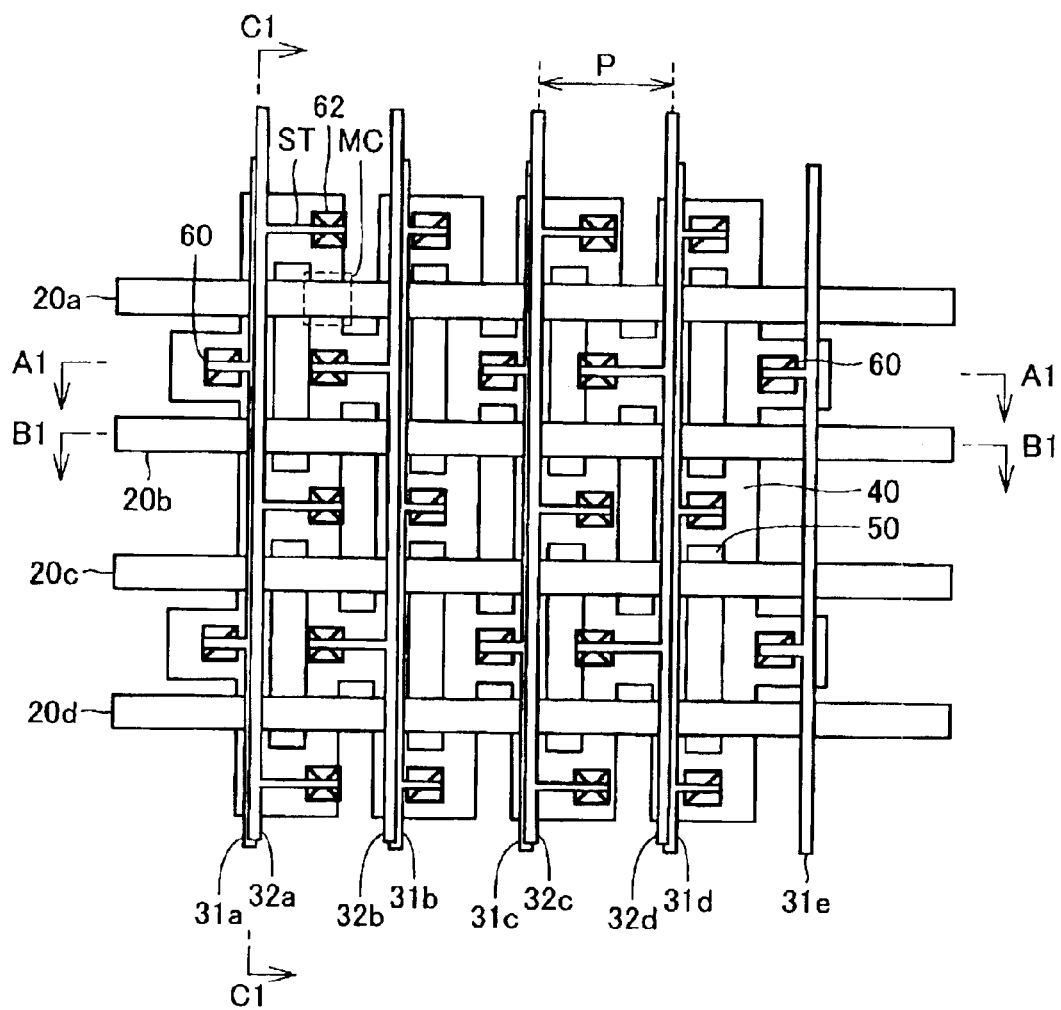
FIG. 7 is a plan view showing the arrangement of memory cell array MA in FIG. 6.

FIG. 7 is a plan view showing the arrangement of memory cell array MA in FIG. 6.

With reference to FIG. 7, a plurality of memory cells MC is arranged in a matrix form. The arrangements of n-type impurity regions 40, element isolation regions 50 and word lines 20a to 20d are the same as in the case of FIG. 2 and, therefore, descriptions thereof will not be repeated.

In FIG. 2, the positions of contact holes 60 provided for the connection to bit line 30b and contact holes 60 provided for the connection to bit line 30c are shifted slightly so that, as a result, contact holes 62 become aligned in approximately a line form in FIG. 7.

The first layer of bit lines 31a to 31e is provided so as to be perpendicular to word lines 20a to 20d. Then, bit lines 32a to 32d are made from the second metal wiring layer so as to approximately overlap bit lines 31a to 31d, respectively. Here, in FIG. 7, bit lines are shown as being thinner than they actually are so that the forms element isolation regions 50 and n-type impurity regions 40 may easily be viewed. Protruding portions ST, which are referred to as straps, are provided in bit line 31a and this bit line is connected to an n-type impurity region in the lower layer via contact holes 62 in portions wherein protruding portions ST are provided. Here, contact holes 60 are contact holes for connecting the first layer of bit lines to the n-type impurity regions and contact holes 62 are contact holes for connecting the second layer of bit lines to the n-type impurity regions. Contact holes 62 are provided by aligning the contact holes connecting the first metal wiring layer to the second metal wiring layer with the contact holes connecting the first metal wiring layer to the n-type impurity regions.

The positions of contact holes are shifted in such a manner so that the bit lines are divided into two layers, thereby pitch P of the bit lines can be widened in comparison with the case shown in FIG. 2.

Figure 8:
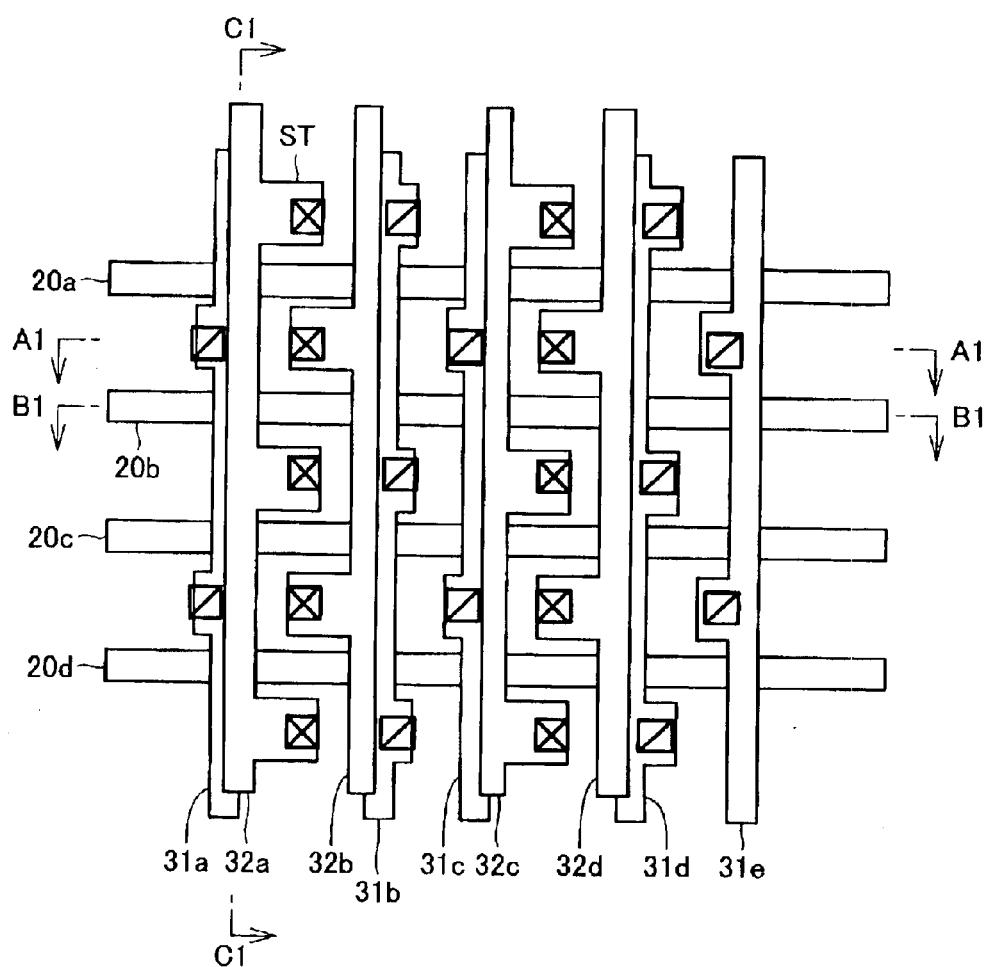
FIG. 8 is a diagram showing bit lines 31a to 31e and bit lines 32a to 32d described in FIG. 7 according to the actual proportions of the width.

FIG. 8 is a diagram showing bit lines 31a to 31e and bit lines 32a to 32d described in FIG. 7 according to the actual proportions of the width.

Though FIG. 8 displays the bit lines according to the actual proportions of the width, display of the n-type impurity regions and element isolation regions is omitted in order to simplify the drawing.

Figure 9:
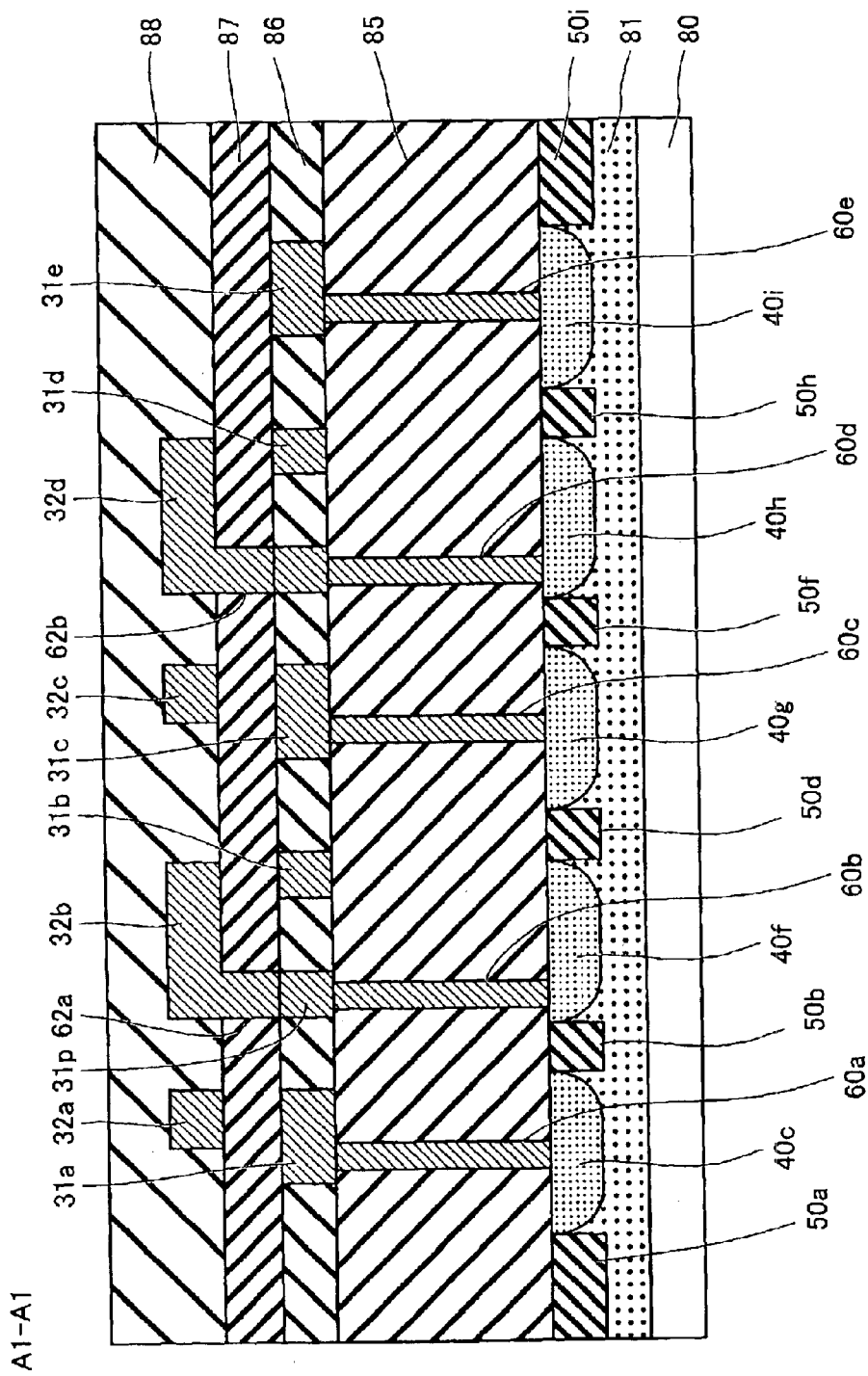
FIG. 9 is a cross sectional view taken along line A1—A1 of FIG. 7.

FIG. 9 is a cross sectional view taken along line A1—A1 of FIG. 7. The cross section taken along line A1—A1 is the cross section between word lines 20a and 20b in the direction along the word lines.

With reference to FIG. 9, semiconductor substrate 80, p well 81, element isolation regions 50a to 50i and n-type impurity regions 40c to 40i are the same as in the case described in FIG. 3 and, therefore, descriptions thereof will not be repeated.

Furthermore, the case of FIG. 9 differs from the case of FIG. 3 in the point that the positions of contact holes 60b and 60d provided in interlayer insulating film 85 are shifted. That is to say, contact hole 60b is provided in a position close to element isolation region 50b, rather than in a position in the center of the region above n-type impurity region 40f. In the same manner, contact hole 60d is provided in a position close to element isolation region 50f, rather than in a position in the center of the region above n-type impurity region 40h.

Bit lines 31a to 31e are provided on top of interlayer insulating film 85. In addition, plugs 31p for connection to the second layer of wires are also formed. Then, interlayer insulating film 86 is formed in portions between these bit lines and plugs. Then, interlayer insulating film 87 is, further, formed over interlayer insulating film 86 as well as bit lines 31a to 31e and contact holes 62a and 62b are provided in portions of interlayer insulating film 87.

Furthermore, bit lines 32a to 32d are formed from the second metal wiring layer. Finally, an insulating film 88 for passivation is formed.

Figure 10:
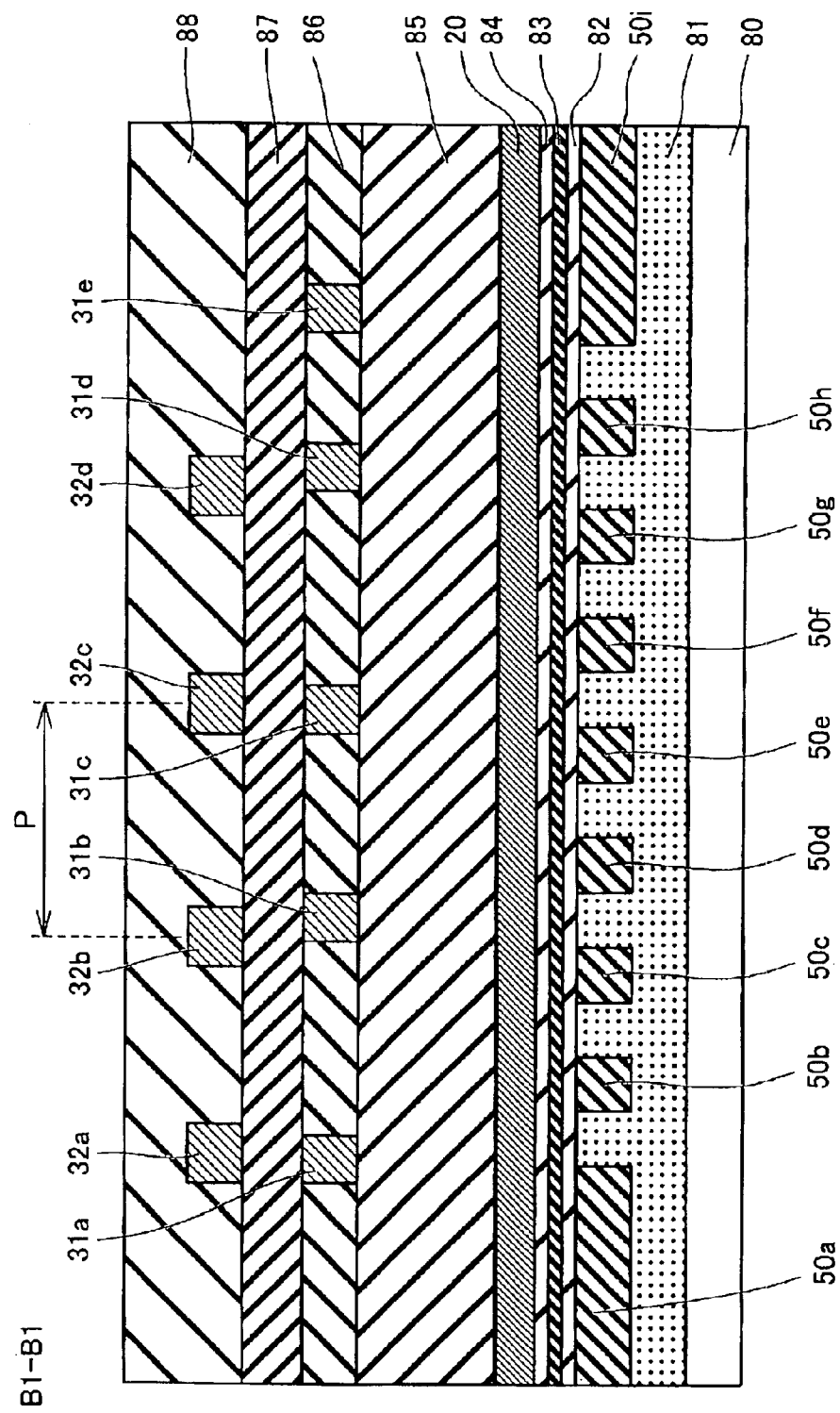
FIG. 10 is a cross sectional view taken along line B1—B1 of FIG. 7.

FIG. 10 is a cross sectional view taken along line B1—B1 of FIG. 7. The cross section taken along line B1—B1 is the cross section through word line 20b in the direction along the word line.

With reference to FIG. 10, semiconductor substrate 80, p well 81, element isolation regions 50a to 51i, silicon oxide film 82, nitride film 83, silicon oxide film 84, word line 20 and interlayer insulating film 85 are the same as in the case that described in FIG. 4 and, therefore, descriptions thereof will not be repeated.

Bit lines 31a to 31e are formed on top of interlayer insulating film 85, and interlayer insulating film 86 is formed between the bit lines. An interlayer insulating film 87 is formed over bit lines 31a to 31e and interlayer insulating film 86 and bit lines 32a to 32d are formed from the second metal wiring layer on top of interlayer insulating film 87. Then, finally, an insulating film 88 is formed as a passivation film. Since the bit lines are divided into the first layer and the second layer, pitch P between the bit lines is greater than that in the case of FIG. 4. Thereby, the occurrence of short circuiting between bit lines, leading to defects, is reduced.

Figure 11:
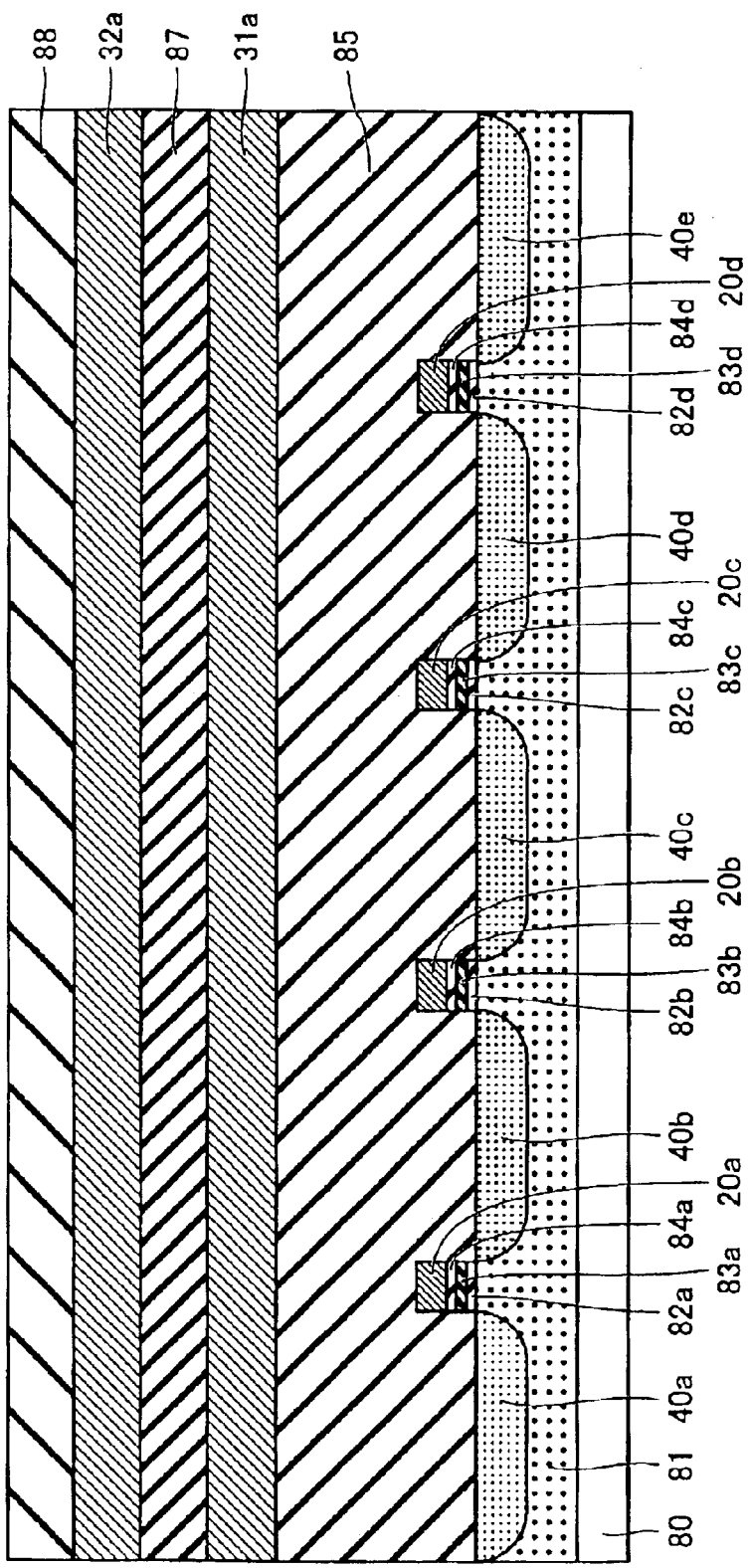
FIG. 11 is a cross sectional view taken along line C1—C1 of FIG. 7.

FIG. 11 is a cross sectional view taken along line C1—C1 of FIG. 7. The cross section taken along line C1—C1 is the cross section through bit lines 31a and 32a in the direction along the bit lines.

With reference to FIG. 11, semiconductor substrate 80, p well 81, n-type impurity regions 40a to 40e, silicon oxide films 82a to 82d and 84a to 84d, nitride films 83a to 83d and interlayer insulating film 85 are the same as in the case described in FIG. 5 and, therefore, descriptions thereof will not be repeated.

Bit line 31a is formed from the first metal wiring layer on top of interlayer insulating film 85. Interlayer insulating film 87 is formed on top of bit line 31a. Bit line 32a is formed from the second wiring layer on top of interlayer insulating film 87. Then, insulating film 88 is formed on top of bit line 32a as a passivation film.

Next, a manufacturing process for a non-volatile semiconductor memory device having the above described structure will be described.

FIGS. 12 to 27 are cross sectional views for describing a manufacturing process for a non-volatile semiconductor memory device according to the first embodiment. Here, FIGS. 12 to 16 and FIGS. 18, 20, 22, 24 and 26 show cross sectional views taken along line B1—B1 in FIG. 7 while FIGS. 17, 19, 21, 23, 25 and 27 show cross sectional views taken along line A1—A1 in FIG. 7.

Figure 12:
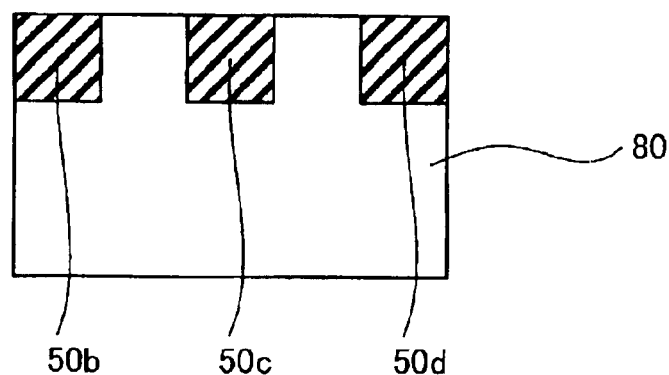
FIG. 12 is a cross sectional view for describing the first manufacturing step of the non-volatile semiconductor memory device according to the first embodiment.

With reference to FIG. 12, element isolation regions 50b, 50c and 50d are formed in the main surface of semiconductor substrate 80, which is a p-type silicon substrate. Element isolation regions 50b, 50c and 50d are formed by means of a trench isolation method.

Figure 13:
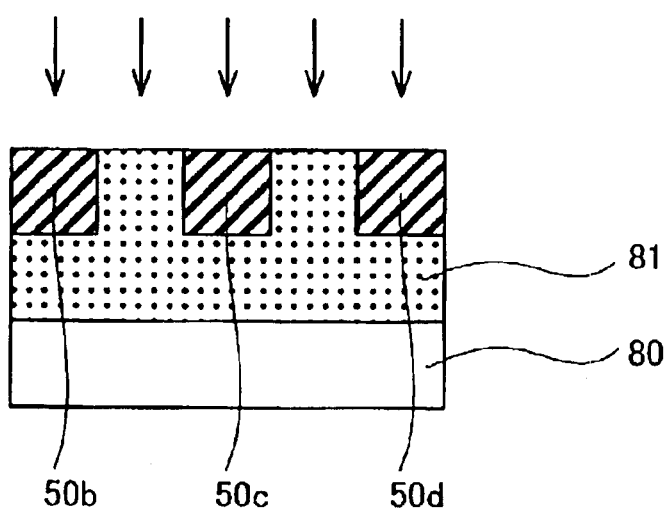
FIG. 13 is a cross sectional view for describing the second manufacturing step of the non-volatile semiconductor memory device according to the first embodiment.

With reference to FIG. 13, boron is implanted into semiconductor substrate 80. Thereby, p well 81 is formed.

Figure 14:
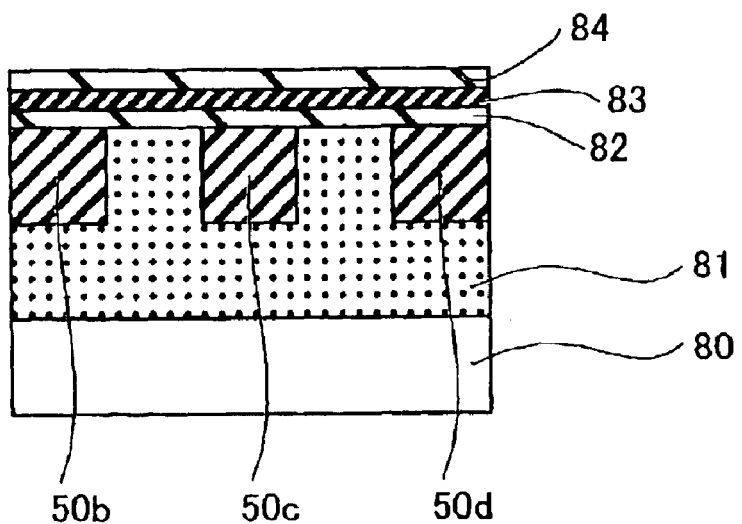
FIG. 14 is a cross sectional view for describing the third manufacturing step of the non-volatile semiconductor memory device according to the first embodiment.

Next, as shown in FIG. 14, silicon oxide film 82 is formed on the main surface of semiconductor substrate 80 using a thermal oxidation method. Next, nitride film 83 is formed on silicon oxide film 82. Nitride film 83 is formed using a low pressure CVD (chemical vapor deposition) method. After that, silicon oxide film 84 is formed on nitride film 83.

Figure 15:
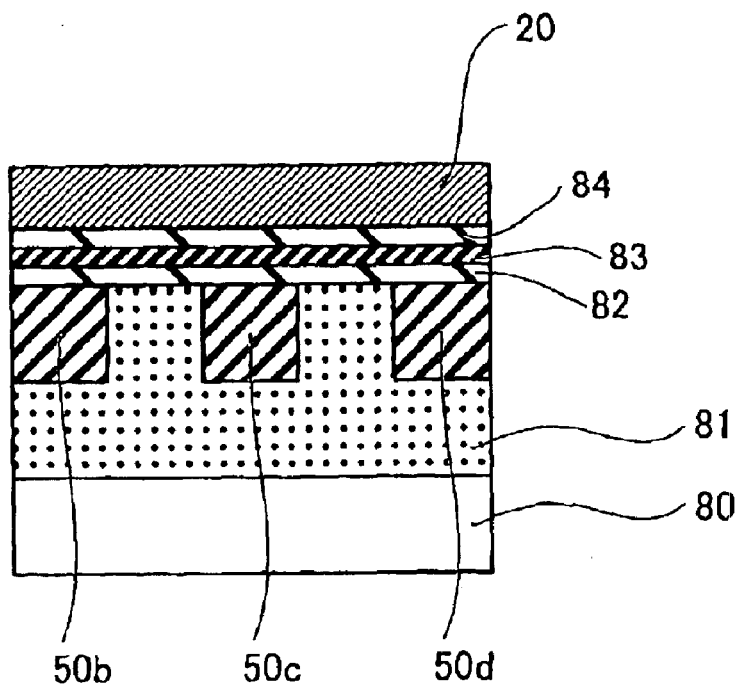
FIG. 15 is a cross sectional view for describing the fourth manufacturing step of the non-volatile semiconductor memory device according to the first embodiment.

Next, as shown in FIG. 15, word line 20 is formed on silicon oxide film 84. The material of word line 20 is polysilicon, which is formed using a low pressure CVD method.

Figure 16:
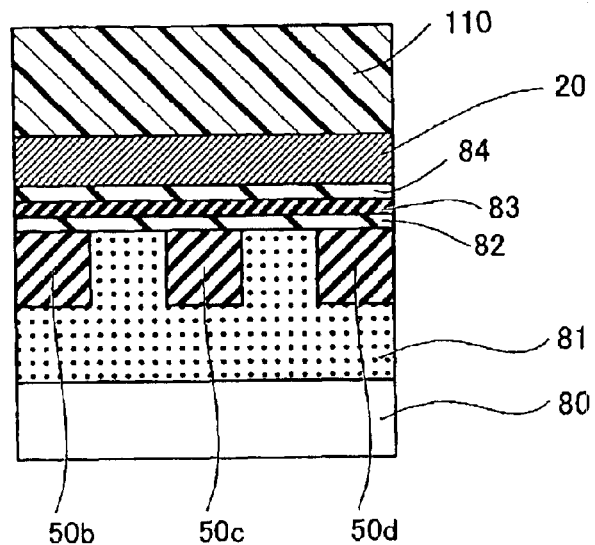
FIG. 16 is a cross sectional view taken along line B1—B1 for describing the fifth manufacturing step of the non-volatile semiconductor memory device according to the first embodiment.
Figure 17:
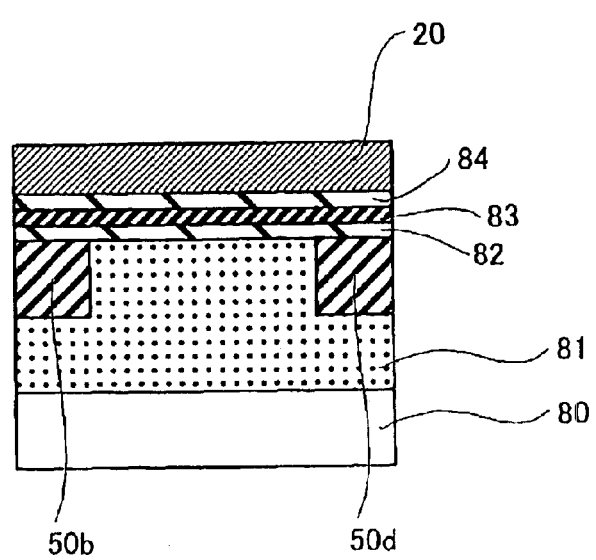
FIG. 17 is a cross sectional view taken along line A1—A1 for describing the fifth manufacturing step of the non-volatile semiconductor memory device according to the first embodiment.

Next, a resist film 110 having a predetermined pattern is formed on word line 20 using a photolithographic method. As a result, resist film 110 is formed on word line 20, as shown in FIG. 16, in the cross section taken along line B1—B1 (hereinafter referred to as B1—B1 cross section) in FIG. 7. On the other hand, resist film 110 is not formed as shown in FIG. 17 in the cross section taken along line A1—A1 (hereinafter referred to as A1—A1 cross section) in FIG. 7.

Figure 18:
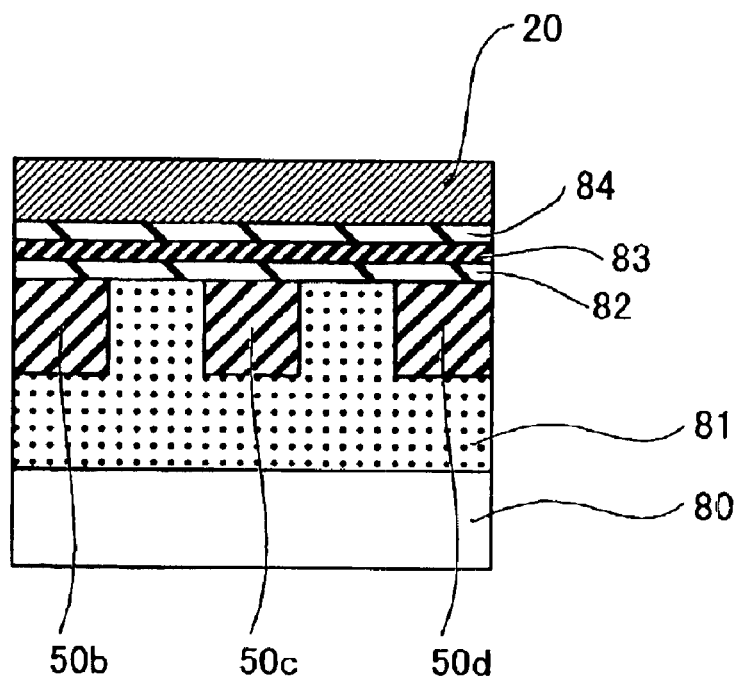
FIG. 18 is a cross sectional view taken along line B1—B1 for describing the sixth manufacturing step of the non-volatile semiconductor memory device according to the first embodiment.
Figure 19:
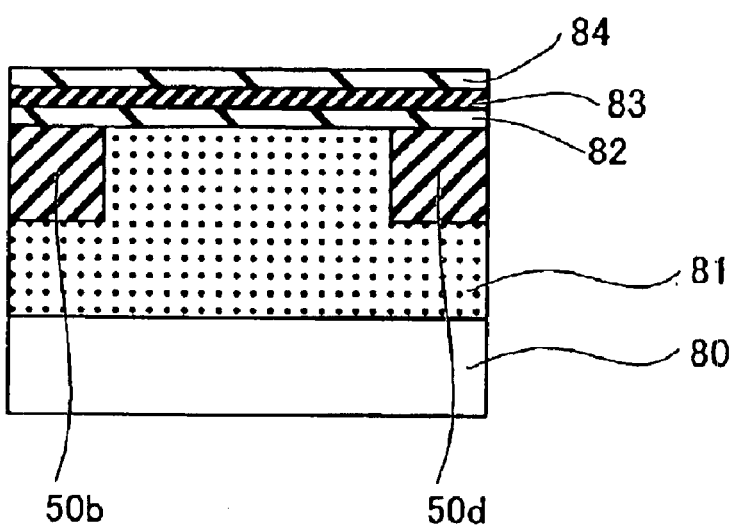
FIG. 19 is a cross sectional view taken along line A1—A1 for describing the sixth manufacturing step of the non-volatile semiconductor memory device according to the first embodiment.

This resist film 110 is used as a mask and word line 20 is partially removed. As a result, as shown in FIG. 18, since resist film 110 is formed on word line 20 in the B1—B1 cross section, word line 20 is not removed in the B1—B1 cross section. On the other hand, as shown in FIG. 19, word line 20 is removed in the A1—A1 cross section.

Figure 20:
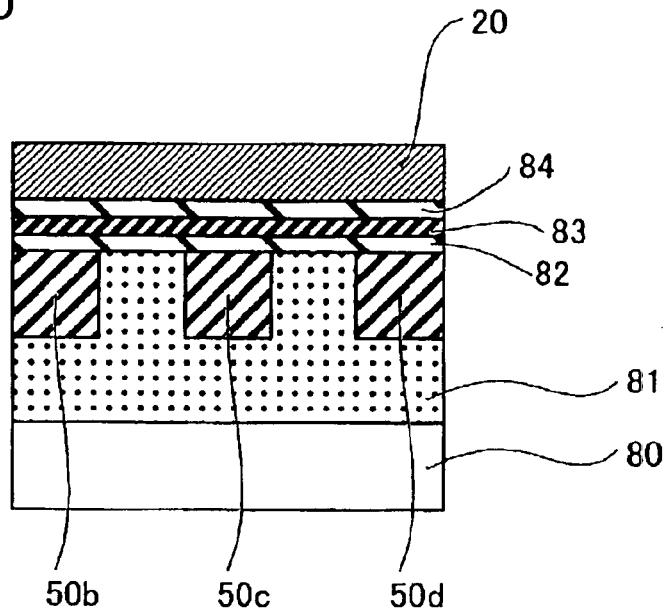
FIG. 20 is a cross sectional view taken along line B1—B1 for describing the seventh manufacturing step of the non-volatile semiconductor memory device according to the first embodiment.
Figure 21:
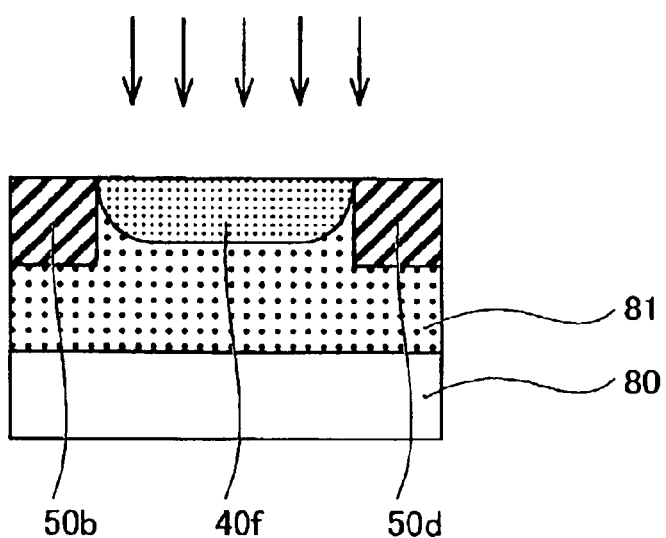
FIG. 21 is a cross sectional view taken along line A1—A1 for describing the seventh manufacturing step of the non-volatile semiconductor memory device according to the first embodiment.

Next, silicon oxide film 84, nitride film 83 and silicon oxide film 82 are partially removed. As a result, as shown in FIG. 20, word line 20, silicon oxide film 84, nitride film 83 and silicon oxide film 82 remain as they are without undergoing etching in the B1—B1 cross section. On the other hand, as shown in FIG. 21, silicon oxide film 84, nitride film 83 and silicon oxide film 82 are removed in the A1—A1 cross section.

As a result, the condition is obtained wherein word lines 20, making up plurality, are aligned in rows in the memory cell array. On the other hand, the regions in which word lines 20 do not exist are in the condition wherein the main surface of semiconductor substrate 80 is exposed. After that, resist film 110 is removed.

Next, arsenic ions are implanted in the regions within the memory cell array wherein word lines 20 do not exist so that the main surface of semiconductor substrate 80 is exposed. After that, a heat treatment is carried out wherein a semiconductor substrate 80 is placed in a nitrogen atmosphere at a predetermined temperature. This heat treatment activates arsenic ion and, as a result, n-type impurity region 40f is formed in the main surface of semiconductor substrate 80 in the A1—A1 cross section, as shown in FIG. 21.

Next, interlayer insulating film 85 is formed over a plurality of word lines 20 as well as the main surface of semiconductor substrate 80 within the memory cell array. Interlayer insulating film 85 is formed using a CVD method and, after that, a heat treatment is carried out on semiconductor substrate 80, thereby the interlayer insulating film is hardened. A resist film (not shown) is formed on top of this interlayer insulating film 85 using a photolithographic method. This resist film is used as a mask in order to etch interlayer insulating film 85.

Figure 22:
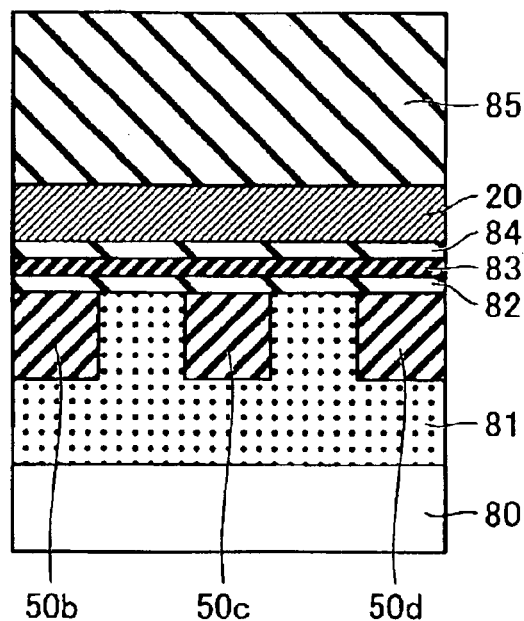
FIG. 22 is a cross sectional view taken along line B1—B1 for describing the eighth manufacturing step of the non-volatile semiconductor memory device according to the first embodiment.
Figure 23:
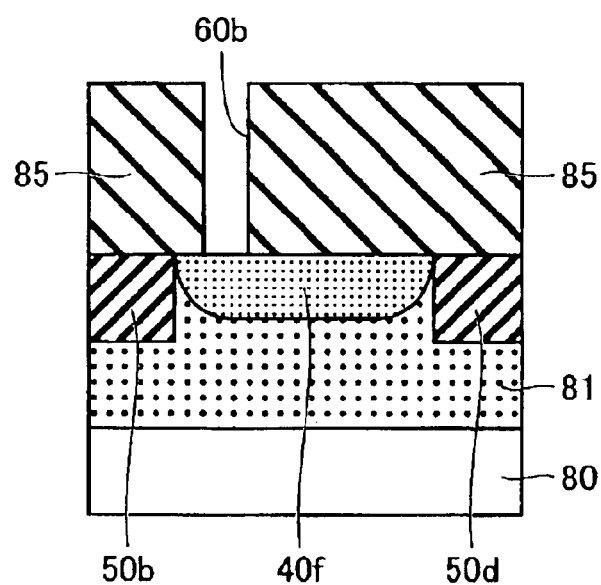
FIG. 23 is a cross sectional view taken along line A1—A1 for describing the eighth manufacturing step of the non-volatile semiconductor memory device according to the first embodiment.

As a result, as shown in FIG. 22, interlayer insulating film 85 is not etched in the B1—B1 cross section. On the other hand, as shown in FIG. 23, interlayer insulating film 85 is partially removed in the A1—A1 cross section so that contact hole 60b is created. After this, the resist film is removed.

Figure 24:
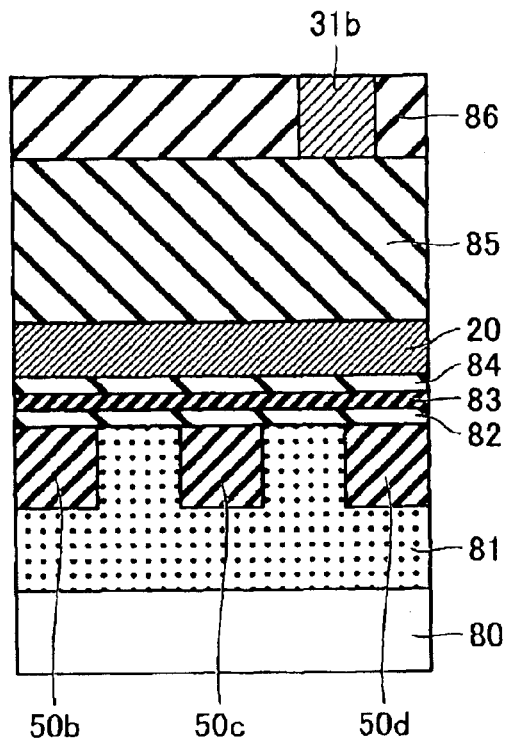
FIG. 24 is a cross sectional view taken along line B1—B1 for describing the ninth manufacturing step of the non-volatile semiconductor memory device according to the first embodiment.
Figure 25:
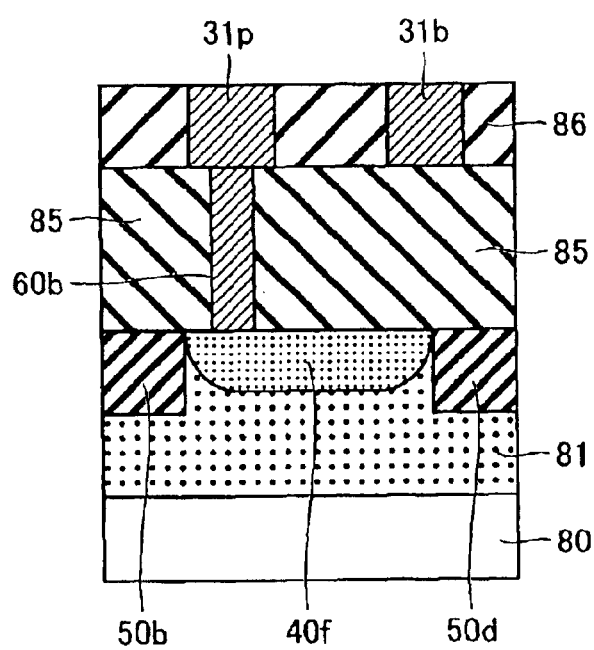
FIG. 25 is a cross sectional view taken along line A1—A1 for describing the ninth manufacturing step of the non-volatile semiconductor memory device according to the first embodiment.

Next, a metal film is formed, using a sputtering method, as a conductive film to extend from the inside of contact hole 60b to the area over the surface of interlayer insulating film 85. The metal film is, for example, an aluminum-silicon-copper (Al—Si—Cu) alloy film. A resist film (not shown) having a wire pattern is formed on top of this alloy film using a photolithographic method. This resist film is used as a mask in order to partially etch and remove the alloy film. As a result, bit line 30b, placed parallel to the column direction, and plug 30p, for an electrical connection to a bit line in the second layer, are formed. After that, interlayer insulating film 86 is formed in the regions from which the alloy film has been removed by etching. Thereby, the structure as shown in FIG. 24 is obtained in the B1—B1 cross section and the structure as shown in FIG. 25 is obtained in the A1—A1 cross section.

Figure 26:
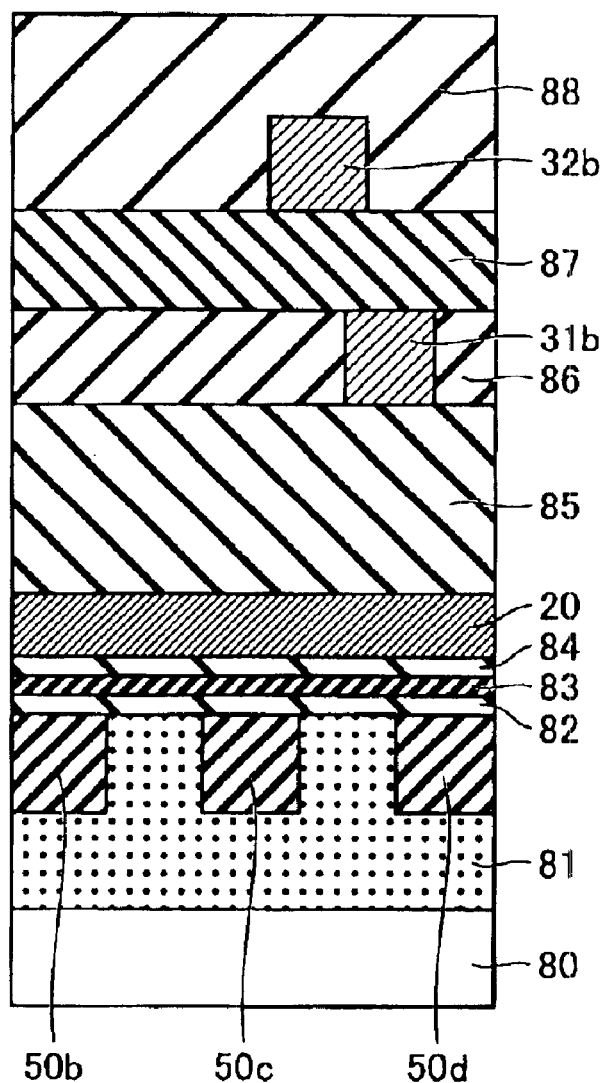
FIG. 26 is a cross sectional view taken along line B1—B1 for describing the tenth manufacturing step of the non-volatile semiconductor memory device according to the first embodiment.
Figure 27:
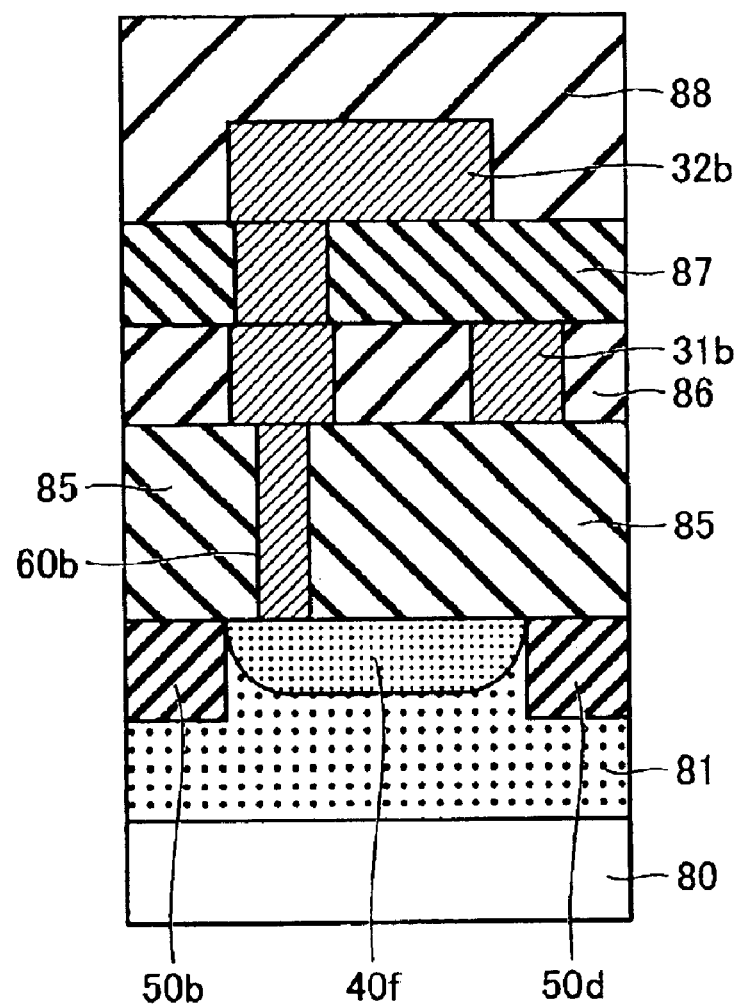
FIG. 27 is a cross sectional view taken along line A1—A1 for describing the tenth manufacturing step of the non-volatile semiconductor memory device according to the first embodiment.

Next, a metal film is formed, using a sputtering method, as a conductive film on the surface of interlayer insulating film 87. The metal film is, for example, an aluminum-silicon-copper (Al—Si—Cu) alloy film. A resist film (not shown) having a wire pattern is formed on top of this alloy film using a photolithographic method. This resist film is used as a mask in order to partially etch and remove the alloy film. As a result, bit lines 32b, aligned in columns, are formed in the second layer. After that, the alloy film is removed by etching and insulating film 88 for passivation is form. Thereby, the structure as shown in FIG. 26 is obtained in the B1—B1 cross section and the structure as shown in FIG. 27 is obtained in the A1—A1 cross section.

As described above, the bit lines crossing and perpendicular to the word lines are divided into two wiring layers and, thus, the pitch of the bit lines in the respective wiring layers is widened. Thereby, it becomes possible to reduce the occurrence of wire breakage and short circuiting of bit lines, which are the cause of defects, even in the case of an increase in integration.

Second Embodiment

The configuration of a virtual ground-type memory cell array wherein bit lines are formed from two metal wiring layers so that the bit lines in one layer are parallel to the word lines while the bit lines in the other layer are perpendicular to the word lines is herein described according to a second embodiment.

Figure 28:
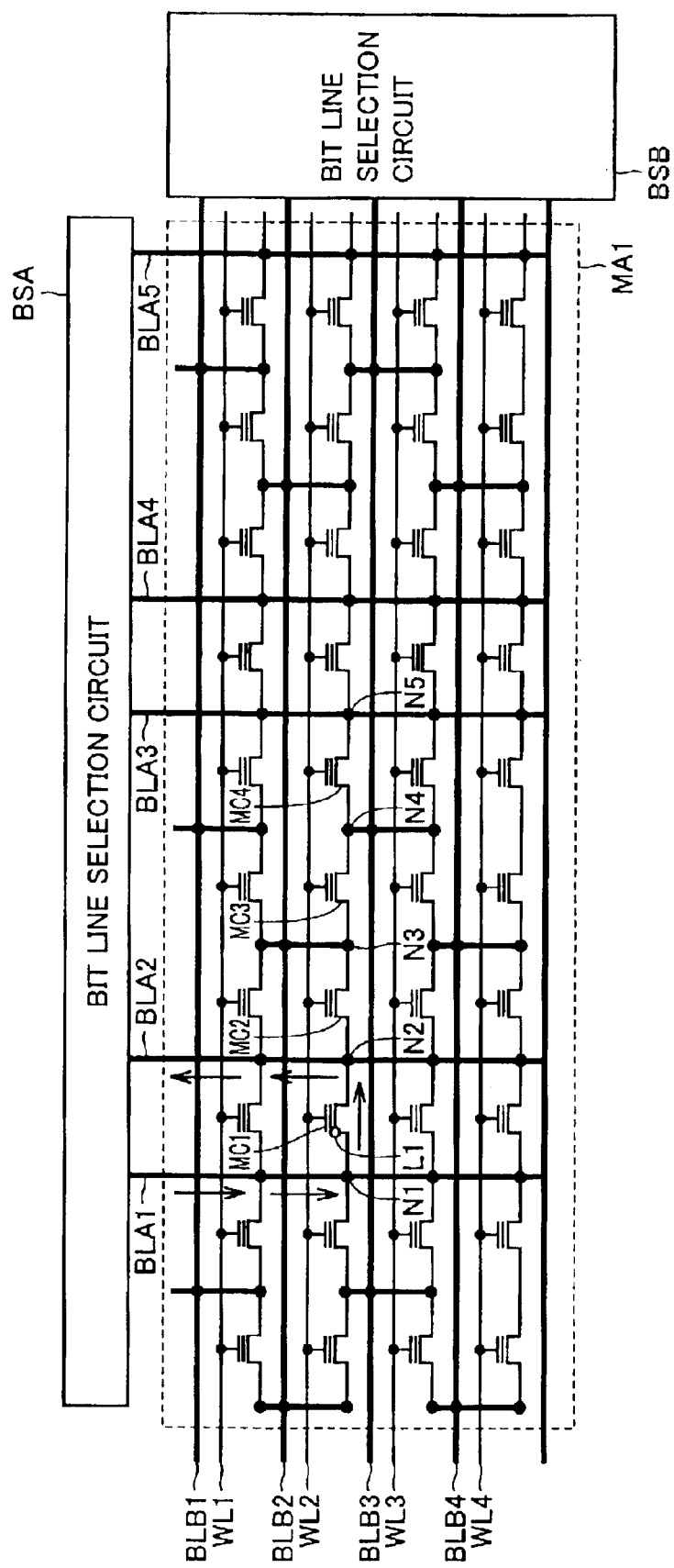
FIG. 28 is a circuit diagram showing a configuration of memory cell array MA1 according to a second embodiment.

FIG. 28 is a circuit diagram showing the configuration of memory cell array MA1 according to the second embodiment.

With reference to FIG. 28, memory cell array MA1 includes word lines WL1 to WL4 and rows of pluralities of memory cells, respectively, connected to word lines WL1 to WL4.

Memory cell array MA1 further includes bit lines BLA1 to BLA4 provided in the direction perpendicular to the word lines and bit lines BLB1 to BLB4 provided parallel to the word lines. As shown in FIG. 28, memory cell array MA1 is characterized by the existence of a group of bit lines aligned in the direction parallel to the word lines.

A bit line selection circuit BSA corresponding to bit lines BLA1 to BLA5 aligned perpendicular to the word lines and a bit line selection circuit BSB corresponding to bit lines BLB1 to BLB4 aligned parallel to the word lines are provided. Two bit lines, from among bit lines BLA1 to BLA5 and BLB1 to BLB4, are selected by bit line selection circuits BSA and BSB so that different potentials are supplied to these bit lines. Then, any one of word lines WL1 to WL4 is activated, thereby current flows into a specified memory cell and programming of data is carried out.

Bit line BLA1 is set at power supply potential VCC and bit line BLA2 is set at power potential GND, for example, in order to carry out programming of data to memory region L1 of memory cell MC1. Then, other bit lines are set to be in the floating condition. When word line WL2 is activated according to the above described conditions, current flows from the bit line selection circuit through bit line BLA1 to node N1, current flows from node N1 through memory cell MC1 to node N2 and, then, current flows from node N2 through bit line BLA2 to bit line selection circuit BSA.

Here, though a case wherein power supply potential VCC and power potential GND are supplied to two bit lines will be described, the present invention is not limited to this but, rather, two different potentials, having a predetermined potential gap, may be supplied so that programming can be carried out in a memory region of a memory cell.

Figure 29:
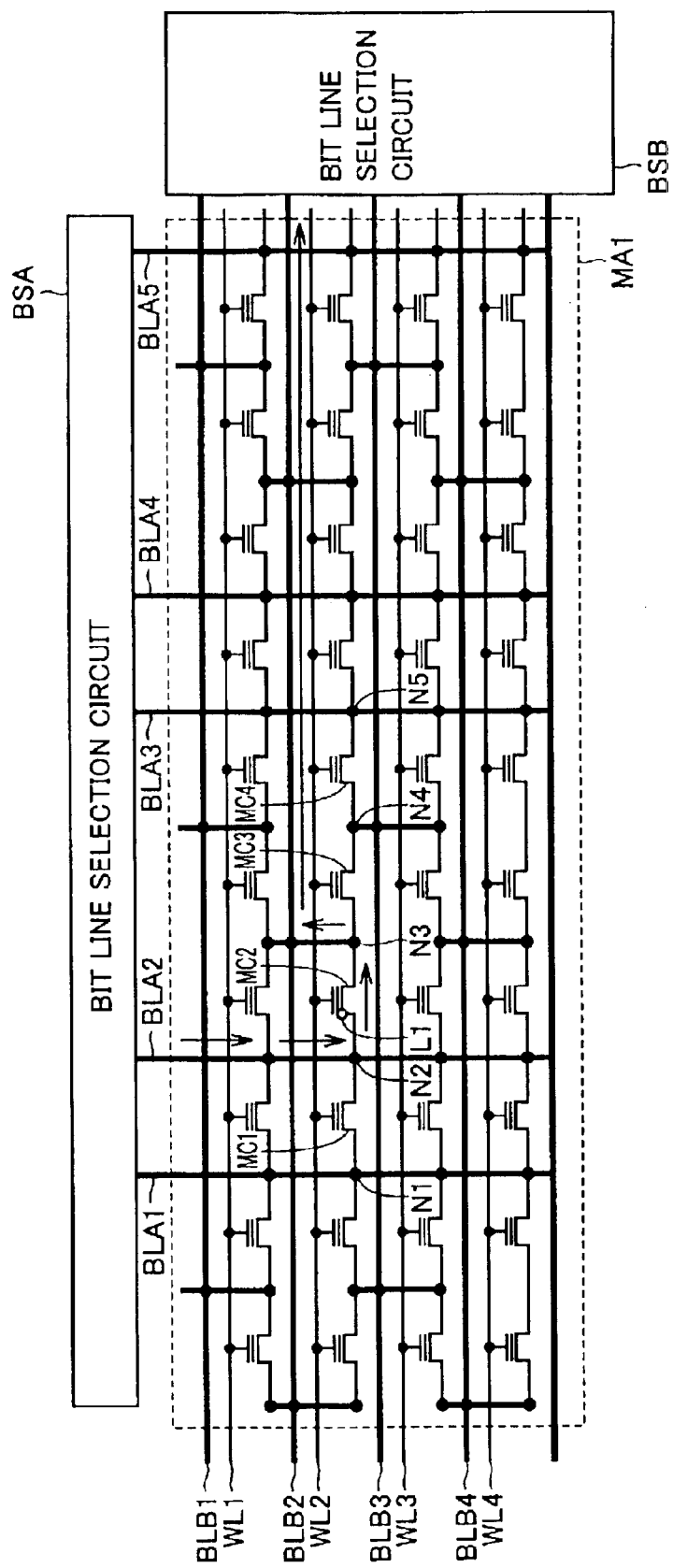
FIG. 29 is a circuit diagram for describing a programming operation to memory region L1 of memory cell MC2.

FIG. 29 is a circuit diagram for describing the programming operation to memory region L1 of memory cell MC2.

Here, memory cell MC2 is connected to the same word line as memory cell MC1 and is a memory cell adjacent to memory cell MC1.

With reference to FIG. 29, power supply potential VCC is supplied to bit line BLA2, power potential GND is supplied to bit line BLB2 and other bit lines are set to be in the floating condition in order to program in accordance with data to memory region L1 of memory cell MC. When word line WL2 is activated according to the above described conditions, current flows from bit line BLA2 via node N2, memory cell MC2 and node N3 to bit line BLB2. Then, current escapes to bit line selection circuit BSB.

Figure 30:
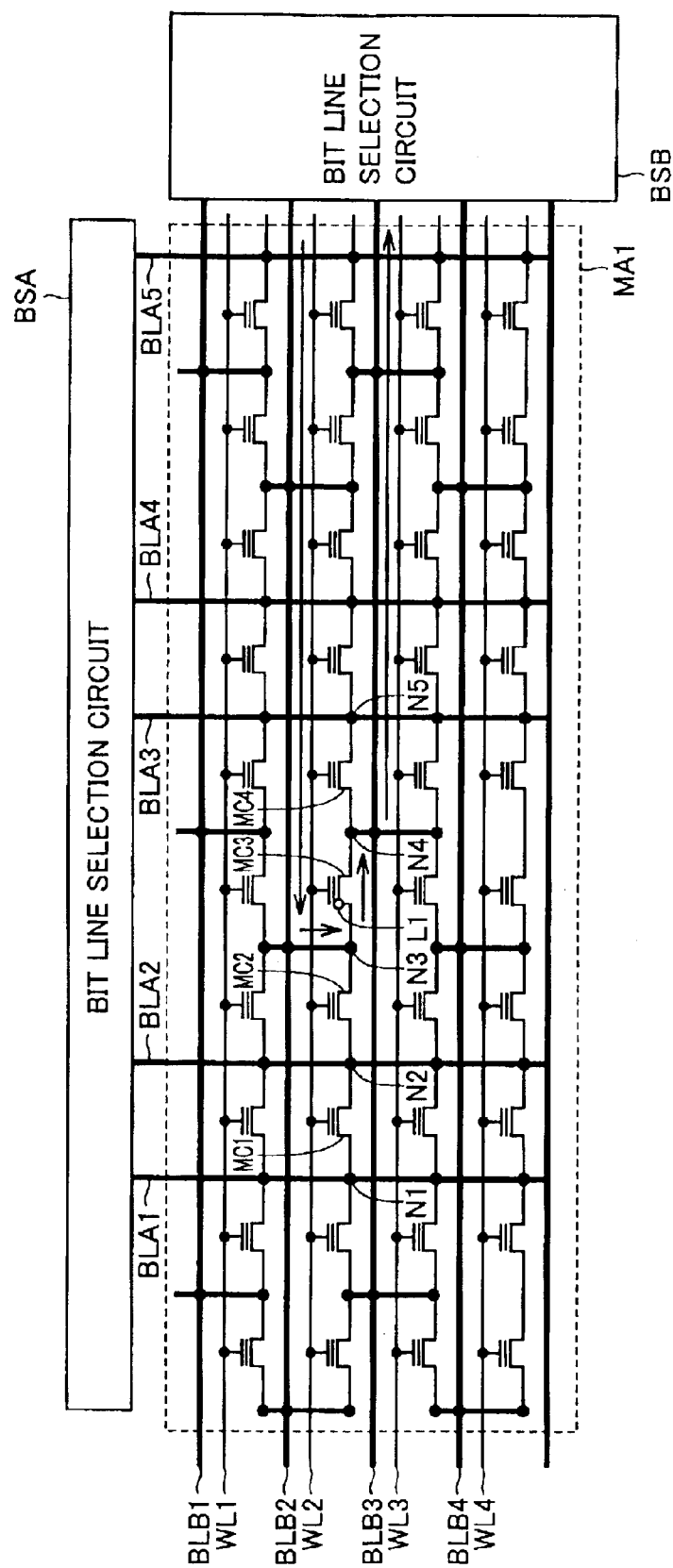
FIG. 30 is a diagram for describing a programming operation to memory region L1 of memory cell MC3.

FIG. 30 is a diagram for describing a programming operation to memory region L1 of memory cell MC3. Here, memory cell MC3 is connected to the same word line as memory cells MC1 and MC2 and is a memory cell adjacent to memory cell MC2.

With reference to FIG. 30, power supply potential VCC is supplied to bit line BLB2 and ground potential GND is supplied to bit line BLB3 in order to program in accordance with data to memory region L1 of memory cell MC3. Then, other bit lines are set to be in the floating condition.

When word line WL2 is activated according to the above described conditions, the programming current flows from bit line selection circuit BSB to bit line BLB2 and, then, flows into bit line BLB3 through node N3, memory cell MC3 and node N4. The current that has flown through bit line BLB3 escapes and flows again toward bit line selection circuit BSB.

Figure 31:
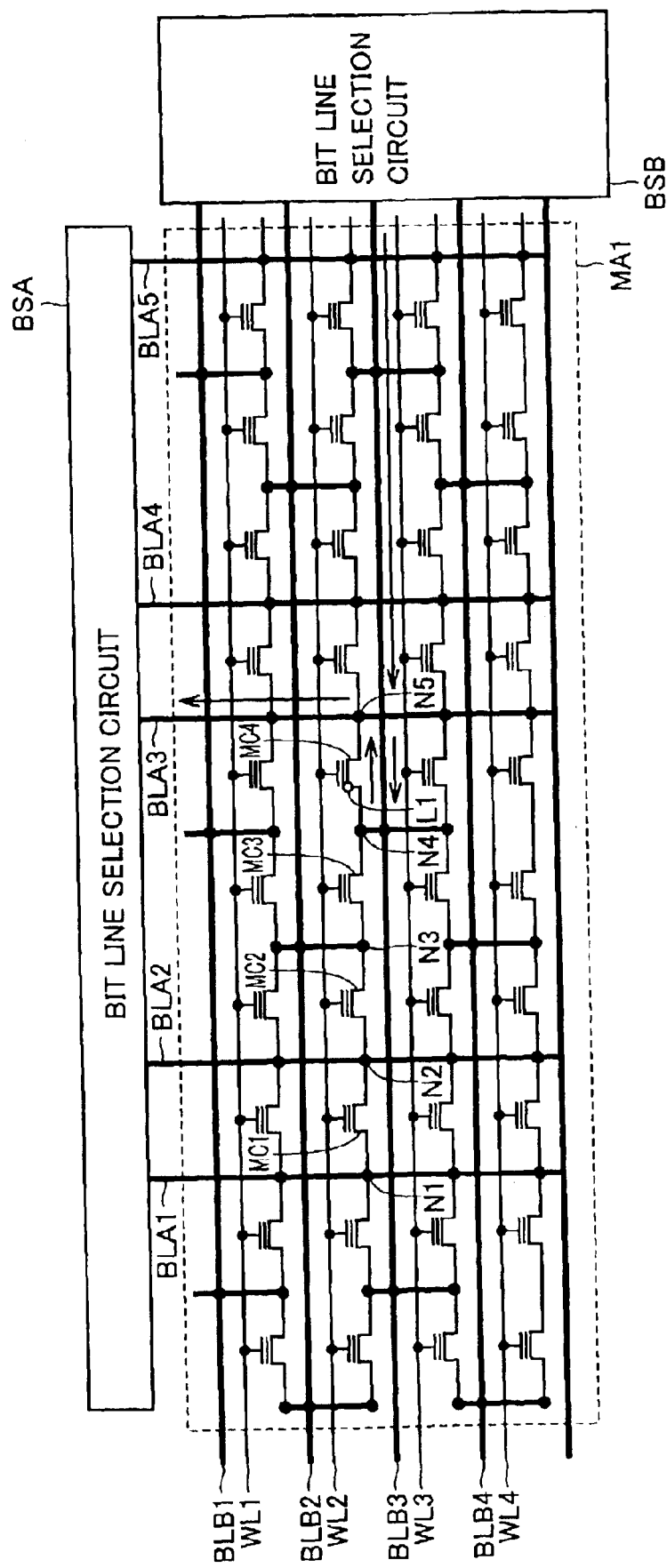
FIG. 31 is a diagram for describing a programming operation to memory region L1 of memory cell MC4.

FIG. 31 is a diagram for describing a programming operation to memory region L1 of memory cell MC4. Here, memory cell MC4 is connected to the same word line as memory cells MC1 to MC3 and is a memory cell adjacent to memory cell MC3.

With reference to FIG. 31, a power supply potential is supplied to bit line BLB3 and the ground potential is supplied to bit line BLA3 in order to program in accordance with data to memory region L1 of memory cell MC4. Then, the other bit lines are set to be in the floating condition. When word line WL2 is activated according to the above described conditions, a programming current flows from bit line selection circuit BSB through bit line BLB3, memory cell MC4 and bit line BLA3 to bit line selection circuit BSA.

Figure 32:
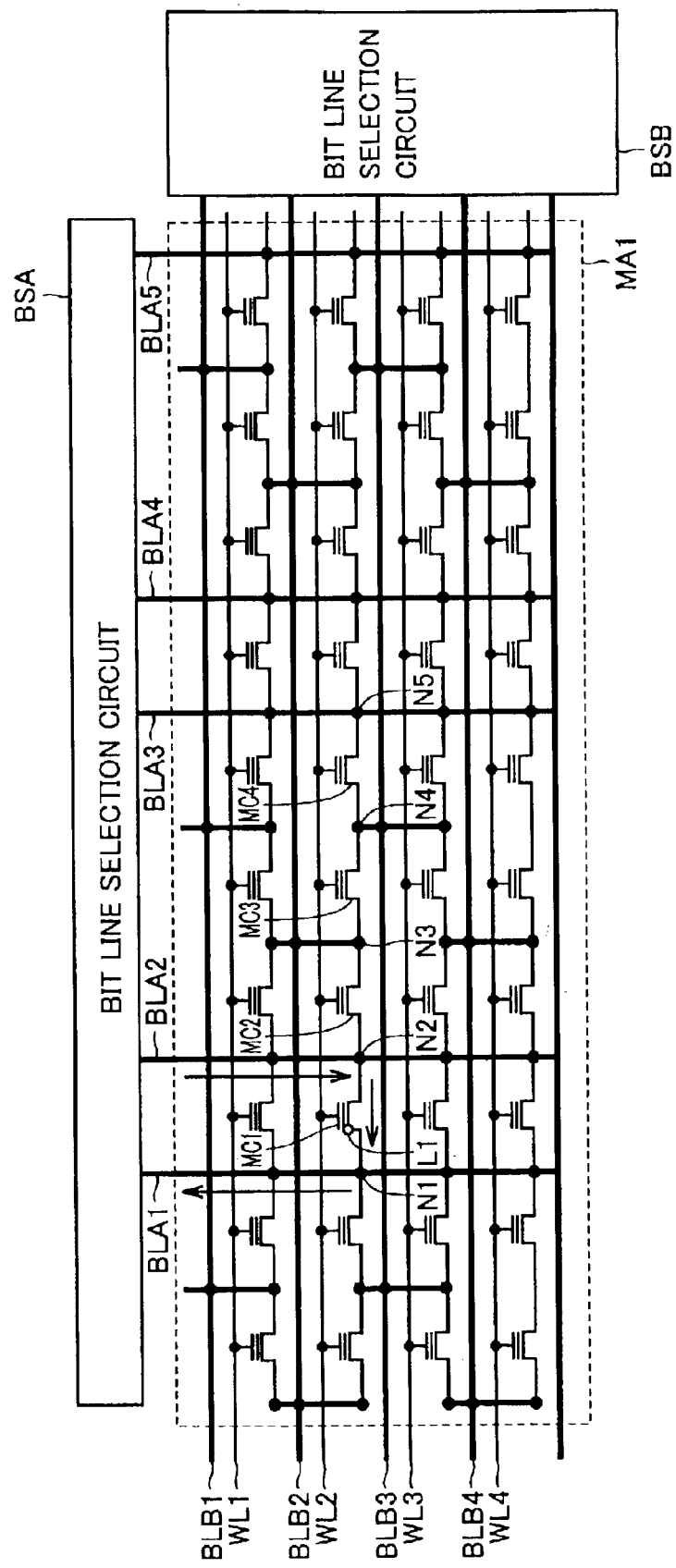
FIG. 32 is a diagram for describing a reading operation from memory region L1 of memory cell MC1.

FIG. 32 is a diagram for describing a reading operation from memory region L1 of memory cell MC1.

With reference to FIG. 32, potentials of bit lines BLA2 and BLA1 are set so that a current flows from bit line BLA2 to bit line BLA1, and the other bit lines are set to be in the floating condition, in order to read data from memory region L1 of memory cell MC1. Then, word line WL2 is activated according to the above described conditions in order to check whether or not current flows through memory cell MC1, thereby it can be detected whether or not data has been written in to memory region L1. The direction in which the current flows becomes opposite to that at the time of programming described in FIG. 28.

Figure 33:
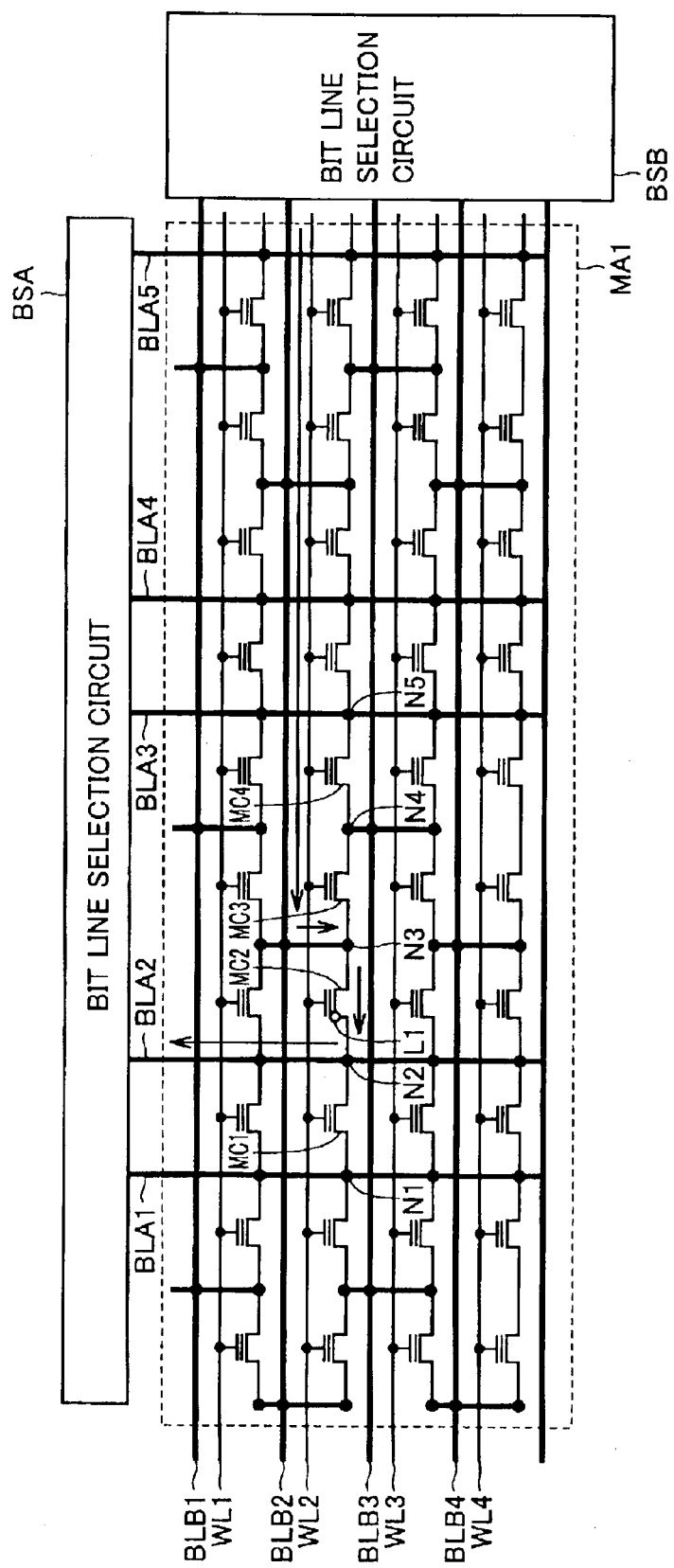
FIG. 33 is a diagram for describing a reading operation from memory region L1 of memory cell MC2.

FIG. 33 is a diagram for describing a reading operation from memory region L1 of memory cell MC2.

With reference to FIG. 33, potentials of bit lines BLB2 and BLA2 are set so that a current flows from bit line BLB2 to bit line BLA2, and the other bit lines are set to be in the floating condition, in order to read data from memory region L1 of memory cell MC2. Then, word line WL2 is activated according to the above described conditions in order to check whether or not current flows through memory cell MC2, thereby it can be detected whether or not data has been written in to memory region L1. The direction in which the current flows becomes opposite to that at the time of programming described in FIG. 29.

Figure 34:
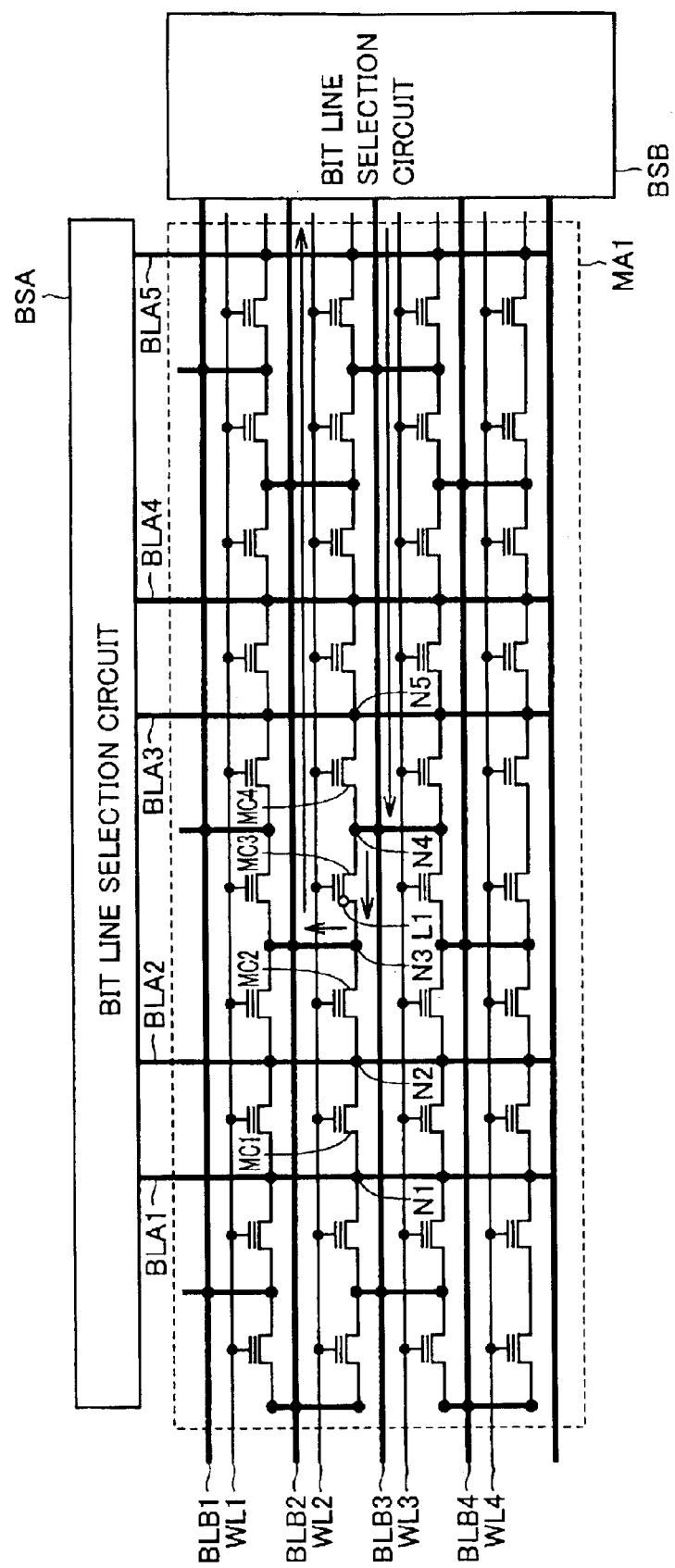
FIG. 34 is a diagram for describing a reading operation from memory region L1 of memory cell MC3.

FIG. 34 is a diagram for describing a reading operation from memory region L1 of memory cell MC3.

With reference to FIG. 34, potentials of bit lines BLB3 and BLB2 are set so that a current flows from bit line BLB3 to bit line BLB2, and the other bit lines are set to be in the floating condition, in order to read data from memory region L1 of memory cell MC3. Then, word line WL2 is activated according to the above described conditions in order to check whether or not current flows through memory cell MC3, thereby it can be detected whether or not data has been written in to memory region L1. The direction in which the current flows becomes opposite to that at the time of programming described in FIG. 30.

Figure 35:
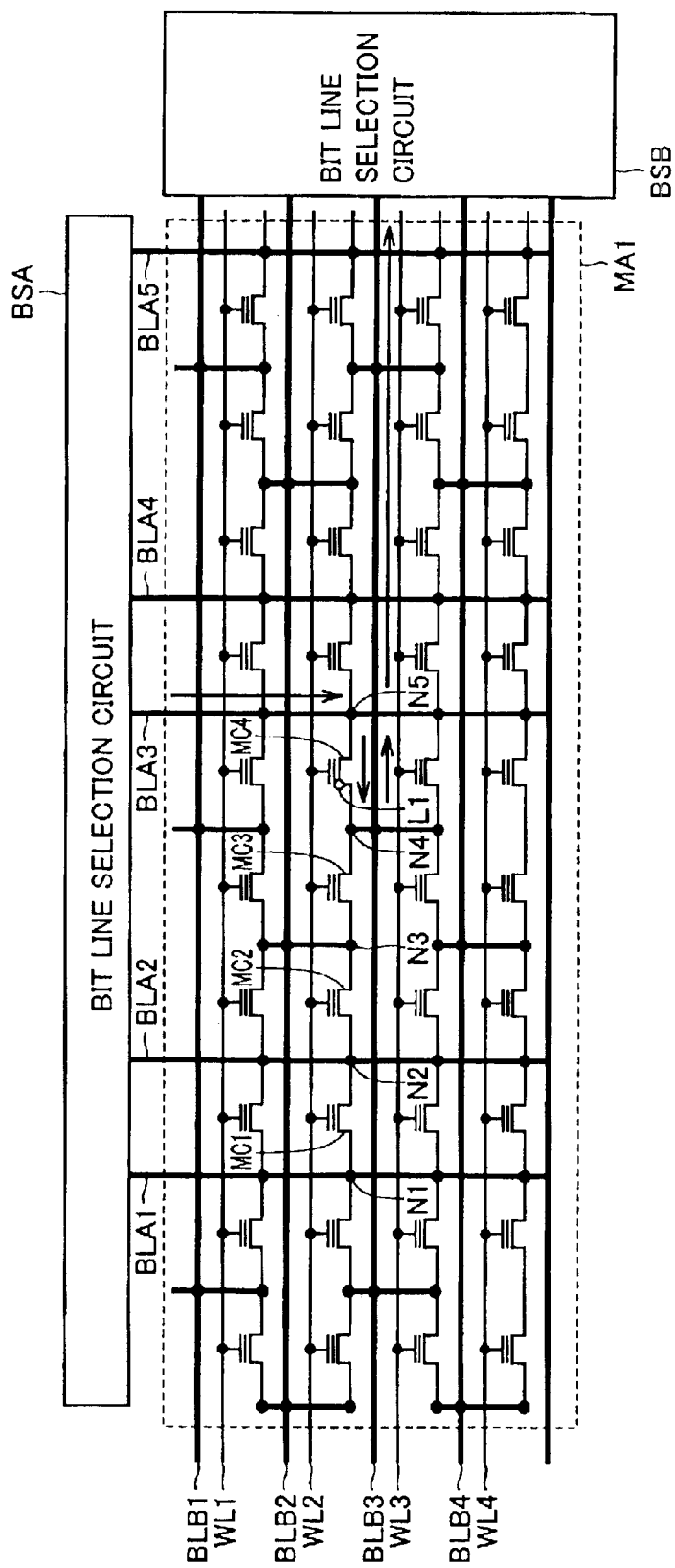
FIG. 35 is a diagram for describing a reading operation from memory region L1 of memory cell MC4.

FIG. 35 is a diagram for describing a reading operation from memory region L1 of memory cell MC4.

With reference to FIG. 35, potentials of bit lines BLA3 and BLB3 are set so that a current flows from bit line BLA3 to bit line BLB3, and the other bit lines are set to be in the floating condition, in order to read data from memory region L1 of memory cell MC4. Then, word line WL2 is activated according to the above described conditions in order to check whether or not current flows through memory cell MC4, thereby it can be detected whether or not data has been written in to memory region L1. The direction in which the current flows becomes opposite to that at the time of programming described in FIG. 31.

Figure 36:
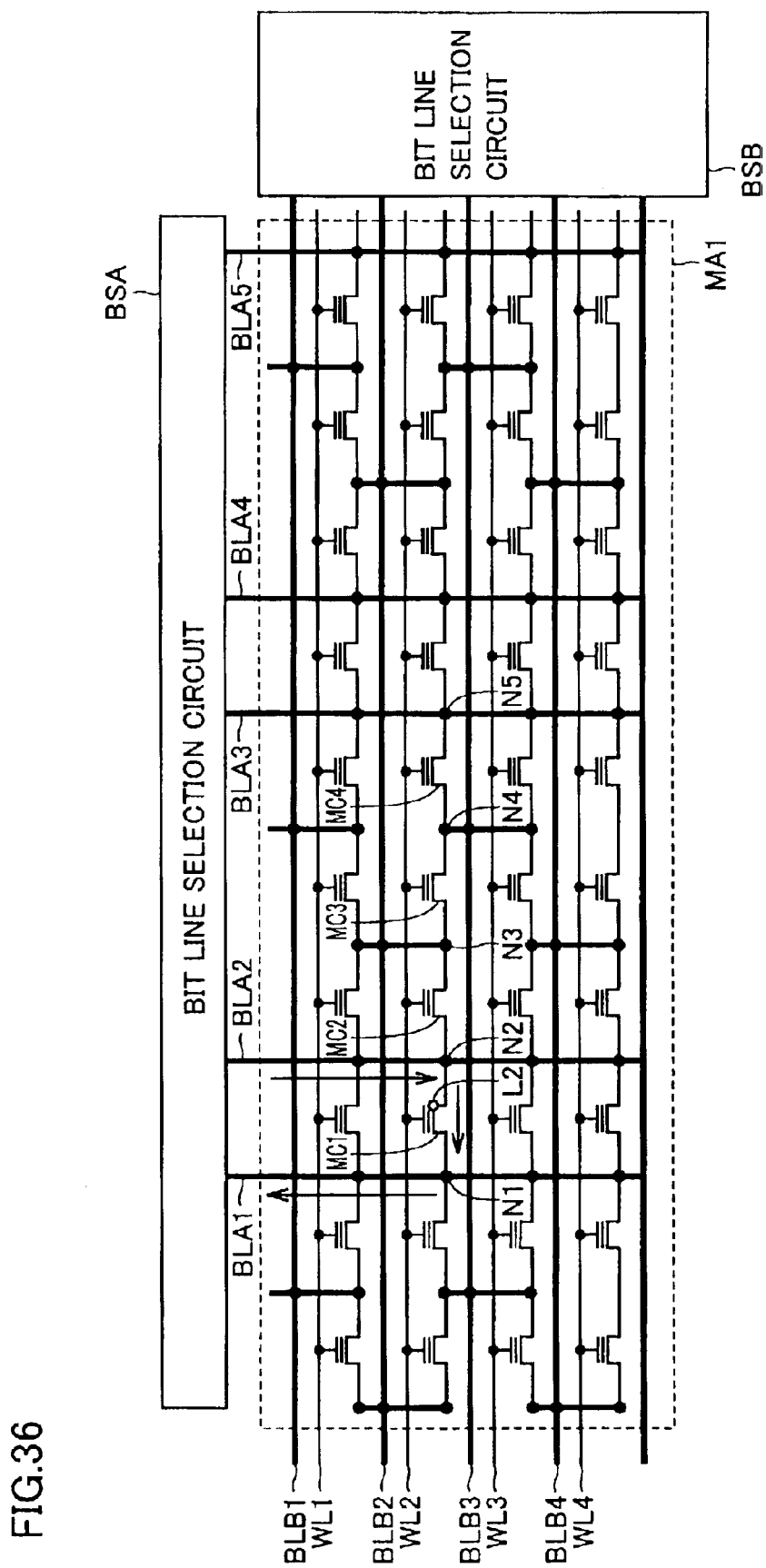
FIG. 36 is a circuit diagram for describing a programming operation to memory region L2 of memory cell MC1.

FIG. 36 is a diagram for describing a programming operation to memory region L2 of memory cell MC1.

With reference to FIG. 36, potentials of bit lines BLA2 and BLA1 are set so that the potential difference between the two bit lines becomes a programming voltage and a current flows from bit line BLA2 to bit line BLA1, in order to program in accordance with data to memory region L2 of memory cell MC1. The other bit lines are set to be in the floating condition. Then, word line WL2 is activated according to the above described conditions and current is made to flow through memory cell MC1, thereby a charge is trapped in memory region L2 so that data is written in.

Figure 37:
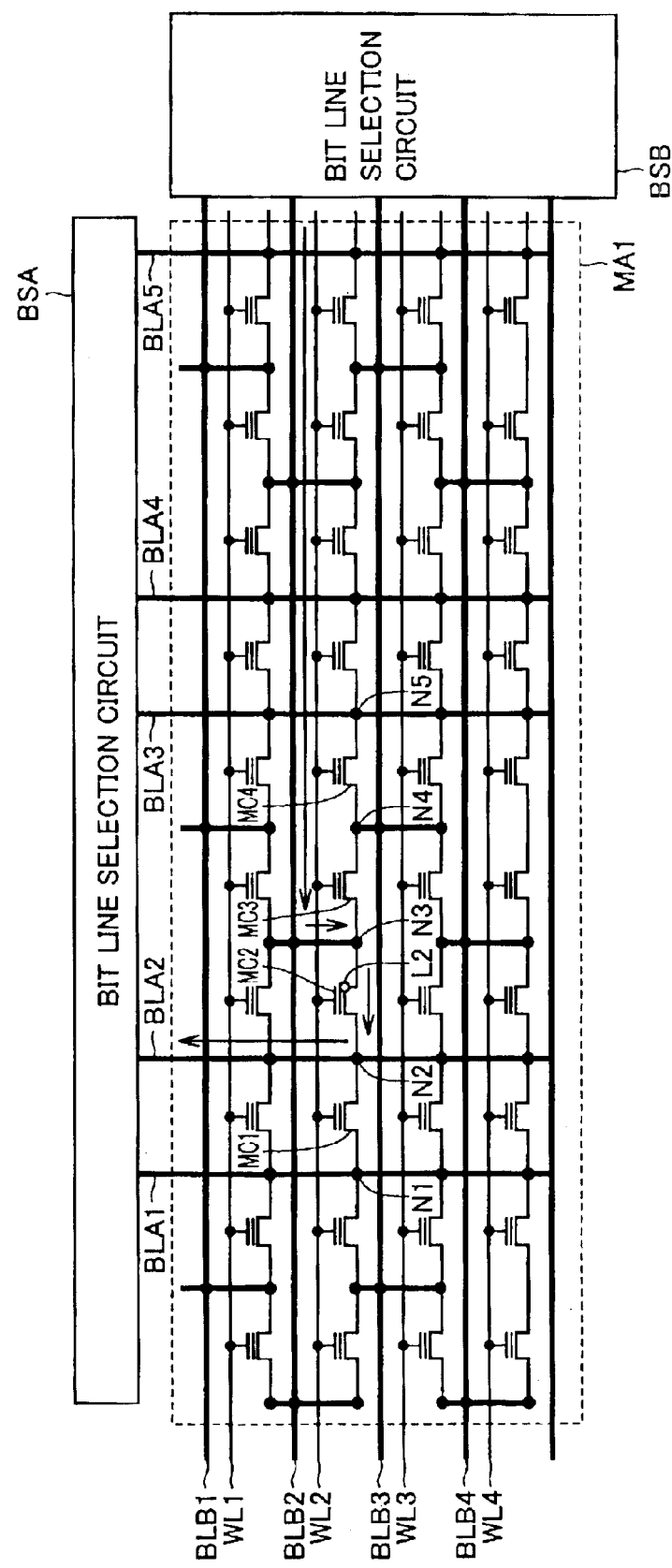
FIG. 37 is a diagram for describing a programming operation to memory cell region L2 of memory cell MC2.

FIG. 37 is a diagram for describing a programming operation to memory region L2 of memory cell MC2.

With reference to FIG. 37, potentials of bit lines BLB2 and BLA2 are set so that the potential difference between the two bit lines becomes a programming voltage and a current flows from bit line BLB2 to bit line BLA2, in order to program in accordance with data to memory region L2 of memory cell MC2. The other bit lines are set to be in the floating condition. Then, word line WL2 is activated according to the above described conditions and current is made to flow through memory cell MC2, thereby a charge is trapped in memory region L2 so that data is written in.

Figure 38:
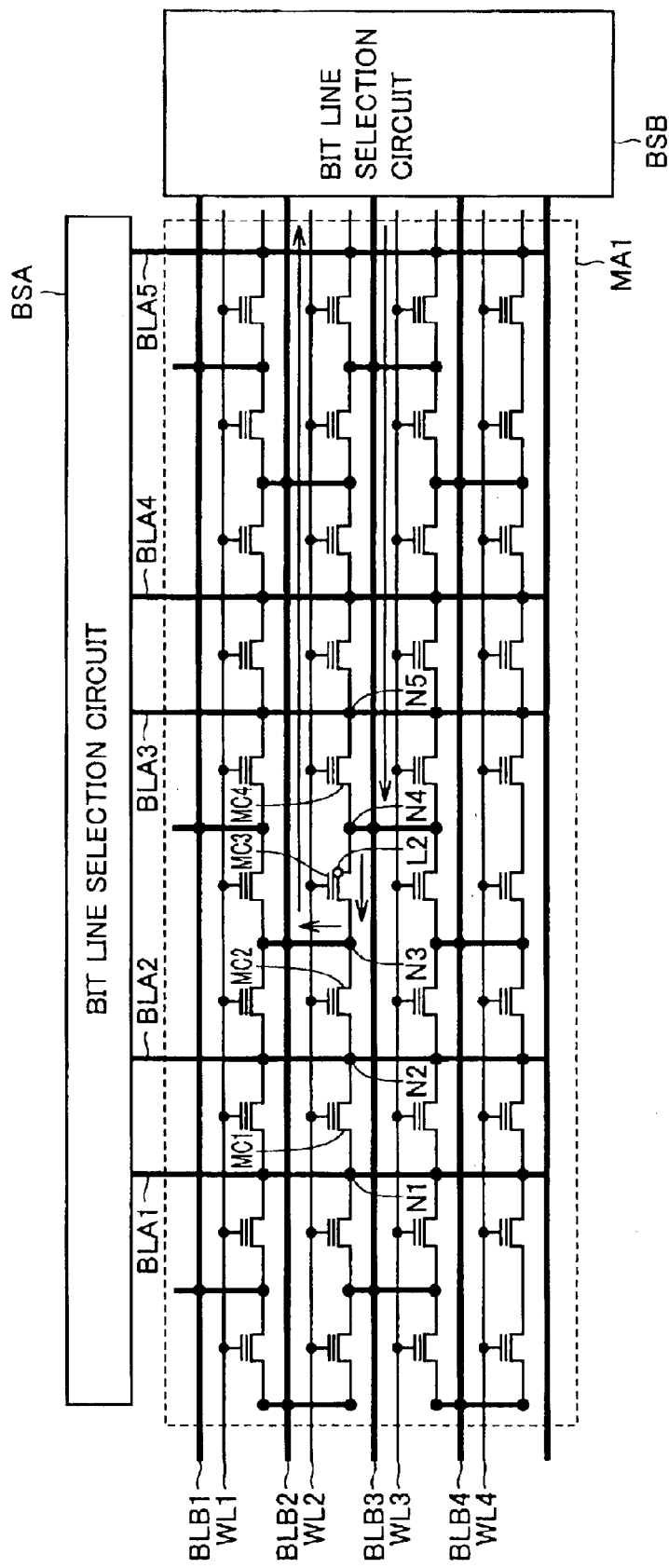
FIG. 38 is a diagram for describing a programming operation to memory cell region L2 of memory cell MC3.

FIG. 38 is a diagram for describing a programming operation to memory region L2 of memory cell MC3.

With reference to FIG. 38, potentials of bit lines BLB3 and BLB2 are set so that the potential difference between the two bit lines becomes a programming voltage and a current flows from bit line BLB3 to bit line BLB2, in order to program in accordance with data to memory region L2 of memory cell MC3. The other bit lines are set to be in the floating condition. Then, word line WL2 is activated according to the above described conditions and current is made to flow through memory cell MC3, thereby a charge is trapped in memory region L2 so that data is written in.

Figure 39:
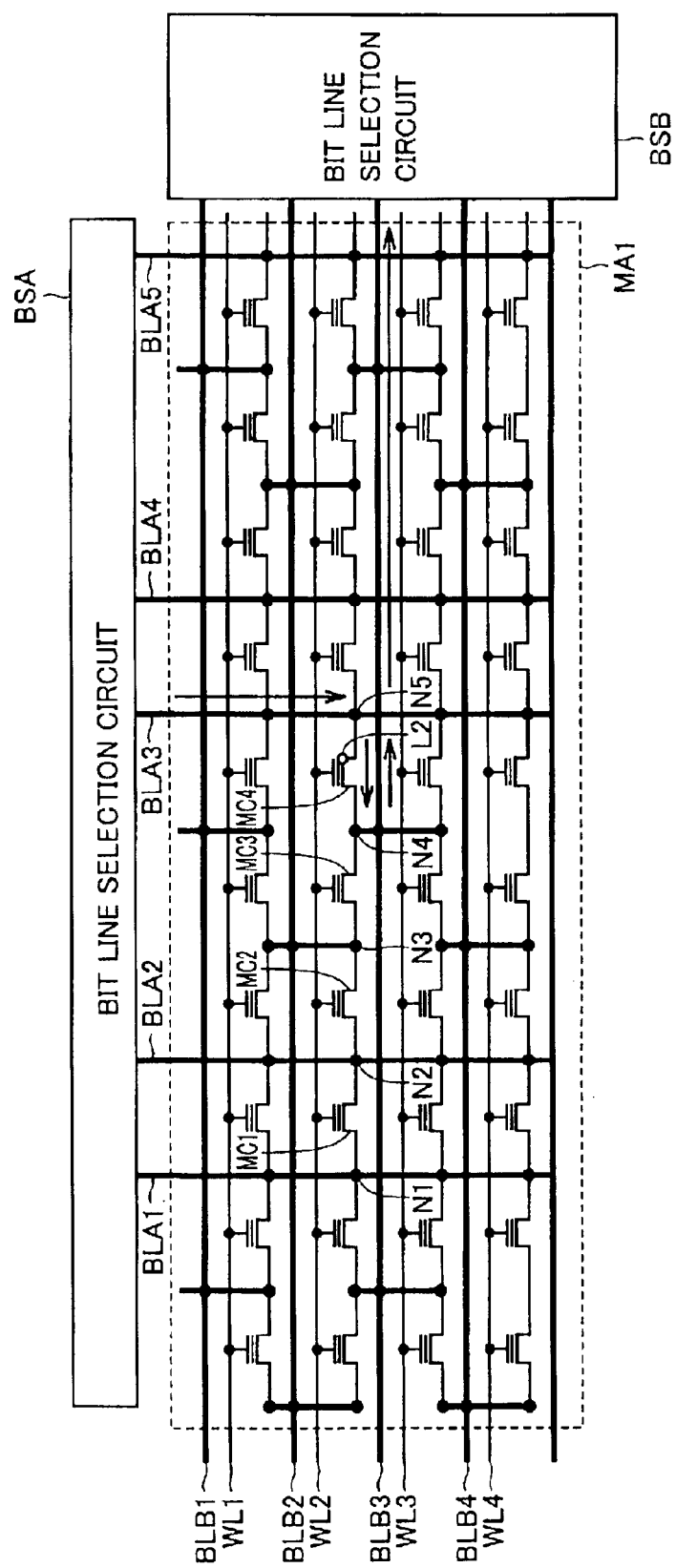
FIG. 39 is a diagram for describing a programming operation to memory cell region L2 of memory cell MC4.

FIG. 39 is a diagram for describing a programming operation to memory region L2 of memory cell MC4.

With reference to FIG. 39, potentials of bit lines BLA3 and BLB3 are set so that the potential difference between the two bit lines becomes a programming voltage and a current flows from bit line BLA3 to bit line BLB3, in order to program in accordance with data to memory region L2 of memory cell MC4. The other bit lines are set to be in the floating condition. Then, word line WL2 is activated according to the above described conditions and current is made to flow through memory cell MC4, thereby a charge is trapped in memory region L2 so that data is written in.

Figure 40:
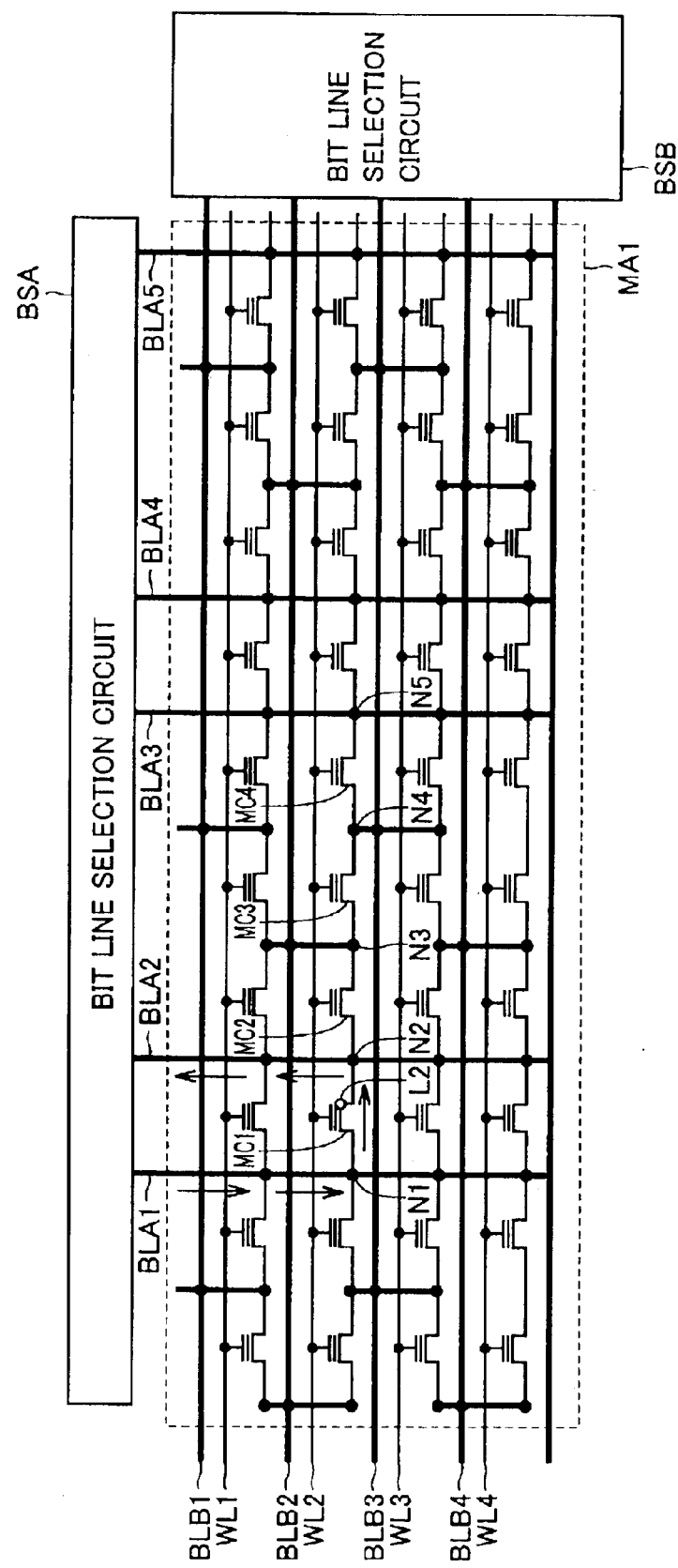
FIG. 40 is a diagram for describing a reading operation from memory region L2 of memory cell MC1.

FIG. 40 is a diagram for describing a reading operation from memory region L2 of memory cell MC1.

With reference to FIG. 40, potentials of bit lines BLA1 and BLA2 are set so that a current flows from bit line BLA1 to bit line BLA2, and the other bit lines are set to be in the floating condition, in order to read data from memory region L2 of memory cell MC1. Then, word line WL2 is activated according to the above described conditions in order to check whether or not current flows through memory cell MC1, thereby it can be detected whether or not data has been written in to memory region L2. The direction in which the current flows becomes opposite to that at the time of programming described in FIG. 36.

Figure 41:
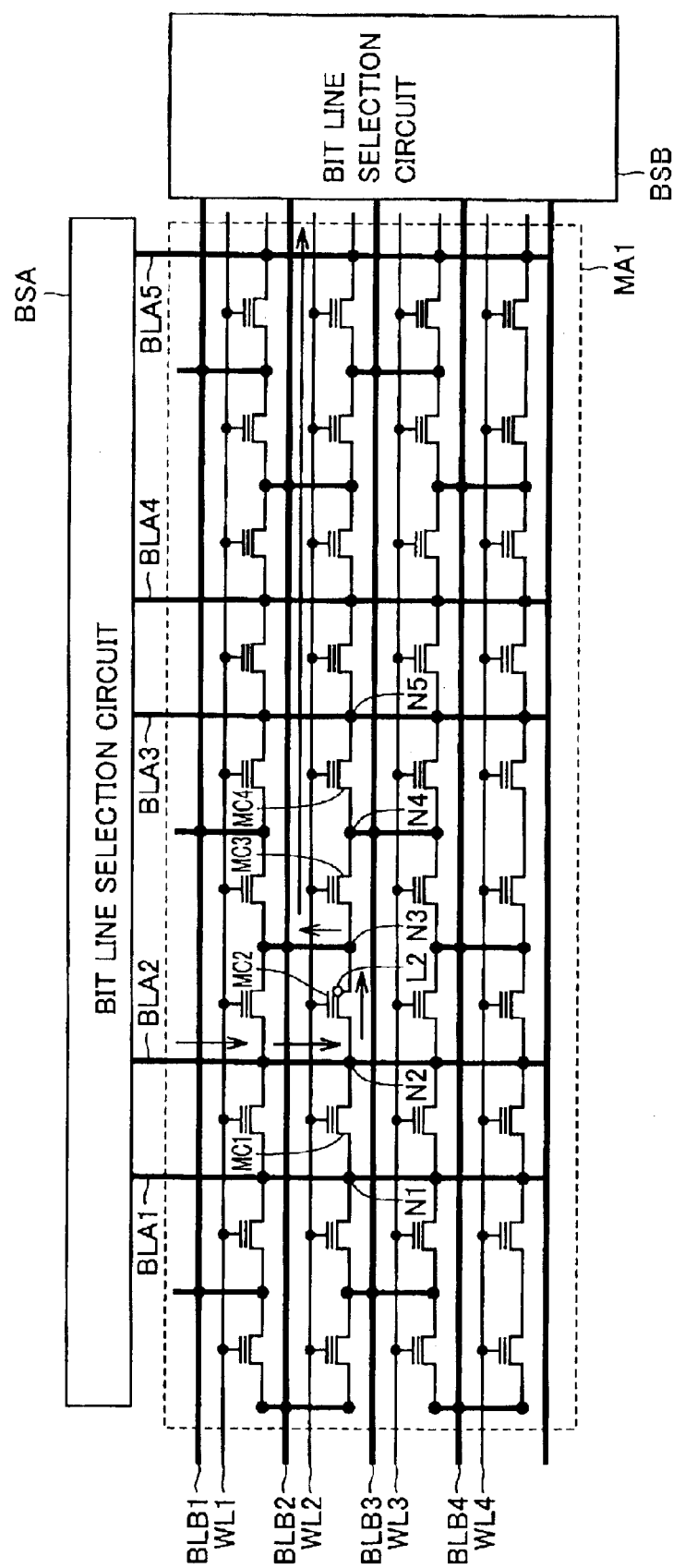
FIG. 41 is a diagram for describing a reading operation from memory region L2 of memory cell MC2.

FIG. 41 is a diagram for describing a reading operation from memory region L2 of memory cell MC2.

With reference to FIG. 41, potentials of bit lines BLA2 and BLB2 are set so that a current flows from bit line BLA2 to bit line BLB2, and the other bit lines are set to be in the floating condition, in order to read data from memory region L2 of memory cell MC2. Then, word line WL2 is activated according to the above described conditions in order to check whether or not current flows through memory cell MC2, thereby it can be detected whether or not data has been written in to memory region L2. The direction in which the current flows becomes opposite to that at the time of programming described in FIG. 37.

Figure 42:
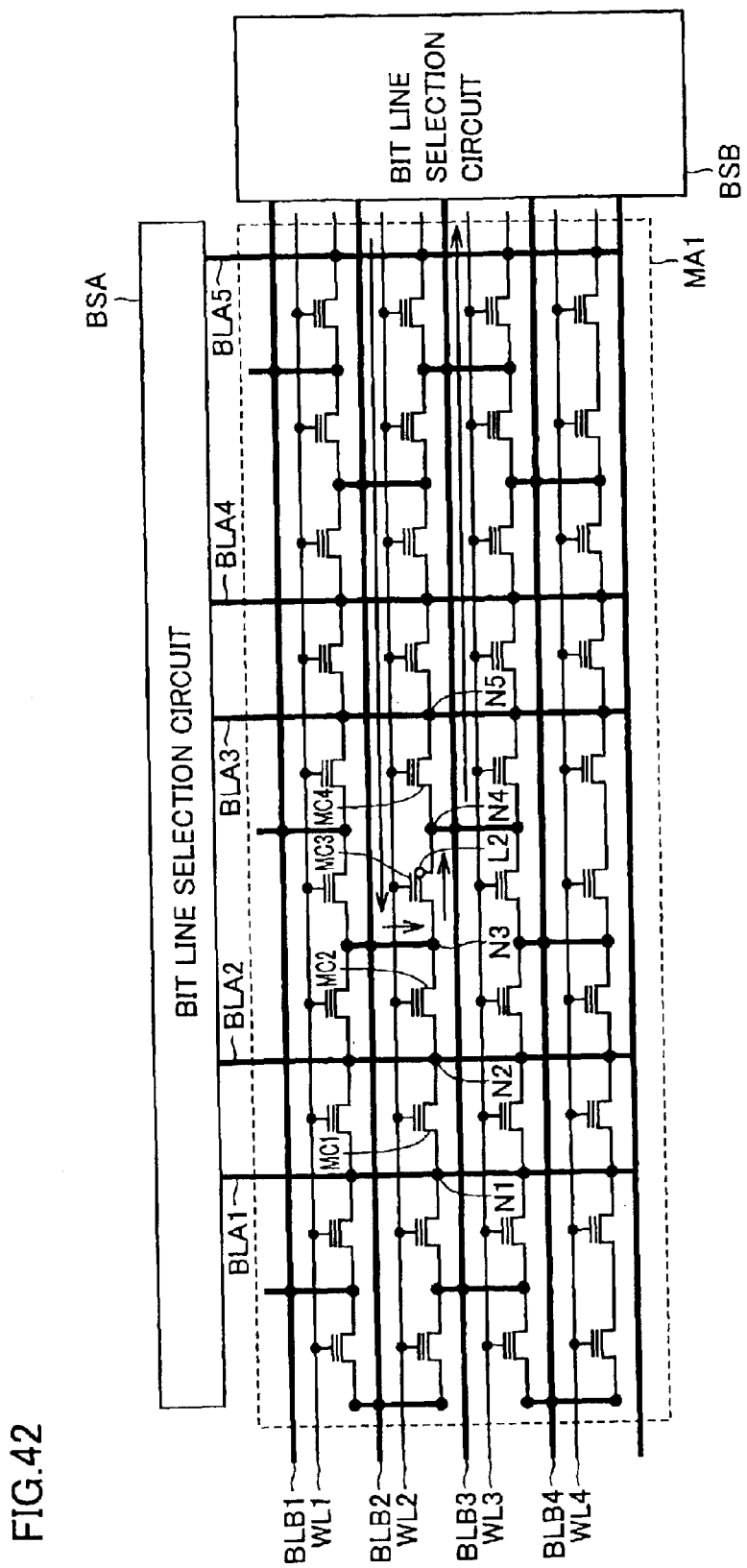
FIG. 42 is a diagram for describing a reading operation from memory region L2 of memory cell MC3.

FIG. 42 is a diagram for describing a reading operation from memory region L2 of memory cell MC3.

With reference to FIG. 42, potentials of bit lines BLB2 and BLB3 are set so that a current flows from bit line BLB2 to bit line BLB3, and the other bit lines are set to be in the floating condition, in order to read data from memory region L2 of memory cell MC3. Then, word line WL2 is activated according to the above described conditions in order to check whether or not current flows through memory cell MC3, thereby it can be detected whether or not data has been written in to memory region L2. The direction in which the current flows becomes opposite to that at the time of programming described in FIG. 38.

Figure 43:
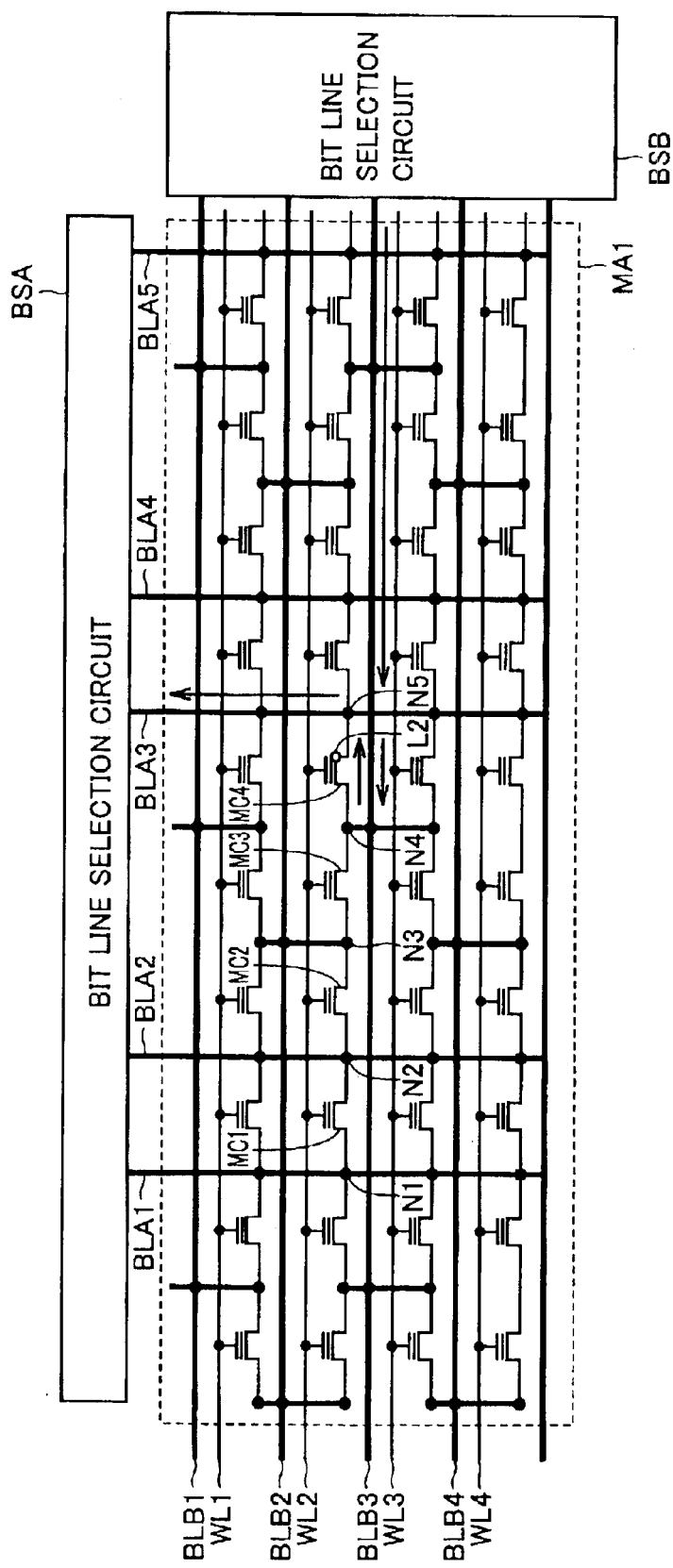
FIG. 43 is a diagram for describing a reading operation from memory region L2 of memory cell MC4.

FIG. 43 is a diagram for describing a reading operation from memory region L2 of memory cell MC4.

With reference to FIG. 43, potentials of bit lines BLB3 and BLA3 are set so that a current flows from bit line BLB3 to bit line BLA3, and the other bit lines are set to be in the floating condition, in order to read data from memory region L2 of memory cell MC4. Then, word line WL2 is activated according to the above described conditions in order to check whether or not current flows through memory cell MC4, thereby it can be detected whether or not data has been written in to memory region L2. The direction in which the current flows becomes opposite to that at the time of programming described in FIG. 39.

Figure 44:
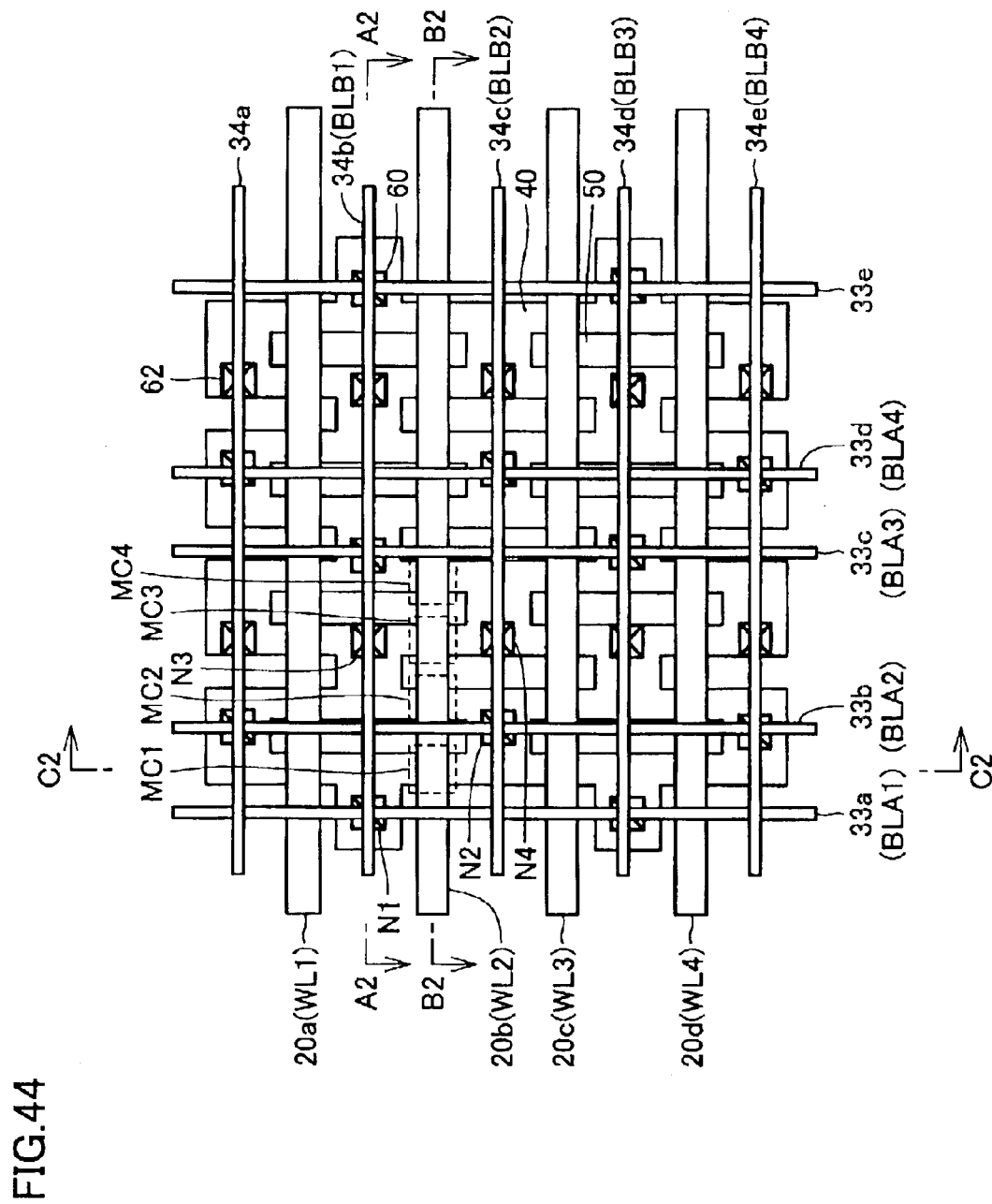
FIG. 44 is a plan view showing a layout of memory cell array MA1 according to the second embodiment.

FIG. 44 is a plan view showing a layout of memory cell array MA1 according to the second embodiment.

In FIG. 44 the arrangements of element isolation regions 50, n-type impurity regions 40 and word lines 20a to 20d are the same as in the case shown in FIG. 2 and, therefore, descriptions thereof will not be repeated.

Word lines 20a to 20d, respectively, correspond to word lines WL1 to WL4 in FIG. 28.

Bit lines 33a to 33e are provided in the direction perpendicular to word lines 20a to 20d. Bit lines 33a to 33d, respectively, correspond to bit lines BLA1 to BLA4 in FIG. 28. Bit lines 33a to 33d are connected to n-type impurity regions 40 located in the lower layer of the bit lines by means of contact holes 60. Bit lines 34a to 34e are provided above bit lines 33a to 33e parallel to word lines 20a to 20d. Bit lines 34b to 34e, respectively, correspond to bit lines BLB1 to BLB4 of FIG. 28. Here, the bit lines in the first layer are arranged in the direction perpendicular to the word lines in FIG. 44. Then, the bit lines in the second layer are arranged in the direction parallel to the word lines. Here, the reverse of this relationship is possible. That is to say, bit lines 34a to 34e may be formed from the first metal wiring layer and bit lines 33a to 33e may be formed the second metal wiring layer.

Then, the positions of the contact holes connected to the n-type impurity regions are shifted from the positions of the contacts connected to the bit lines in the second layer so that the two columns of contact holes connected to the bit lines in the second layer are realigned into one column. Thereby, the number of columns of metal wires in the first layer is reduced by one for every four so that the pitch of the bit lines can be widened.

Figure 45:
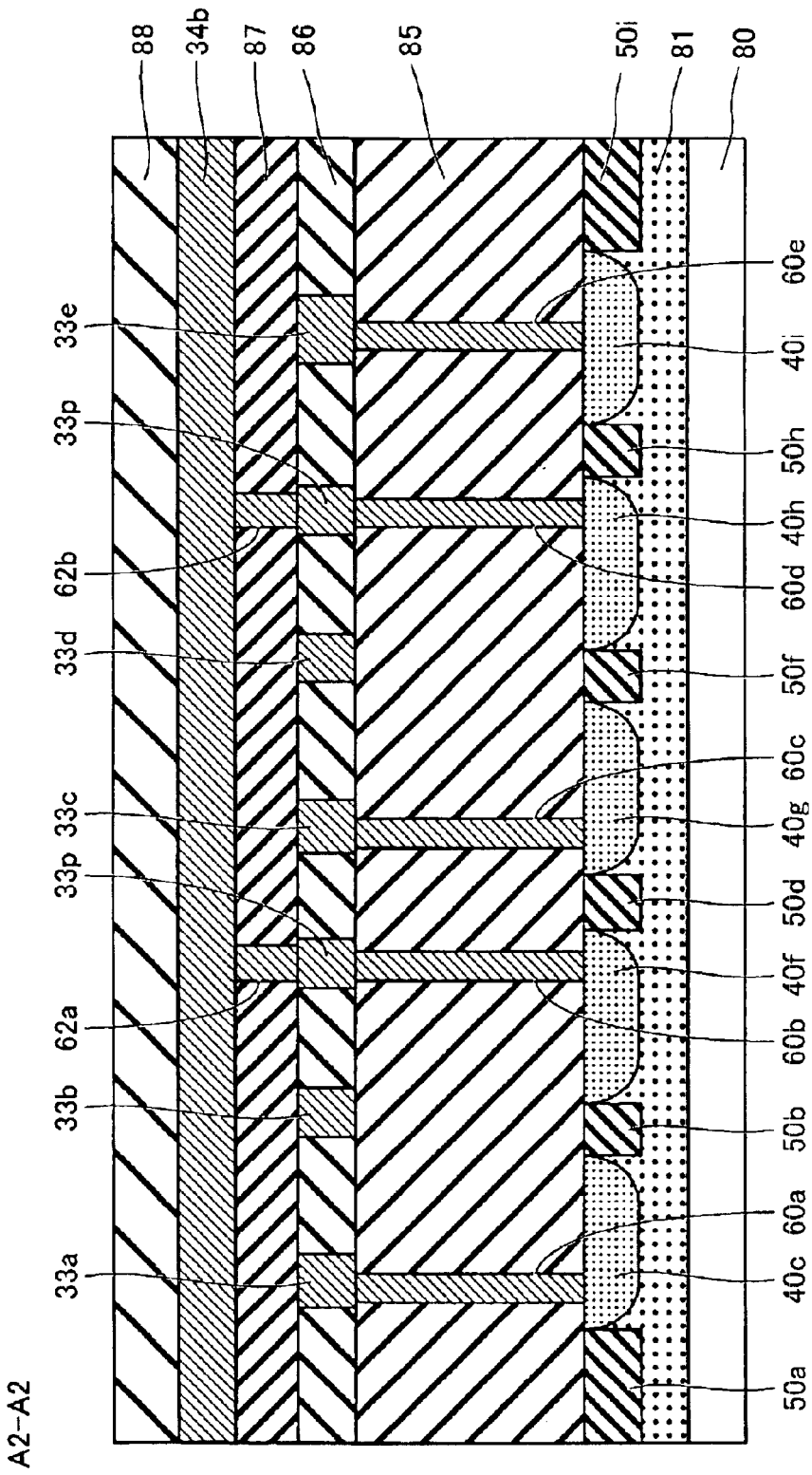
FIG. 45 is a cross sectional view taken along line A2—A2 of FIG. 44.

FIG. 45 is a cross sectional view taken along line A2—A2 of FIG. 44. The cross section taken along line A2—A2 is the cross section through bit line 34b in the direction along the word lines.

With reference to FIG. 45, semiconductor substrate 80, p well 81, element isolation regions 50a to 50i and n-type impurity regions 40c to 40i are the same as in the case described in FIG. 3 and, therefore, descriptions thereof will not be repeated.

Furthermore, in the case of FIG. 45, the positions of contact holes 60b and 60d provided in interlayer insulating film 85 are shifted, unlike in the case of FIG. 3. That is to say, contact hole 60b is provided close to element isolation region 50d, rather than in the center of the region above n-type impurity region 40f. In the same manner contact hole 60d is provided close to element isolation region 50h, rather than in the center of the region above n-type impurity region 40h.

Bit lines 33a to 33e are provided on top of interlayer insulating film 85. In addition, plugs 33p for connection to the second layer of wires are also formed. In addition, interlayer insulating film 86 is formed between these bit lines and the plugs. Furthermore, interlayer insulating film 87 is formed over interlayer insulating film 86 and bit lines 33a to 33e, and contact holes 62a and 62b are provided in portions of interlayer insulating film 87.

Then, bit line 34b is formed from the second metal wiring layer. Finally, insulating film 88 for passivation is formed.

Figure 46:
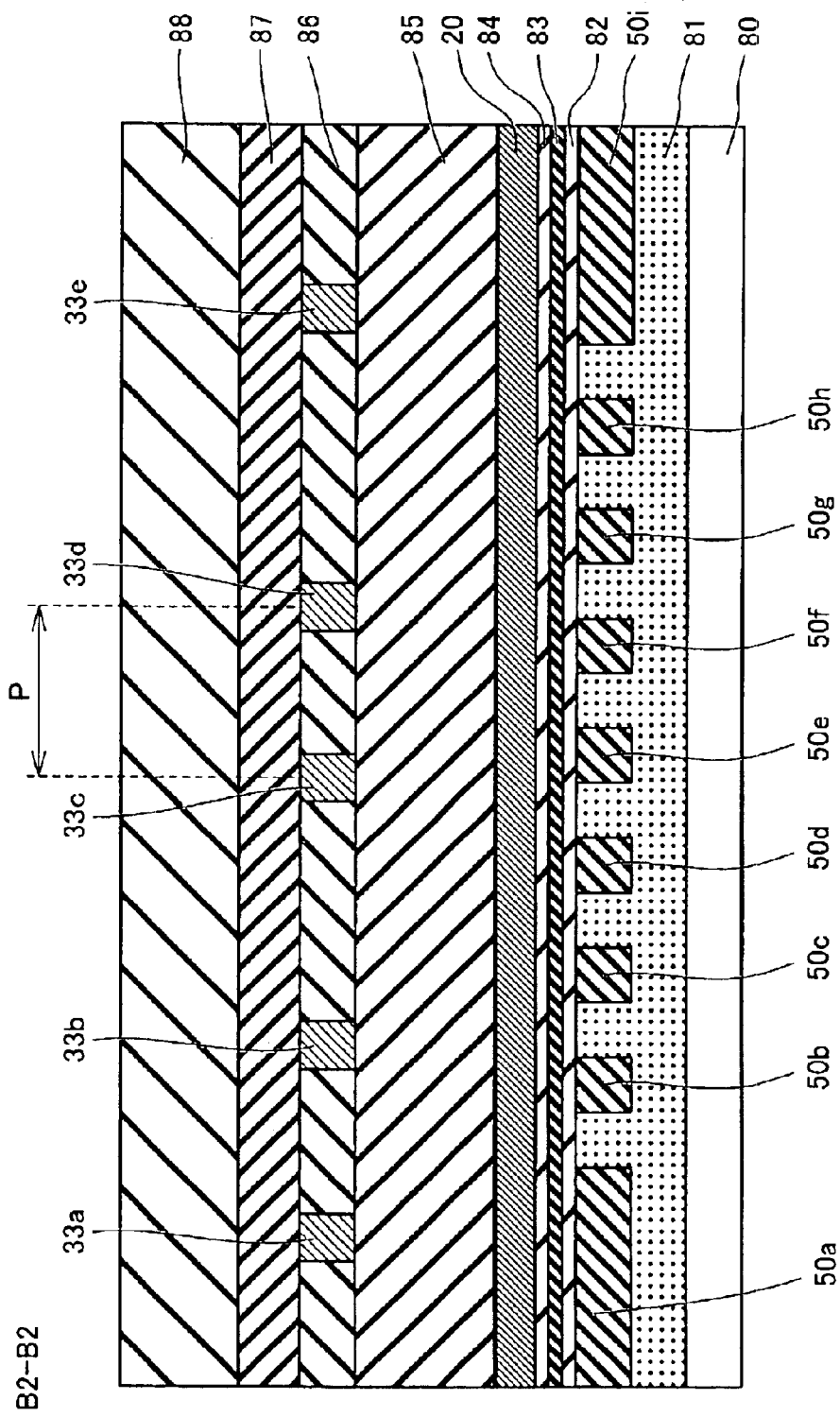
FIG. 46 is a cross sectional view taken along line B2—B2 of FIG. 44.

FIG. 46 is a cross sectional view taken along line B2—B2 of FIG. 44. The cross section taken along line B2—B2 is the cross section through word line 20b in the direction along the word lines.

With reference to FIG. 46, semiconductor substrate 80, p well 81, element isolation regions 50a to 50i, silicon oxide film 82, nitride film 83, silicon oxide film 84, word line 20 and interlayer insulating film 85 are the same as in the case described in FIG. 4 and, therefore, descriptions thereof will not be repeated.

Bit lines 33a to 33e are formed on top of interlayer insulating film 85 and interlayer insulating film 86 is formed between these bit lines. Interlayer insulating film 87 is formed over these bit lines and interlayer insulating film 86, and insulating film 88 is formed on top of interlayer insulating film 87 as a passivation film. Since the bit lines are divided into the first layer and the second layer, pitch P between the bit lines is greater than in the case of FIG. 4. Thereby, the occurrence of short circuiting between bit lines, which causes defects, is reduced.

Figure 47:
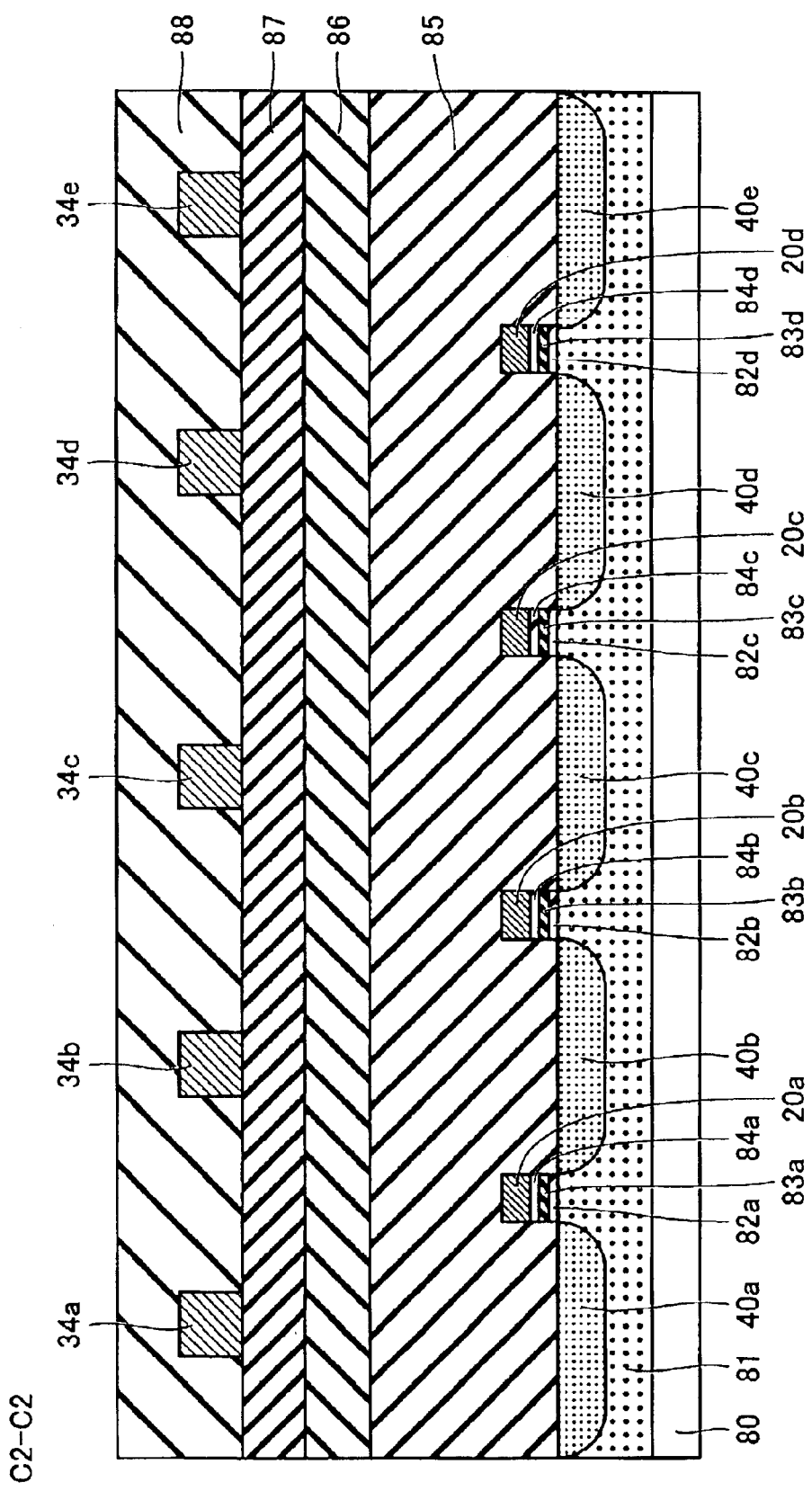
FIG. 47 is a cross sectional view taken along line C2—C2 of FIG. 44.

FIG. 47 is a cross sectional view taken along line C2—C2 of FIG. 44. The cross section taken along line C2—C2 is the cross section between bit lines 33a and 33b in the direction along the bit lines.

With reference to FIG. 47, semiconductor substrate 80, p well 81, n-type impurity regions 40a to 40e, silicon oxide films 82a to 82d and 84a to 84d, nitride films 83a to 83d and interlayer insulating film 85 are the same as in the case described in FIG. 5 and, therefore, descriptions thereof will not be repeated.

Interlayer insulating film 86 is formed on top of interlayer insulating film 85 and, furthermore, interlayer insulating film 87 is formed on top of interlayer insulating film 86. Bit lines 34a to 34e are formed on top of interlayer insulating film 87 from the second wiring layer. Then, insulating film 88 is formed over bit line 34a to 34e as a passivation film.

Here, the manufacturing process of this embodiment is the same as the manufacturing process described in the first embodiment and, therefore, descriptions thereof will not be repeated.

As described above, the bit lines are divided into two metal wiring layers, thereby the pitch of the bit lines is widened in each of the wiring layers. The bit lines perpendicular to the word lines are formed using the first metal wiring layer and the bit lines parallel to the word lines are formed using the second metal wiring layer. Thereby, it becomes possible to reduce the occurrence of wire breakage and short circuiting of bit lines, which are the cause of defects, even in the case of an increase in integration.

Third Embodiment

Figure 48:
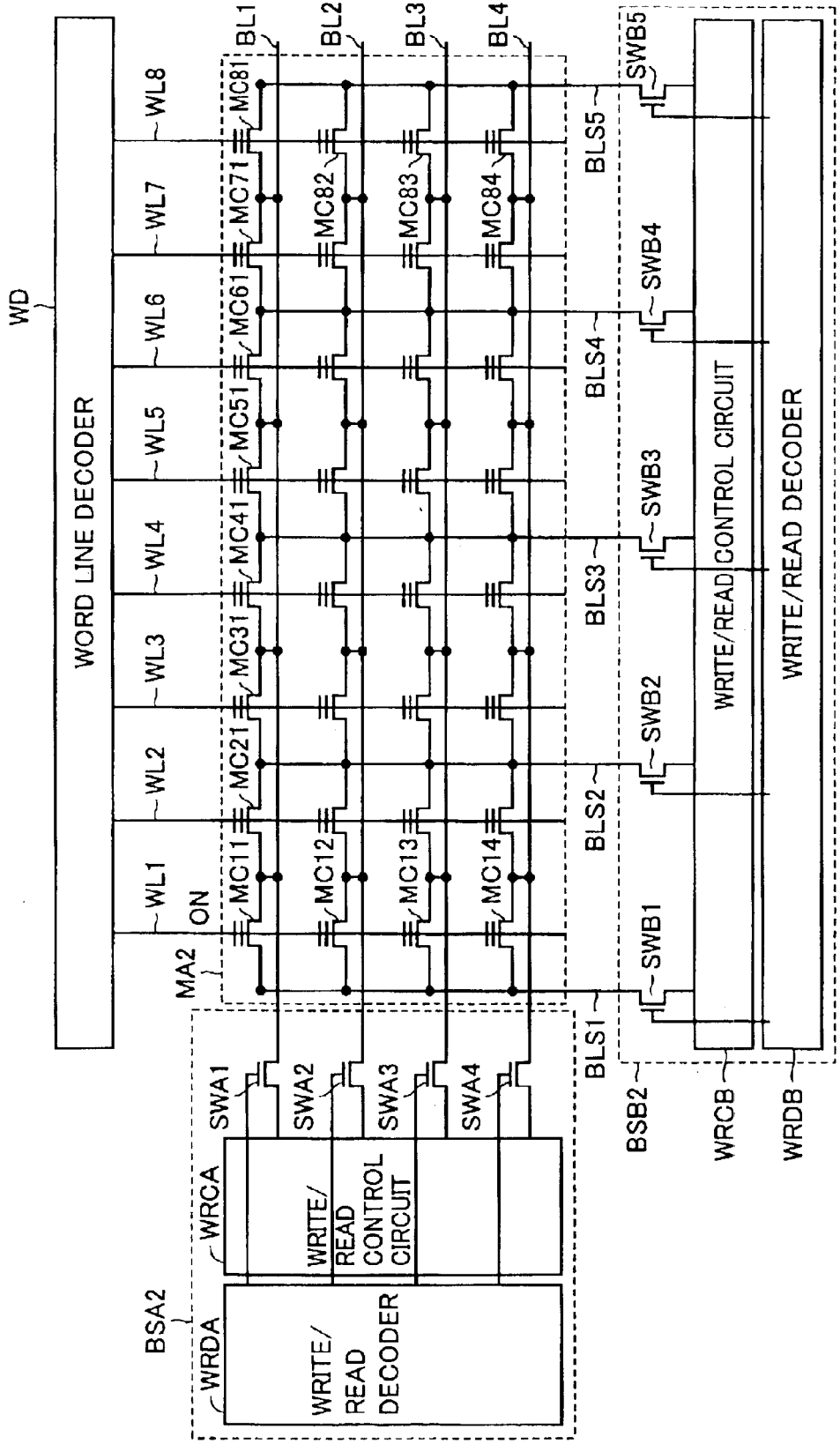
FIG. 48 is a circuit diagram showing a configuration of memory cell array MA2 and its peripheral circuit used in a third embodiment.

FIG. 48 is a circuit diagram showing the configurations of memory cell array MA2 and its periphery circuits used in a third embodiment.

With reference to FIG. 48, memory cell array MA2 is a virtual ground-type memory cell array employing MONOS structure transistor-type memory cells. Memory cell array MA2 includes memory cells MC11 to MC84 aligned in a matrix form.

Memory cells MC11 to MC81 are connected in series and word lines WL1 to WL8 are connected to the respective gates. Every other of the connection nodes of memory cells MC11 to MC81 is connected to bit line BL1. That is to say, the connection node for memory cell MC11 and memory cell MC21, the connection node for memory cell MC31 and memory cell MC41, the connection node for memory cell MC51 and memory cell MC61 and the connection node for memory cell MC71 and memory cell MC81 are connected to bit line BL1. Then, the other connection nodes, respectively, are connected to bit lines BLS1 to BLS5 provided parallel to the word lines.

Memory cells MC12 to MC82 are connected in series and word lines WL1 to WL8 are connected to the respective gates. Every other of the connection nodes of memory cells MC12 to MC82 is connected to bit line BL2. Then, the other connection nodes, respectively, are connected to bit lines BLS1 to BLS5 provided parallel to the word lines.

Memory cells MC13 to MC83 are connected in series and word lines WL1 to WL8 are connected to the respective gates. Every other of the connection nodes of memory cells MC13 to MC83 is connected to bit line BL3. Then, the other connection nodes, respectively, are connected to bit lines BLS1 to BLS5 provided parallel to the word lines.

Memory cells MC14 to MC84 are connected in series and word lines WL1 to WL8 are connected to the respective gates. Every other of the connection nodes of memory cells MC14 to MC84 is connected to bit line BL4. Then, the other connection nodes, respectively, are connected to bit lines BLS1 to BLS5 provided parallel to the word lines.

A word line decoder WD for selectively activating word lines WL1 to WL8 is provided. In addition, a bit line selection circuit BSA2 for selecting bit lines BL1 to BL4 and a bit line selection circuit BSB2 for selecting bit lines BLS1 to BLS5 are provided.

Bit line selection circuit BSA2 includes switching circuits SWA1 to SWA4, respectively, provided corresponding to bit lines BL1 to BL4, a write/read decoder WRDA for selectively allowing switching circuits SWA1 to SWA4 to be in a conductive state and a write/read control circuit WRCA for supplying a potential to bit lines BL1 to BL4 through switching circuits SWA1 to SWA4.

Bit line selection circuit BSB2 includes switching circuits SWB1 to SWB5, respectively, provided corresponding to bit lines BLS1 to BLS5, a write/read decoder WRDB for selectively allowing switching circuits SWB1 to SWB5 to be in a conductive state and a write/read control circuit WRCB for supplying a potential to bit lines BLS1 to BLS5 through switching circuits SWB1 to SWB5.

Here, memory cell array MA2 corresponds to a memory cell array of a NOR-type flash memory wherein switching circuits are provided to the source lines so that different potentials can be supplied to the source lines. That is to say, if bit lines BLS1 to BLS5 in FIG. 48 are connected to one node, to which the ground potential is supplied, so that this is used as a source line, a NOR-type memory cell array is obtained. In an NROM wherein two bits are stored in one memory cell, it is necessary to allow current to flow in two directions through the memory cells and, therefore, a NOR-type memory cell array cannot be used without change as memory cell array MA2.

Figure 49:
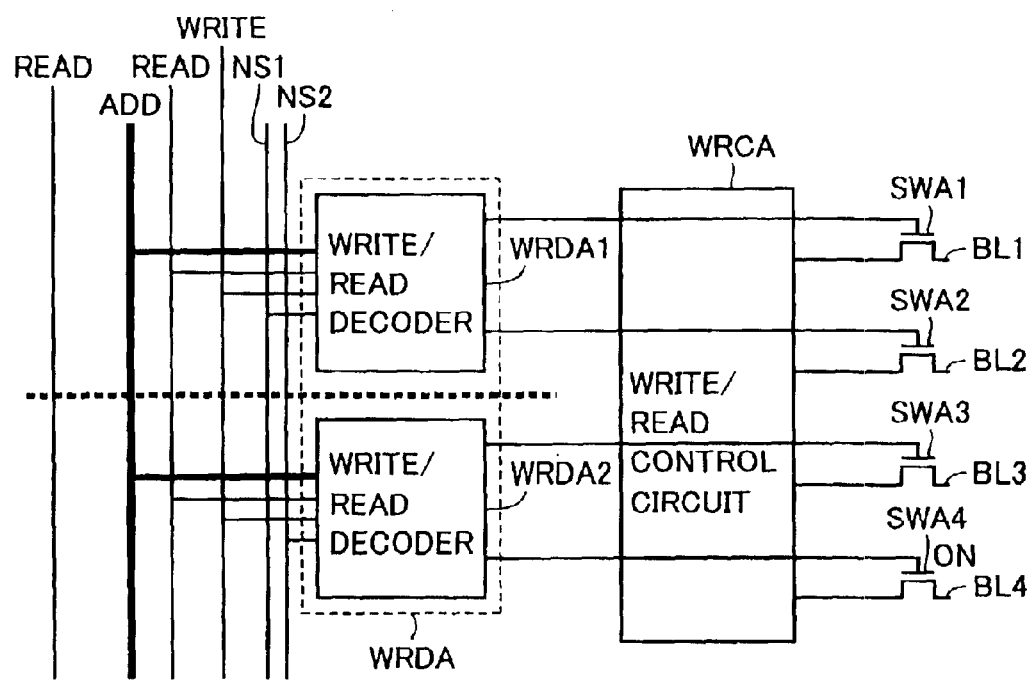
FIG. 49 is a diagram for describing the configuration and the operation of write/read decoder WRDA in FIG. 48.

FIG. 49 is a diagram for describing the configuration and the operation of write/read decoder WRDA of FIG. 48.

With reference to FIG. 49, write/read decoder WRDA includes write/read decoders WRDA1 and WRDA2, which are divided into groups of memory cell units that are accessed at the same time. Control signals READ, WRITE, NS1 and NS2 are used for selection control of write/read decoders WRDA1 and WRDA2. Control signal READ is a flag signal indicating reading. Control signal WRITE is a flag signal indicating programming. Control signals NS1 and NS2 are signals for maintaining threshold values in the erased condition. That is to say, NS1 and NS2, respectively, are provided corresponding to write/read decoders WRDA1 and WRDA2 so that, according to the activation of these signals, the bit line switch maintains the off condition with respect to the accessed memory cell at the time of programming. That is to say, the bit lines are converted to the floating condition.

Concretely, write/read decoder WRDA1 sets switching circuits SWA1 and SWA2 at the off condition regardless of the presence of address signal ADD when control signal NS1 is activated at the time that control signal WRITE is activated. Thereby, bit lines BL1 and BL2 are converted to the floating condition.

In addition, write/read decoder WRDA2 sets switching circuits SWA3 and SWA4 at the off condition regardless of the presence of address signal ADD when control signal NS2 is activated at the time that control signal WRITE is activated. Thereby, bit lines BL3 and BL4 are converted to the floating condition.

Here, in the case that control signal READ is activated, the write/read decoders carry out the operation of selection of the switching circuits in accordance with address signal ADD regardless of the presence of control signals NS1 and NS2.

Figure 50:
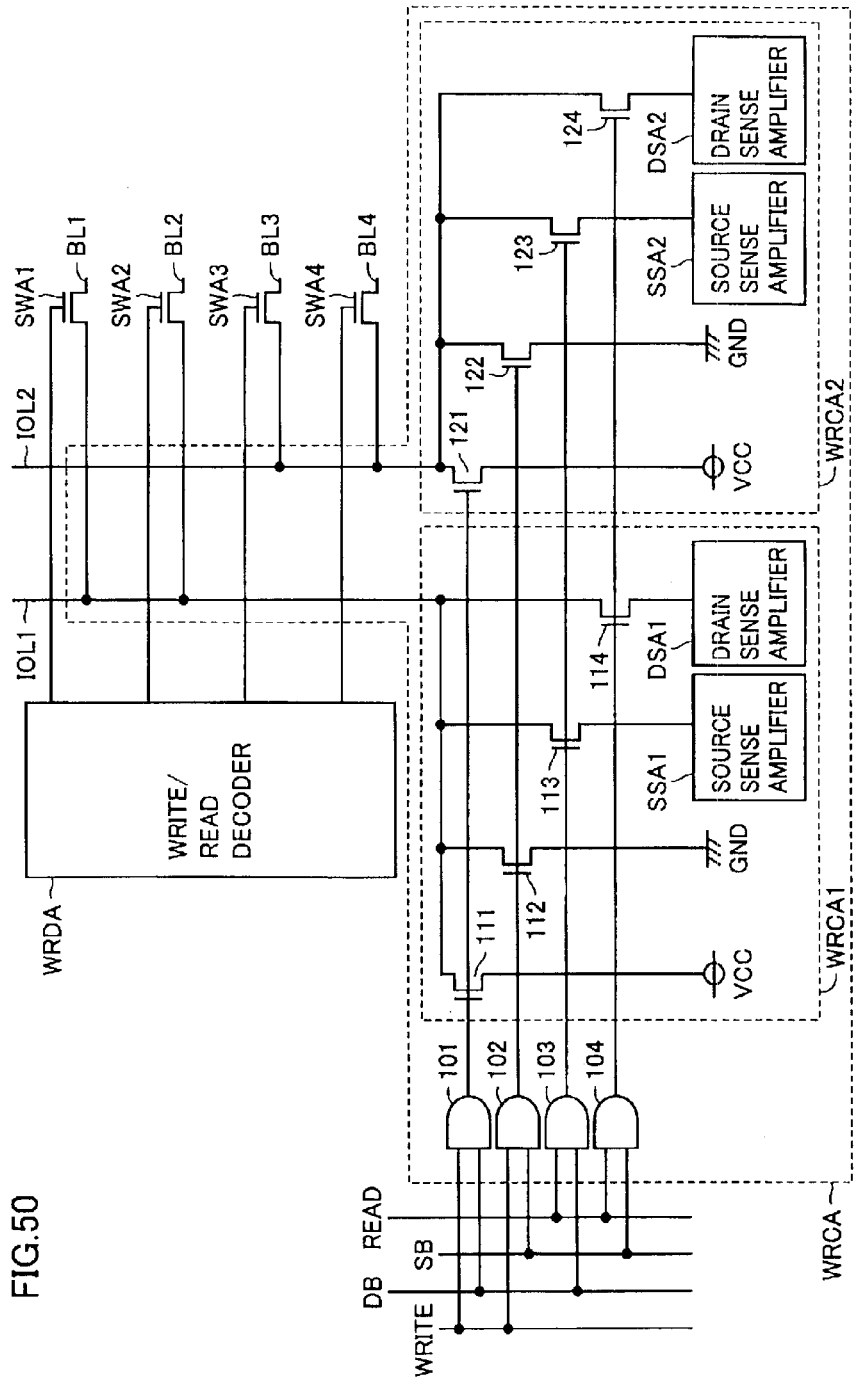
FIG. 50 is a diagram for describing the configuration and the operation of write/read control circuit WRCA.

FIG. 50 is a diagram for describing the configuration and the operation of write/read control circuit WRCA.

With reference to FIG. 50, write/read control circuit WRCA includes AND circuits 101 to 104 for decoding control signals WRITE, READ, DB and SB, control circuit WRCA1 for supplying a potential to IO line IOL1, provided corresponding to bit lines BL1 and BL2, in accordance with the outputs of AND circuits 101 to 104 and control circuit WRCA2 for supplying a potential to IO line IOL2, corresponding to bit lines BL3 and BL4.

AND circuit 101 receives controls signals WRITE and DB as inputs. AND circuit 102 receives controls signals WRITE and SB as inputs. AND circuit 103 receives controls signals READ and DB as inputs. AND circuit 104 receives controls signals READ and SB as inputs.

Control signal DB indicates that a region, from among the memory regions of a memory cell, which is desired to be accessed is on the side connected to bit lines BL1 to BL4. Control signal SB is a signal indicating that a memory region of a memory cell which is desired to be accessed is on the side connected to bit lines BLS1 to BLS5. Bit lines BLS1 to BLS5 are bit lines analogous to source lines in a NOR-type memory cell array.

Control circuit WRCA1 includes a switching circuit 111 for supplying power supply potential VCC or the programming/reading potential on the high potential side to IO line IOLL in accordance with the output of AND circuit 101, and a switching circuit 112, which becomes of a conductive condition in accordance with the output of AND circuit 102, for supplying ground potential GND or the programming/reading potential on the low potential side to IO line IOL1.

Control circuit WRCA1 further includes a source sense amplifier SSA1, a switching circuit 113, which becomes of a conductive condition in accordance with the output of AND circuit 103, provided between source sense amplifier SSA1 and IO line IOL1, a drain sense amplifier DSA1 and a switching circuit 114, which becomes of a conductive condition in accordance with the output of AND circuit 104, provided between drain sense amplifier DSA1 and IO line IOL1.

The source sense amplifier is a sense amplifier connected to the source side of the memory cells, and is used for the detection of a current flowing therein. In addition, the drain sense amplifier is a sense amplifier connected to the drain side of the memory cells, and is used for the detection of a current flowing out therefrom.

Control circuit WRCA2 includes a switching circuit 121 for supplying power supply potential VCC or the programming/reading potential on the high potential side to IO line IOL2 in accordance with the output of AND circuit 101, and a switching circuit 122, which becomes of a conductive condition in accordance with the output of AND circuit 102, for supplying ground potential GND or the programming/reading potential on the low potential side to IO line IOL2.

Control circuit WRCA2 further includes a source sense amplifier SSA2, a switching circuit 123, which becomes of a conductive condition in accordance with the output of AND circuit 103, provided between source sense amplifier SSA2 and IO line IOL1, a drain sense amplifier DSA2 and a switching circuit 124, which becomes of a conductive condition in accordance with the output of AND circuit 104, provided between drain sense amplifier DSA2 and IO line IOL2.

Write/read control circuit WRCA is formed in such a manner so that the same source sense amplifiers and the same drain sense amplifiers can be used for sensing the current through all of the bit lines via IO lines IOL1 and IOL2 and, therefore, the area can be kept to a small size.

Figure 51:
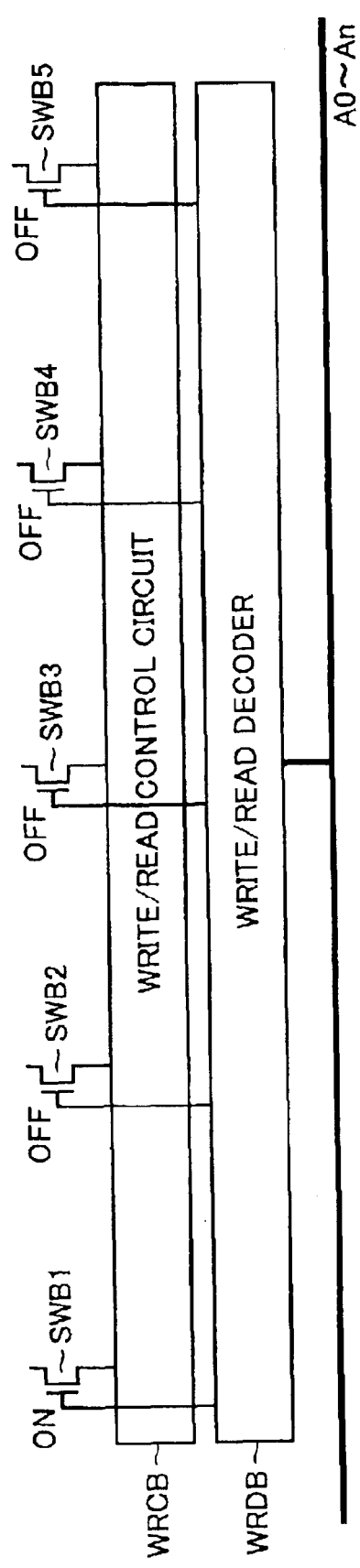
FIG. 51 is a diagram for describing the operation of write/read decoder WRDA in FIG. 48.

FIG. 51 is a diagram for describing the operation of write/read decoder WRDB of FIG. 48.

With reference to FIG. 51, write/read decoder WRDB decodes and selects address signals A0 to An so as to selectively convert any one of switching circuits SWB1 to SWB5 to the conductive condition. This decoding operation is simple and it is possible to do this at the same time that the conventional word line decoder is performing output.

In the case that word line WL1 in FIG. 48 is activated so that, for example, memory cells MC11 to MC14 are selected, switching circuit SWB1 is set in the conductive condition and the other switching circuits SWB2 to SWB5 are set in the non-conductive condition.

Figure 52:
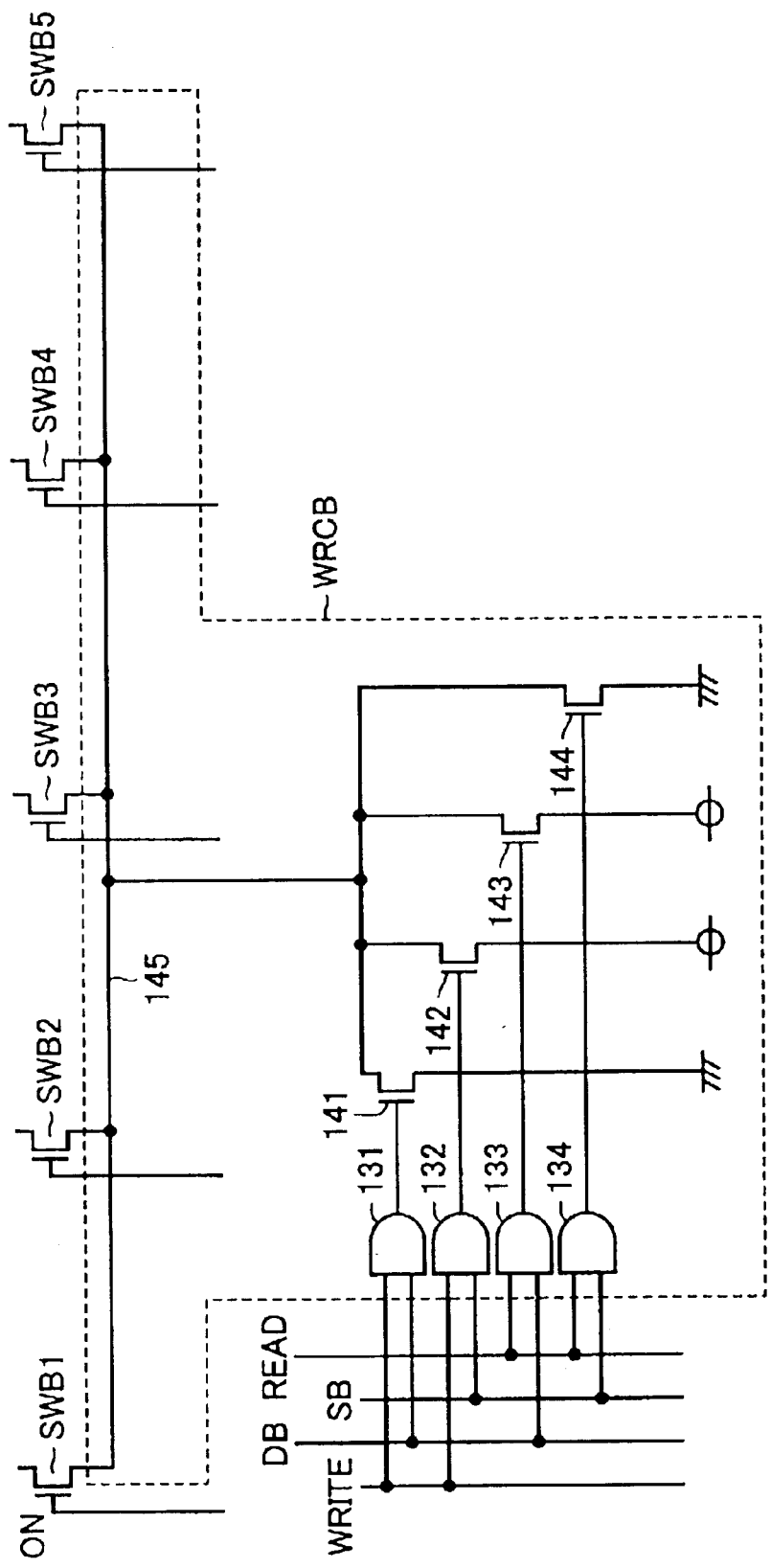
FIG. 52 is a diagram for describing the configuration and the operation of write/read control circuit WRCB in FIG. 48.

FIG. 52 is a diagram for describing the configuration and operation of write/read control circuit WRCB of FIG. 48.

With reference to FIG. 52, write/read control circuit WRCB includes AND circuits 131 to 134 and switching circuits 141 to 144.

AND circuit 131 receives control signals WRITE and DB as inputs. AND circuit 132 receives control signals WRITE and SB as inputs. AND circuit 133 receives control signals READ and DB as inputs. AND circuit 134 receives control signals READ and SB as inputs.

Switching circuit 141 becomes of the conductive condition in response to the output of AND circuit 131 so as to supply ground potential GND or a low potential to wire 145. Switching circuit 142 becomes of the conductive condition in response to the output of AND circuit 132 so as to supply power supply potential VCC or a high potential to wire 145. Switching circuit 143 becomes of the conductive condition in response to the output of AND circuit 133 so as to supply power supply potential VCC or a high potential to wire 145. Switching circuit 144 becomes of the conductive condition in response to the output of AND circuit 134 so as to supply ground potential GND or a low potential to wire 145.

Wire 145 is connected, in common, to one end of each of switching circuits SWB1 to SWB5. The sense amplifiers used for reading data are collectively arranged in write/read control circuit WRCA, shown in FIG. 50, and, therefore, write/read control circuit WRCB, alone, carries out control of connection to the power supply potential or to the ground potential.

This control of connection is carried out using control signals WRITE, READ, DB and SB. Control signal WRITE is a flag signal indicating the programming operation. Control signal READ is a flag signal indicating the reading operation. Control signal DB is a signal indicating that the memory region of a memory cell that is desired to be accessed is on the side connected to bit lines BL1 to BL4. Control signal SB is a signal indicating that the memory region of a memory cell that is desired to be accessed is on the side connected to bit lines BLS1 to BLS5.

The potential that is supplied to wire 145 is determined according to combinatorial logic of these control signals. That is to say, when control signals WRITE and DB are both activated, ground potential GND or programming/reading potential on the low potential side is supplied to wire 145.

When control signals WRITE and SB are both activated, power supply potential VCC or programming/reading potential on the high potential side is supplied to wire 145.

When control signals READ and SB are both activated, power supply potential VCC or programming/reading potential on the high potential side is supplied to wire 145.

When control signals READ and DB are both activated, ground potential GND or programming/reading potential on the low potential side is supplied to wire 145.

Output nodes of switching circuits 141 to 144 are connected to wire 145 for supplying signals in write/read control circuit WRCB and the area of write/read control circuit WRCB can be reduced.

Figure 53:
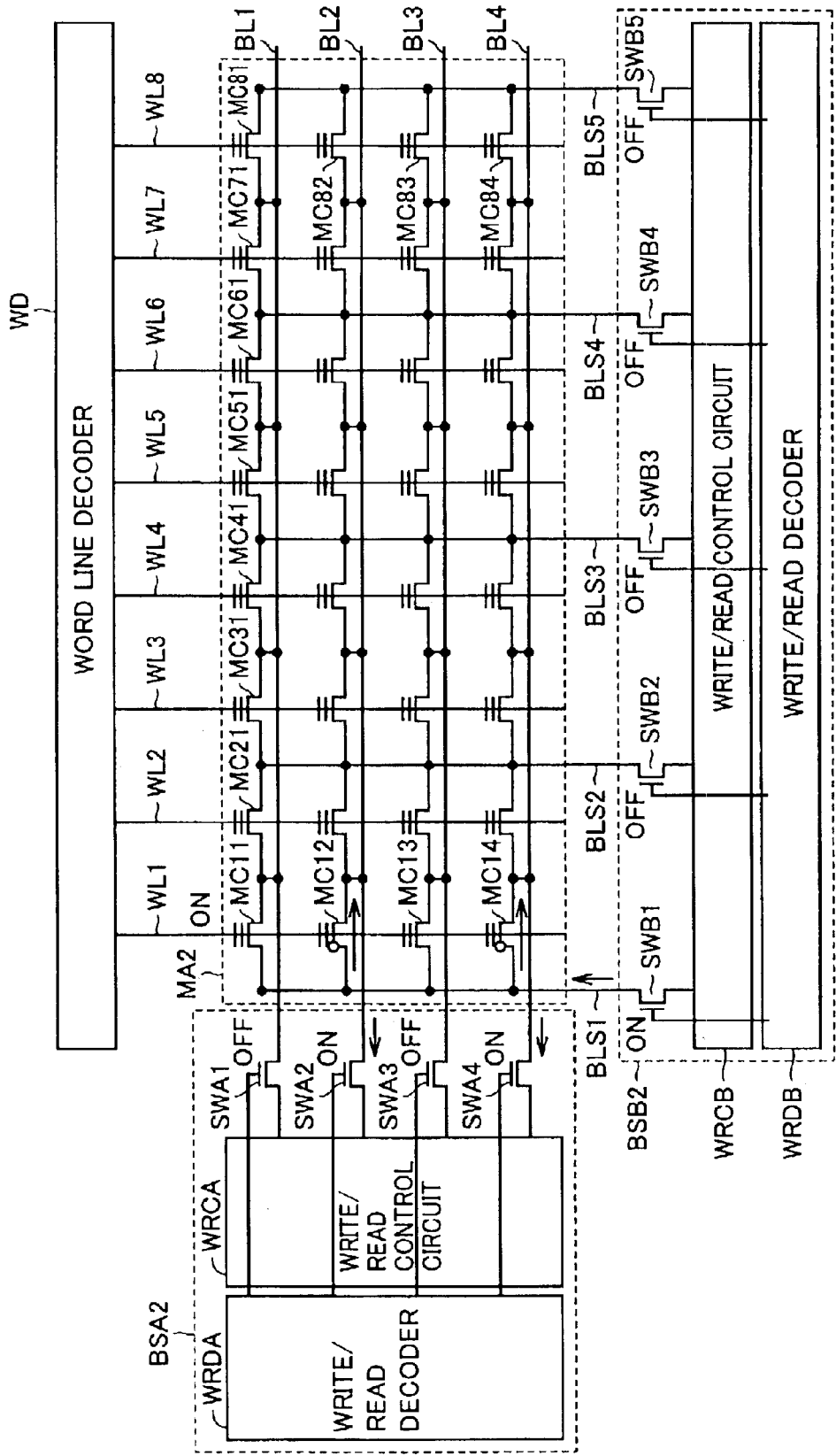
FIG. 53 is a diagram for describing a programming operation to the memory region on the side connected to bit line BLS1 of memory cells MC11 to MC14.

FIG. 53 is a diagram for describing a programming operation to memory regions of memory cells MC11 to MC14 on the side connected to bit line BLS1.

With reference to FIG. 53, a plurality of memory cells to be accessed exist for the same word line. One bit line to supply a potential is selected from among bit lines BLS1 to BLS5 by write/read decoder WRDB. When programming is carried out on memory cells MC11 to MC14, switching circuit SWB1 is converted to the conductive condition. Thereby, a predetermined potential is supplied to bit line BLS1 from write/read control circuit WRCB. Switching circuits SWB2 to SWB5 are set in the non-conductive condition.

Write/read decoder WRDA sets the necessary switches from among switching circuits SWAL to SWA4 to be of the conductive condition in accordance with the number of bits with which programming is carried out. Switching circuits other than switching circuits that have been selected from among switching circuits SWAL to SWA4 are in the non-conductive condition. In addition, a program operation that shifts the threshold value is not carried out on a memory cell wherein data corresponding to the threshold value in the erased condition is maintained, even though it is a memory cell that becomes the object of access. Predetermined switching circuits, from among switching circuits SWAL to SWA4, corresponding to the memory cells wherein the threshold value in the erased condition is maintained are set to be in the non-conductive condition.

The current for programming flows along a path in the direction of the arrow shown in FIG. 53. The side connected to the bit line BLS1 becomes a current drain in memory cells MC11 to MC14 and, therefore, electrons are trapped in the nitride film of a memory region on the bit line BLS1 side.

As shown in FIG. 53, programming current is selectively made to flow through memory cells MC12 and MC14 in the direction shown in the figure, thereby the memory regions of memory cells MC11 and MC13 on the bit line BLS1 side maintain the erased condition while the memory regions of memory cells MC12 and MC14 on the bit line BLS1 side trap electrons so as to become of the condition wherein the threshold value is shifted.

Figure 54:
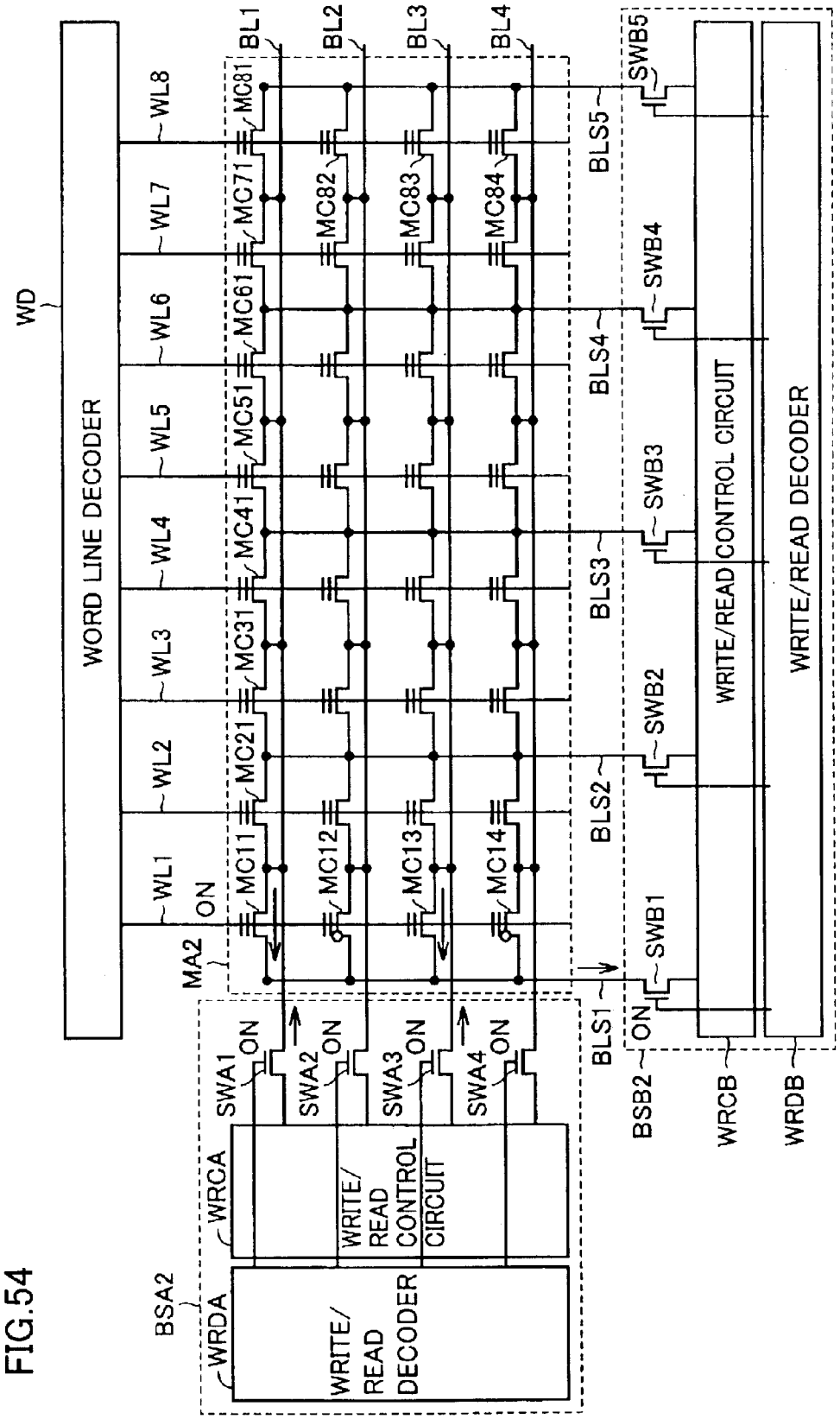
FIG. 54 is a diagram for describing a reading operation from the memory region on the side of bit line BLS1 connected to memory cells MC11 to MC14 of which the programming is described in FIG. 53.

FIG. 54 is a diagram for describing a reading operation from memory regions of memory cells MC11 to MC14 on the bit line BLS1 side, of which the programming operation is described in FIG. 53.

With reference to FIG. 54, the manners of selection of word lines and selection of bit lines BLS1 to BLS5 are the same as at the time of programming described in FIG. 53. That is to say, word line WL1 is activated, switching circuit SWB1 is set in the conductive condition and switching circuits SWB2 to SWB5 are set in the non-conductive condition. Then, switching circuits SWA1 to SWA4 are set in the selected condition, regardless of the accessed memory cell, at the time of reading. At this time the path of the current is in the direction, as shown by the arrow in FIG. 54, opposite to that at the time of programming, shown in FIG. 53. As for the memory cells, from among memory cells MC11 to MC14, wherein electrons have been trapped in memory regions on the bit line BLS1 side so that the threshold voltage value has shifted, current does not flow even when a voltage is applied on both sides of the memory cells. On the other hand, in the case that the threshold voltage value of a memory cell transistor stays in the erased condition, current flows from the side connected to bit lines BL1 to BL4 to bit line BLS1. That is to say, no current flows through memory cell MC12 or MC14 and current does flow through memory cells MC11 and MC13.

Figure 55:
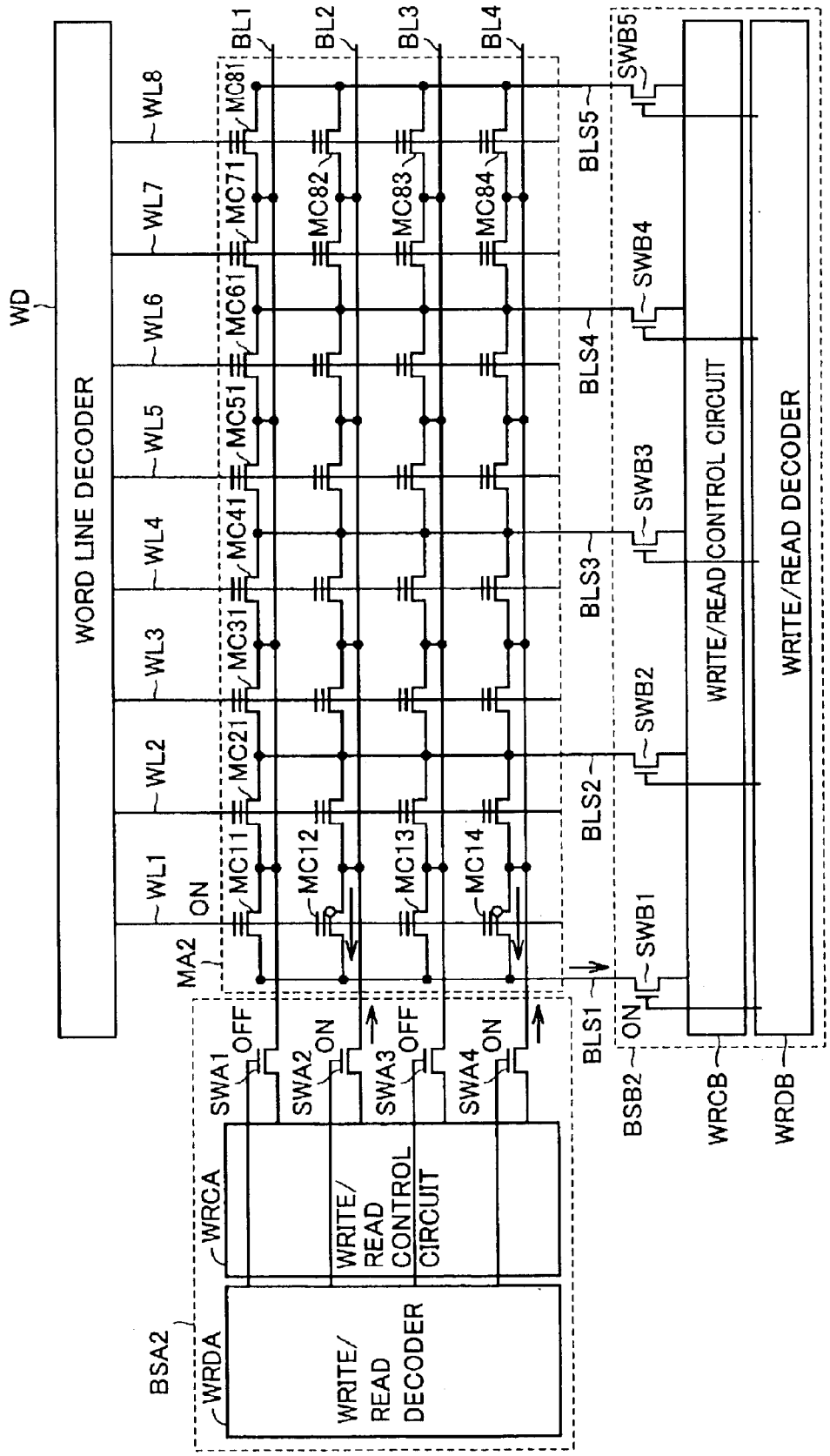
FIG. 55 is a diagram for describing a programming operation to the memory region on the side connected to bit lines BL1 to BL4 of memory cells MC11 to MC14.

FIG. 55 is a diagram for describing a programming operation in memory regions of memory cells MC11 to MC14 on the side connected to bit lines BL1 to BL4.

With reference to FIG. 55, a plurality of memory cells to be accessed exist for the same word line. One bit line to supply a potential is selected from among bit lines BLS1 to BLS5 by write/read decoder WRDB. When programming is carried out on memory cells MC11 to MC14, switching circuit SWB1 is converted to the conductive condition. Thereby, a predetermined potential is supplied to bit line BLS1 from write/read control circuit WRCB. Switching circuits SWB2 to SWB5 are set in the non-conductive condition.

Write/read decoder WRDA sets the necessary switches from among switching circuits SWAL to SWA4 to be of the conductive condition in accordance with the number of bits with which programming is carried out. Switching circuits other than switching circuits that have been selected from among switching circuits SWA1 to SWA4 are in the non-conductive condition. In addition, a program operation that shifts the threshold value is not carried out on a memory cell wherein data corresponding to the threshold value in the erased condition is maintained, even though it is a memory cell that becomes the object of access. Predetermined switching circuits, from among switching circuits SWAL to SWA4, corresponding to the memory cells wherein the threshold value in the erased condition is maintained are set to be in the non-conductive condition.

The current for programming flows along a path in the direction of the arrow shown in FIG. 55. The side connected to bit lines BL1 to BL4 becomes a current drain in memory cells MC11 to MC14 and, therefore, electrons are trapped in the nitride film of a memory region on the bit lines BL1 to BL4 side.

As shown in FIG. 55, programming current is selectively made to flow through memory cells MC12 and MC14 in the direction shown in the figure, thereby the memory regions of memory cells MC11 and MC13 on the bit lines BL1 and BL3 side maintain the erased condition while the memory regions of memory cells MC12 and MC14 on the bit lines BL2 and BL4 side trap electrons so as to become of the condition wherein the threshold value is shifted.

Figure 56:
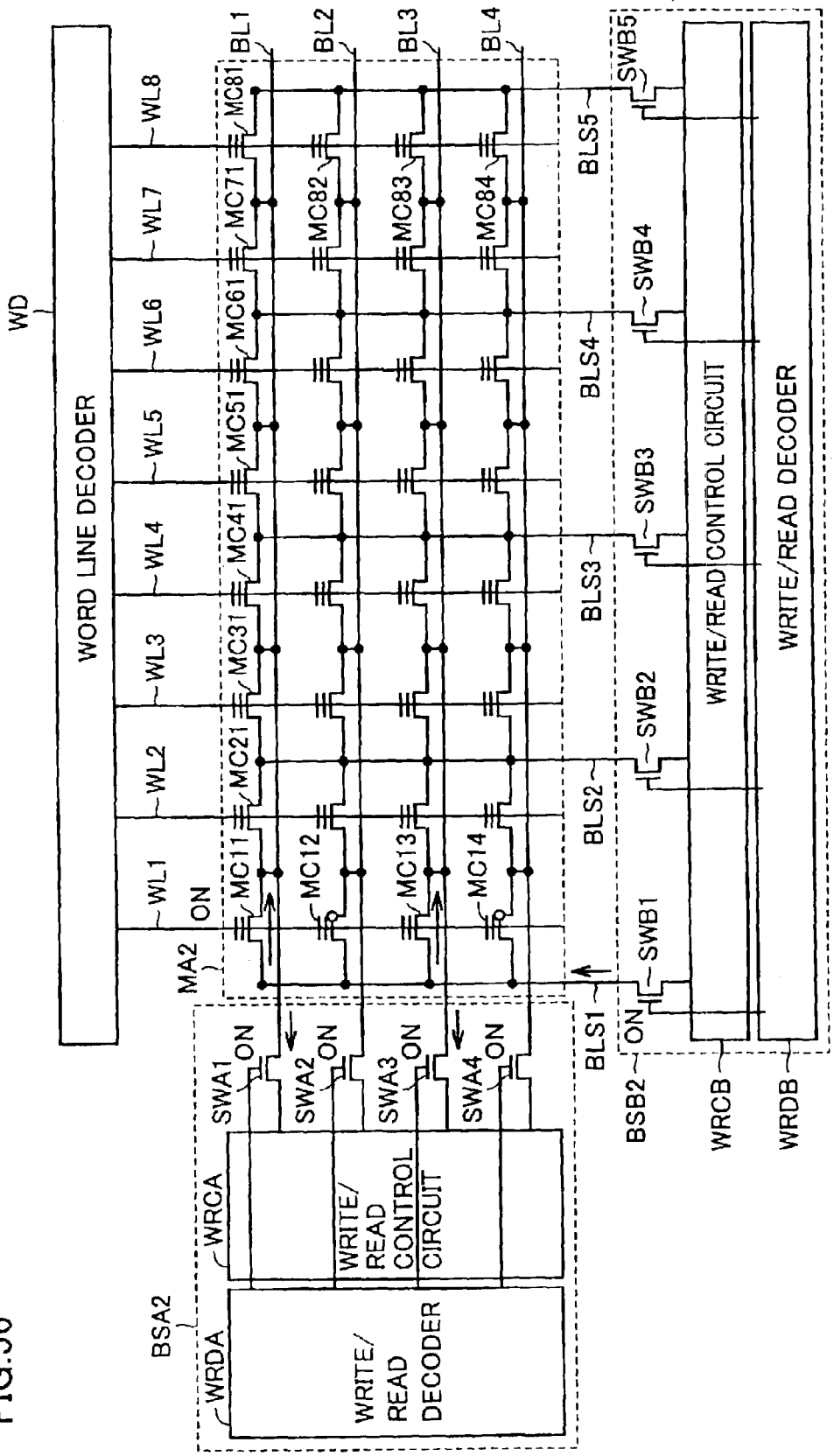
FIG. 56 is a diagram for describing a reading operation from the memory region on the side of bit lines BL1 to BL4 of memory cells MC11 to MC14, of which the programming is described in FIG. 55.
Figure 57:
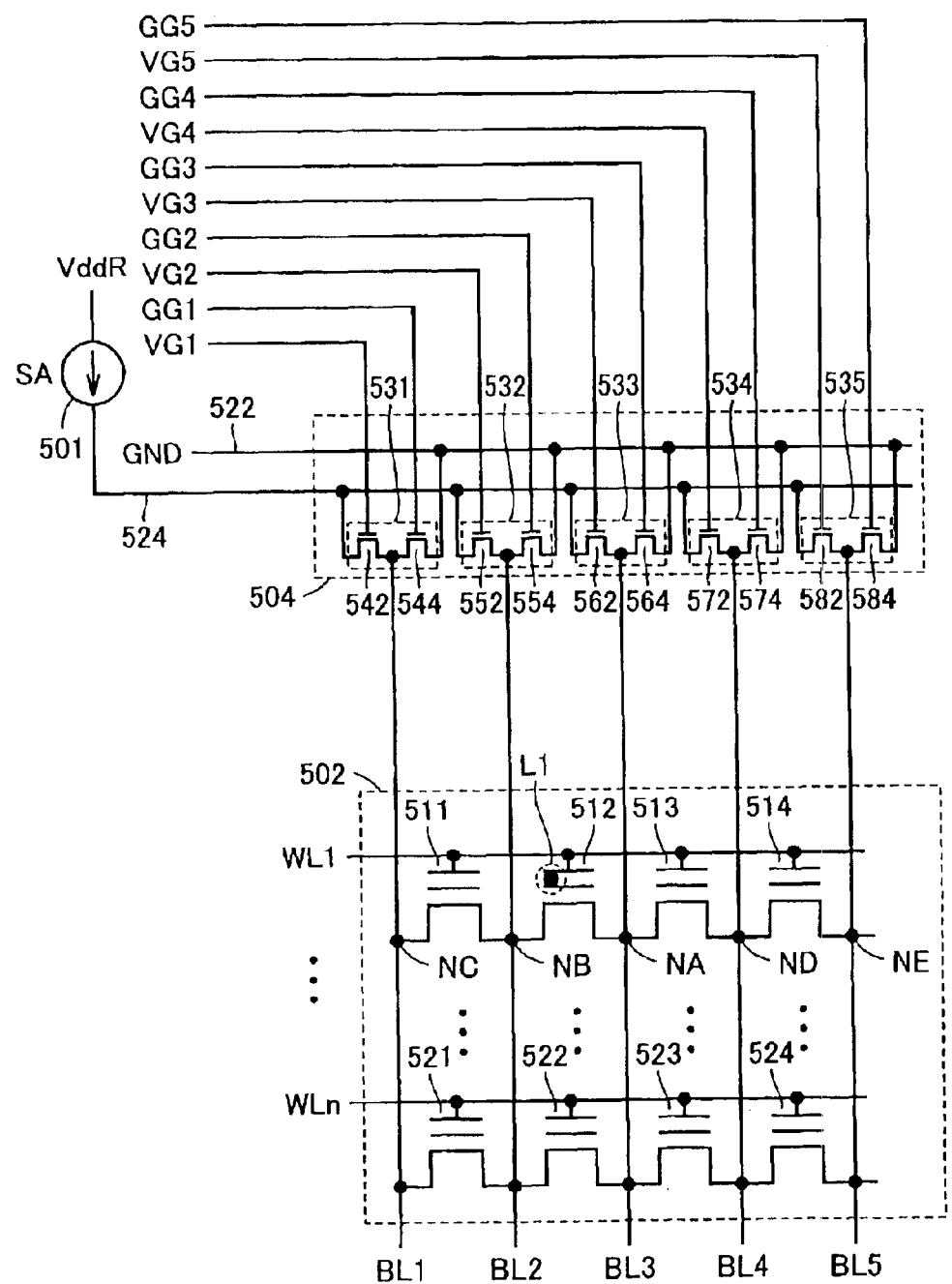
FIG. 57 is a circuit diagram for describing the supply of a potential to the bit lines of a virtual ground-type memory cell array of an NROM according to a prior art.

FIG. 56 is a diagram for describing a reading operation from memory regions of memory cells MC11 to MC14 on the bit lines BL1 to BL4 side, of which the programming operation is described in FIG. 55.

With reference to FIG. 56, the manners of selection of word lines and selection of bit lines BLS1 to BLS5 are the same as at the time of programming described in FIG. 55. That is to say, word line WL1 is activated, switching circuit SWB1 is set in the conductive condition and switching circuits SWB2 to SWB5 are set in the non-conductive condition. Then, switching circuits SWA1 to SWA4 are set in the selected condition, regardless of the accessed memory cell, at the time of reading. At this time the path of the current is in the direction, as shown by the arrow in FIG. 56, opposite to that at the time of programming, shown in FIG. 55. As for the memory cells, from among memory cells MC11 to MC14, wherein electrons have been trapped in memory regions on the bit lines BL1 to BL14 side so that the threshold voltage value has shifted, current does not flow even when a voltage is applied on both sides of the memory cells. On the other hand, in the case that the threshold voltage value of a memory cell transistor stays in the erased condition, current flows from bit line BLS1 to the side connected to bit lines BL1 to BL4. That is to say, no current flows through memory cell MC12 or MC14 and current does flow through memory cells MC11 and MC13.

As described above, the source lines of a NOR-type memory cell array are divided so that the NOR-type memory cell array is converted to a virtual ground-type memory cell array that can be used as a NROM memory cell array wherein two bits can be stored per memory cell. In such a configuration, it becomes possible to read, or to program, a plurality of bits at the same time so that the amount of time necessary for reading or programming can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
   a memory cell array, said memory cell array including
      a memory cell group wherein each memory cell has first and second connection nodes and said second connection node of each memory cell is connected to said first connection node of an adjacent memory cell, except for the memory cell on each end, so that the memory cells are connected in series, and
      a first bit line group and a second bit line connected to a plurality of said first connection nodes of said memory cell group, wherein said second bit line is formed in a wiring layer which is different from that for said first bit line group; and
      a bit line selection circuit for making a selection, as selected bit lines, from among said first bit line group and the second bit line, wherein said bit line selection circuit supplies a first potential to a first subgroup from among said selected bit lines and supplies a second potential different from said first potential to a second subgroup from among said selected bit lines.

2. The non-volatile semiconductor memory device according to claim 1, wherein said first bit line group and said second bit line are arranged in parallel to each other.

3. The non-volatile semiconductor memory device according to claim 1, wherein said second bit line is arranged so as to intersect with said first bit line group.

4. The non-volatile semiconductor memory device according to claim 1, wherein each memory cell included in said memory cell group has a control electrode, and said memory cell array further includes a word line commonly connected to a plurality of control electrodes of said memory cell group.

5. The non-volatile semiconductor memory device according to claim 1, wherein each memory cell included in said memory cell group has a control electrode, said memory cell array further includes a plurality of word lines connected to a plurality of control electrodes of said memory cell group, respectively, said first bit line group is arranged in parallel to said plurality of word lines, and said second bit line is arranged so as to intersect with said plurality of word lines.

6. The non-volatile semiconductor memory device according to claim 1, wherein each memory cell included in said memory cell group includes:

first and second conductive regions provided in a main surface of a semiconductor substrate and electrically connected to said first and second connection nodes, respectively; and a charge storage film provided above a region between said first and second conductive regions, and said charge storage film has first and second storage regions each of which stores one bit of information.

7. The non-volatile semiconductor memory device according to claim 1, wherein said bit line selection circuit sets said first and second potentials so that at the time of a reading operation for a selected memory cell included in said memory cell group a current flows in a direction opposite to that at the time of a programming operation for said selected memory cells.

* * * * *

UNITED STATES PATENT AND TRADEMARK OFFICE
CERTIFICATE OF CORRECTION

PATENT NO. : 6,795,345 B2
DATED : September 21, 2004
INVENTOR(S) : Tsukasa Ooishi It is certified that error appears in the above-identified patent and that said Letters Patent is hereby corrected as shown below:

Title page,
Item [56], References Cited, OTHER PUBLICATIONS, include -- E. Maayan et al, A 512 Mb NROM Flash Data Storage Memory with 8MB/s Data Rate, IEEE International Solid-State Circuits Conference, Feb. 2002 --

Signed and Sealed this

Twenty-eighth Day of June, 2005

JON W. DUDAS
*Director of the United States Patent and Trademark Office*